(12) United States Patent
Takahashi et al.

(10) Patent No.: US 8,565,369 B2
(45) Date of Patent: Oct. 22, 2013

(54) SCANNING SIGNAL LINE DRIVE CIRCUIT AND DISPLAY DEVICE HAVING THE SAME

(75) Inventors: Yoshihisa Takahashi, Osaka (JP); Yasuaki Iwase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/580,466

(22) PCT Filed: Oct. 14, 2010

(86) PCT No.: PCT/JP2010/068018
§ 371 (c)(1),
(2), (4) Date: Aug. 22, 2012

(87) PCT Pub. No.: WO2011/114562
PCT Pub. Date: Sep. 22, 2011

(65) Prior Publication Data
US 2012/0320008 A1  Dec. 20, 2012

(30) Foreign Application Priority Data
Mar. 15, 2010  (JP) .................................. 2010-057179

(51) Int. Cl.
*G11C 19/00*  (2006.01)
(52) U.S. Cl.
USPC .................... 377/64; 377/68; 377/78; 377/79
(58) Field of Classification Search
None
See application file for complete search history.

(56) References Cited

U.S. PATENT DOCUMENTS 5,517,542 A  5/1996  Huq
8,390,560 B2 *  3/2013  Toyoshima et al. ........... 345/100
2003/0002615 A1  1/2003  Morosawa et al.
2006/0071890 A1  4/2006  Kikuchi
2006/0071923 A1  4/2006  Lee et al.
2009/0251443 A1  10/2009  Jinta
2009/0303211 A1  12/2009  Hu (Continued)

FOREIGN PATENT DOCUMENTS

JP  08-263027 A  10/1996
JP  2001-052494 A  2/2001

(Continued)

OTHER PUBLICATIONS

Official Communication issued in International Patent Application No. PCT/JP2010/068018, mailed on Jan. 25, 2011.

*Primary Examiner* — Tuan T Lam
(74) *Attorney, Agent, or Firm* — Keating & Bennett, LLP

(57) ABSTRACT

A bistable circuit includes an input terminal (41) for a set signal, an input terminal (42) for a reset signal, an output terminal (48) for a state signal, a thin-film transistor (M2) for increasing a potential of the output terminal (48) based on a first clock, a thin-film transistor (M1) for increasing a potential of a first-node connected to a gate terminal of the thin-film transistor (M2) based on the set signal, a thin-film transistor (M5) for decreasing the potential of the first-node, a thin-film transistor (M7) for increasing a potential of a second-node connected to a gate terminal of the thin-film transistor (M5) based on the reset signal, a thin-film transistor (M6) for decreasing the potential of the output terminal (48) based on the potential of the second-node, a thin-film transistor (M3) for increasing the potential of the second-node based on the set signal, and a capacitor (CAP2) having one end connected to the second-node and the other end connected to the input terminal (41).

21 Claims, 46 Drawing Sheets

(56) References Cited

U.S. PATENT DOCUMENTS

| | | | |
|---|---|---|---|
| 2012/0098804 A1* | 4/2012 | Ohhashi | 345/204 |
| 2012/0194489 A1* | 8/2012 | Iwamoto et al. | 345/204 |
| 2012/0213323 A1* | 8/2012 | Tsai | 377/64 |
| 2012/0242630 A1* | 9/2012 | Ohara | 345/204 |
| 2013/0009856 A1* | 1/2013 | Takahashi et al. | 345/92 |
| 2013/0028370 A1* | 1/2013 | Kikuchi et al. | 377/64 |
| 2013/0033468 A1* | 2/2013 | Takahashi | 345/204 |
| 2013/0044854 A1* | 2/2013 | Yonemaru et al. | 377/64 |
| 2013/0100007 A1* | 4/2013 | Yamamoto et al. | 345/100 |

FOREIGN PATENT DOCUMENTS

| | | |
|---|---|---|
| JP | 2003-016794 A | 1/2003 |
| JP | 2005-094335 A | 4/2005 |
| JP | 2005-149624 A | 6/2005 |
| JP | 2006-106394 A | 4/2006 |
| JP | 2006-107692 A | 4/2006 |
| JP | 2006-127630 A | 5/2006 |
| JP | 2009-252269 A | 10/2009 |
| JP | 2009-301698 A | 12/2009 |

* cited by examiner

SET PERIOD | SELECTION PERIOD | RESET PERIOD

SCANNING SIGNAL LINE DRIVE CIRCUIT AND DISPLAY DEVICE HAVING THE SAME

TECHNICAL FIELD

The present invention relates to a display device and a drive circuit thereof, and in particular to a scanning signal line drive circuit including a shift register, that drives scanning signal lines which are arrayed in a display unit of the display device.

BACKGROUND ART

In recent years, in liquid crystal display devices, a gate driver (scanning signal line drive circuit) for driving gate bus lines (scanning signal lines) have become increasingly monolithic. Conventionally, a gate driver has mostly been mounted as an IC (Integrated Circuit) chip on a peripheral part of a substrate that constitutes a liquid crystal panel. However, in recent years, it has gradually become more common to provide a gate driver directly on a substrate. Such a gate driver is called a "monolithic gate driver", for example. In a liquid crystal display device provided with a monolithic gate driver, while a thin-film transistor using amorphous silicon (a-Si) (hereinafter referred to as an "a-SiTFT") has been conventionally employed as a drive element, a thin-film transistor using microcrystalline silicon (μc-Si) or oxide semiconductor (e.g., IGZO) has become commonly employed in recent years. As mobility of microcrystalline silicon and oxide semiconductor is greater than that of amorphous silicon, it is possible to achieve reduction of a picture-frame area and improved resolution by employing a thin-film transistor using microcrystalline silicon or oxide semiconductor as a drive element.

In the meantime, a display unit of an active matrix-type liquid crystal display device includes a plurality of source bus lines (video signal lines), a plurality of gate bus lines, and a plurality of pixel formation portions which are provided at respective intersections between the plurality of source bus lines and the plurality of gate bus lines. These pixel formation portions are arranged in matrix to constitute a pixel array. Each pixel formation portion includes a thin-film transistor as a switching element having a gate terminal connected to a gate bus line passing through a corresponding intersection and a source terminal connected to a source bus line passing through the intersection, a pixel capacitance for storing a pixel voltage value, and so on. Such an active matrix-type liquid crystal display device is also provided with the above-described gate driver, and a source driver (video signal line drive circuit) for driving the source bus lines.

Although video signals indicating pixel voltage values are transmitted through the source bus lines, the source bus lines cannot transmit video signals indicating pixel voltage values for more than one line at one time (simultaneously). Therefore, writing (charging) of the video signal to the pixel capacitance in the pixel formation portions arrayed in matrix is performed sequentially for each one row. Thus, the gate driver is configured by a shift register having a plurality of stages so that the plurality of gate bus lines are sequentially selected for a predetermined period. Each stage of the shift register constitutes a bistable circuit that takes one of two states (a first state and a second state) at one time point, and outputs a signal indicating this state (hereinafter referred to as a "state signal") as a scanning signal. The writing of the video signal to the pixel capacitance is sequentially performed for each one row, as described above, based on sequential output of active scanning signals from the plurality of bistable circuits within the shift register.

In a conventional display device, the bistable circuit is configured as illustrated in FIG. 51 (FIG. 1 of Japanese Patent Application Laid-Open No. 2006-107692) or in FIG. 52 (FIG. 14 of Japanese Patent Application Laid-Open No. 2006-107692), for example. In such a bistable circuit, when a scanning signal Gn−1 supplied from a previous stage is driven to a high level, a transistor group TG1 is turned to an ON state, and therefore a potential of a second-node N2 becomes a low level. With this, transistors TG3 and TR4 are turned to an OFF state. Accordingly, by the scanning signal Gn−1 being driven to a high level, a potential of a first-node N1 becomes a high level, and an output capacitor Cb is charged. In this state, a potential of a clock CK appears in the gate bus lines. As described above, after the scanning signal Gn−1 supplied from the previous stage is driven to a high level in each bistable circuit, by turning the potential of the clock CK given to the each bistable circuit to a high level active scanning signals are outputted sequentially from the plurality of bistable circuits within the shift register. With this, the plurality of gate bus lines are driven sequentially line by line.

Further, Japanese Patent Application Laid-Open Nos. 2001-52494, 2003-16794, 2005-94335, 2006-106394, and 2006-127630 also disclose a configuration of a shift register (bistable circuit) provided for a display device and the like.

PRIOR ART DOCUMENTS

Patent Documents

[Patent Document 1] Japanese Patent Application Laid-Open No. 2006-107692
[Patent Document 2] Japanese Patent Application Laid-Open No. 2001-52494
[Patent Document 3] Japanese Patent Application Laid-Open No. 2003-16794
[Patent Document 4] Japanese Patent Application Laid-Open No. 2005-94335
[Patent Document 5] Japanese Patent Application Laid-Open No. 2006-106394
[Patent Document 6] Japanese Patent Application Laid-Open No. 2006-127630

SUMMARY OF THE INVENTION

Problems to be Solved by the Invention

However, a circuit operation of the conventional configuration lacks stability as described below. In the configuration illustrated in FIG. 51, the first-node N1 is charged by the scanning signal Gn−1 changing from a low level to a high level. Here, as the potential of the second-node N2 is at a high level at a time point when the scanning signal Gn−1 changes from a low level to a high level, a transistor TR4 is in the ON state. Specifically, even if the scanning signal Gn−1 changes from a low level to a high level, during a time period until the transistor group TG1 is turned to the ON state and the potential of the second-node N2 is turned to a low level, the transistor TR4 is maintained in the ON state. Accordingly, there is often a case in which the first-node N1 is not sufficiently charged. Charging of the first-node N1 is even more insufficient especially when the speed of the circuit operation is increased, as a time period for charging is reduced. As a result, the circuit operation becomes unstable. In addition, as there is a parasitic capacitance between a gate and a drain of a transistor TG2 in which a first electrode is connected to the first-node N1 and a second electrode is supplied with the clock CK, a noise is generated at the first-node N1 due to fluctuation of a waveform of the clock CK. Then, the noise turns the transistor group TG1 to the ON state and the potential of the second-node N2 decreases. As a result, in a time period in which the potential of the first-node N1 should be maintained at a low level, the transistor TR4 is not fully turned to the ON state and the potential of the first-node N1 is not maintained at a low level. An increase of the potential of the first-node N1 and a decrease of the potential of the second-node N2 occur in a positive feedback manner, and therefore the circuit operation becomes unstable.

Further, in the configuration illustrated in FIG. 52, a gate terminal of the transistor group TG1 is not connected to the first-node N1. Accordingly, in a time period in which a scanning signal Gn is at a high level, the transistor group TG1 may not be turned to the ON state, or the potential of the second-node N2 may not decrease. In a time period in which the scanning signal Gn is at a high level, the potential of the second-node N2 increases due to parasitic capacitances between gates and drains of the transistors TG3 and TR4. With this, the transistor TR4 is slightly turned to the ON state, and the potential of the first-node N1 decreases in a time period in which the potential of the first-node N1 should be maintained at a high level. As a result, the circuit operation becomes unstable.

Thus, an object of the present invention is to improve stability of a circuit operation, in a monolithic gate driver.

Means for Solving the Problems

A first aspect of the present invention is directed to a scanning signal line drive circuit of a display device, that drives a plurality of scanning signal lines which are arrayed in a display unit, the circuit comprising:

a shift register having a plurality of bistable circuits connected in series with each other, outputted signals from the plurality of bistable circuits being sequentially driven active based on a plurality of clock signals that are externally inputted and cyclically repeat a first level and a second level, wherein each bistable circuit includes:
a first-input-node for receiving an outputted signal from a bistable circuit of a stage before said each bistable circuit as a set signal;
a second-input-node for receiving an outputted signal from a bistable circuit of a stage after said each bistable circuit as a reset signal;
a first-output-node for outputting an outputted signal from said each bistable circuit as a scanning signal for driving the scanning signal line, the first-output-node being connected to the scanning signal line;
a first output control switching element having a second electrode supplied with one of the plurality of clock signals and a third electrode connected to the first-output-node;
a first-node turnon switching element for changing a level of a first-node connected to a first electrode of the first output control switching element to an ON level based on the set signal;
at least one of a first first-node turnoff switching element for changing the level of the first-node to an OFF level, the first first-node turnoff switching element having a second electrode connected to the first-node, and a first first-output-node turnoff switching element for changing a level of the first-output-node to an OFF level, the first first-output-node turnoff switching element having a second electrode connected to the first-output-node and a third electrode supplied with an OFF level potential;
a first second-node turnon switching element for changing a level of a second-node to an ON level based on the reset signal, the second-node being connected to a first electrode of at least one of the first first-node turnoff switching element and the first first-output-node turnoff switching element;
a first second-node turnoff switching element for changing the level of the second-node to an OFF level based on the set signal, the first second-node turnoff switching element having a first electrode connected to the first-input-node, a second electrode connected to the second-node, and a third electrode supplied with an OFF level potential; and
a capacitative element having one end connected to the second-node and the other end connected to the first-input-node.

According to a second aspect of the present invention, in the first aspect of the present invention,
the following equation is satisfied,
where a capacitance value of the capacitative element is C2, a capacitance value of a parasitic capacitance between a first electrode and a second electrode of the first second-node turnoff switching element is C3, a capacitance value of a parasitic capacitance between a first electrode and a second electrode of the first first-node turnoff switching element is C5, and a capacitance value of a parasitic capacitance between a first electrode and a second electrode of the first first-output-node turnoff switching element is C6.

$$C2 \geq C5 + C6 - C3$$

According to a third aspect of the present invention, in the first aspect of the present invention,
in each bistable circuit, a potential of the second-node is maintained at a DC power supply potential at a high level during a period in which the first-node is to be maintained at an OFF level.

According to a fourth aspect of the present invention, in the first aspect of the present invention,
the switching elements included in each bistable circuit are each constituted by a thin-film transistor having a gate electrode as a first electrode, a drain electrode as a second electrode, and a source electrode as a third electrode, and
the capacitative element is provided between the gate electrode and the source electrode of the thin-film transistor.

According to a fifth aspect of the present invention, in the fourth aspect of the present invention,
the capacitative element and the first second-node turnoff switching element are arranged adjacent to each other,
a side of the capacitative element on the one end is formed by a metallic film configuring the drain electrode of the first second-node turnoff switching element as the thin-film transistor, and
a side of the capacitative element on the other end is formed by a metallic film configuring the gate electrode of the first second-node turnoff switching element.

According to a sixth aspect of the present invention, in the first aspect of the present invention,
each bistable circuit includes the first first-node turnoff switching element, and
a third electrode of the first first-node turnoff switching element is connected to the first-output-node.

According to a seventh aspect of the present invention, in the first aspect of the present invention,
each bistable circuit further includes:

a second second-node turnoff switching element having a first electrode connected to the first-output-node, a second electrode connected to the second-node, and a third electrode supplied with an OFF level potential.

According to an eighth aspect of the present invention, in the first aspect of the present invention,
each bistable circuit further includes:
a second first-output-node turnoff switching element having a first electrode connected to the second-input-node, a second electrode connected to the first-output-node, and a third electrode supplied with an OFF level potential.

According to a ninth aspect of the present invention, in the first aspect of the present invention,
each bistable circuit further includes:
a second first-node turnoff switching element having a first electrode connected to the second-input-node, a second electrode connected to the first-node, and a third electrode supplied with an OFF level potential.

According to a tenth aspect of the present invention, in the first aspect of the present invention,
the first-node turnon switching element is a thin-film transistor having a multichannel structure.

According to an eleventh aspect of the present invention, in the first aspect of the present invention,
each bistable circuit includes the first first-node turnoff switching element, and
the first first-node turnoff switching element is a thin-film transistor having a multichannel structure.

According to a twelfth aspect of the present invention, in the first aspect of the present invention,
each bistable circuit includes:
a second-output-node for outputting an outputted signal from said each bistable circuit as a different stage control signal for controlling an operation of a bistable circuit other than said each bistable circuit; and
a second output control switching element having a first electrode connected to the first-node, a second electrode connected to the second electrode of the first output control switching element, and a third electrode connected to the second-output-node, wherein
the different stage control signal outputted from each bistable circuit is supplied to a bistable circuit of a stage before said each bistable circuit as the reset signal.

According to a thirteenth aspect of the present invention, in the twelfth aspect of the present invention,
the different stage control signal outputted from each bistable circuit is further supplied to a bistable circuit of a stage after said each bistable circuit as the set signal.

According to a fourteenth aspect of the present invention, in the twelfth aspect of the present invention,
a second electrode of the first second-node turnon switching element is supplied with a signal, out of the plurality of clock signals, that is different from a signal supplied to the second electrode of the first output control switching element.

According to a fifteenth aspect of the present invention, in the twelfth aspect of the present invention,
the second electrode of the first output control switching element is supplied with a DC power supply potential in place of one of the plurality of clock signals.

According to a sixteenth aspect of the present invention, in the fifteenth aspect of the present invention,
the following equation is satisfied,
where an amplitude voltage of the plurality of clock signals is VCK, and a voltage of the scanning signal when the scanning signal lines are driven is VGH with reference to a potential on a low level side of the plurality of clock signals.

$$VGH \geq VCK \geq VGH/2$$

According to a seventeenth aspect of the present invention, in the first aspect of the present invention,
each bistable circuit further includes:
a third-input-node for receiving a signal externally supplied as a clear signal; and
a second second-node turnon switching element for changing the level of the second-node to an ON level based on the clear signal.

According to an eighteenth aspect of the present invention, in the seventeenth aspect of the present invention,
a last stage bistable circuit out of the plurality of bistable circuits is supplied with the clear signal as the reset signal.

According to a nineteenth aspect of the present invention, in the seventeenth aspect of the present invention,
each bistable circuit further includes:
a fourth-input-node for receiving a signal externally supplied as a refresh signal; and
a second-node level lowering switching element for changing the level of the second-node to a level lower than the OFF level based on the refresh signal.

According to a twentieth aspect of the present invention, in the first aspect of the present invention,
each bistable circuit further includes:
a third-input-node for receiving a signal externally supplied as a clear signal;
a second second-node turnon switching element for changing the level of the second-node to an ON level based on the clear signal; and
a second-node level lowering switching element for changing the level of the second-node to a level lower than the OFF level based on the clear signal.

According to a twenty-first aspect of the present invention, in the first aspect of the present invention,
all of the switching elements included in each bistable circuit are constituted respectively by thin-film transistors of an identical channel.

A twenty-second aspect of the present invention is directed to a display device, comprising:
the display unit; and
the scanning signal line drive circuit according to a first aspect of the present invention.

A twenty-third aspect of the present invention is directed to a method of driving a plurality of scanning signal lines which are arrayed in a display unit by a scanning signal line drive circuit including a shift register having a plurality of bistable circuits connected in series with each other and each having a first state and a second state, outputted signals from the plurality of bistable circuits being sequentially driven active based on a plurality of clock signals that are externally inputted and cyclically repeat a first level and a second level, the method comprising:
for each bistable circuit,
a first driving step of turning to a preliminary state for changing from the second state to the first state;
a second driving step of changing from the preliminary state to the first state; and
a third driving step of changing from the first state to the second state,
wherein
each bistable circuit includes:
a first-input-node for receiving an outputted signal from a bistable circuit of a stage before said each bistable circuit as a set signal;

a second-input-node for receiving an outputted signal from a bistable circuit of a stage after said each bistable circuit as a reset signal;

a first-output-node for outputting an outputted signal from said each bistable circuit as a scanning signal for driving the scanning signal line, the first-output-node being connected to the scanning signal line;

a first output control switching element having a second electrode supplied with one of the plurality of clock signals and a third electrode connected to the first-output-node;

a first-node turnon switching element for changing a level of a first-node connected to a first electrode of the first output control switching element to an ON level based on the set signal;

at least one of a first first-node turnoff switching element for changing the level of the first-node to an OFF level, the first first-node turnoff switching element having a second electrode connected to the first-node, and a first first-output-node turnoff switching element for changing a level of the first-output-node to an OFF level, the first first-output-node turnoff switching element having a second electrode connected to the first-output-node and a third electrode supplied with an OFF level potential;

a first second-node turnon switching element for changing a level of a second-node to an ON level based on the reset signal, the second-node being connected to a first electrode of at least one of the first first-node turnoff switching element and the first first-output-node turnoff switching element;

a first second-node turnoff switching element for changing the level of the second-node to an OFF level based on the set signal, the first second-node turnoff switching element having a first electrode connected to the first-input-node, a second electrode connected to the second-node, and a third electrode supplied with an OFF level potential; and a capacitative element having one end connected to the second-node and the other end connected to the first-input-node, wherein for each bistable circuit, in the first driving step, the first-node turnon switching element is turned to an ON state by the set signal changing from the second level to the first level, in the second driving step, the first-node turnon switching element is turned to an OFF state by the set signal changing from the first level to the second level, and the level of the first-node changes by a signal, out of the plurality of clock signals, that is supplied to the second electrode of the first output control switching element changing from the second level to the first level, and in the third driving step, the first second-node turnoff switching element is turned to the ON state by the reset signal changing from the second level to the first level.

Effects of the Invention

According to the first aspect of the present invention, each bistable circuit of the shift register that constitutes the scanning signal line drive circuit includes the first second-node turnoff switching element for changing the level of the second-node to the OFF level based on the set signal. Accordingly, the potential of the second-node changes directly to the OFF level by changing the potential of the set signal (for example, by the potential of the set signal changing from a low level to a high level when an N-channel type thin-film transistor is employed as the switching element). Further, as the first electrode of the first first-node turnoff switching element is connected to the second-node, the first first-node turnoff switching element is turned to the OFF state when a potential of the second-node becomes the OFF level. As described above, during a period in which the potential of the first-node is to be turned to the ON level (set period), the potential of the second-node quickly becomes the OFF level and the first first-node turnoff switching element is turned to the OFF state. Therefore, changing of the potential of the first-node from the OFF level to the ON level may not be prevented. As a result, stability of a circuit operation is improved as compared to the conventional configuration.

Further, according to the first aspect of the present invention, regarding the second-node for turning the potential of the first-node to the OFF level, a configuration in which "the potential of the second-node becomes the OFF level by the potential of the first-node changing to the ON level" is not employed. Therefore, even if a noise is generated at the first-node, the potential of the second-node may not be affected by the noise. Accordingly, the potential of the second-node is maintained at the ON level during the period in which the potential of the first-node is to be maintained at the OFF level (normal operation period), and generation of a large noise at the first-node is suppressed. Moreover, as a capacitative element between the first-input-node and the second-node is charged during the set period, the potential of the second-node can be maintained at the OFF level by changing the potential of the set signal to a direction opposite to that in the set period during a period in which the potential of the first-node is to be maintained fully at the ON level (selection period). Accordingly, even if the potential of the second-node is going to change due to a parasitic capacitance of the switching element, the potential of the second-node is maintained at the OFF level, and a decrease of the potential of the first-node during the selection period is suppressed. With this, the stability of the circuit operation is ensured.

Furthermore, according to the first aspect of the present invention, although there is a possibility that fluctuation of the potential of the second-node may occur because of a current leakage occurring in the first second-node turnoff switching element and the first second-node turnon switching element due to an influence of noises generated in the set signal and the reset signal during the normal operation period, fluctuation of the potential of the second-node due to such a current leakage is suppressed by charging the capacitative element during the set period. In addition, it is possible to realize scanning signal line drive circuit provided with a shift register having superior operational stability without increasing necessary circuit elements as compared to the conventional configuration.

According to the second aspect of the present invention, the capacitance value of the capacitative element is equal to or greater than a value obtained by subtracting "a capacitance value of the parasitic capacitance between the first electrode and the second electrode of the switching element whose first electrode is connected to a node that changes its level to the OFF level in the selection period and whose second electrode is connected to the second-node" from "a sum of capacitance values of the parasitic capacitances between the first electrode and the second electrode of the switching elements whose second electrode is connected to a node that changes its level to the ON level in the selection period and whose first electrode is connected to the second-node". Accordingly, the potential of the second-node is reliably prevented from being turned to the ON level during the selection period.

According to the third aspect of the present invention, it is possible to realize a scanning signal line drive circuit that is suitable for a configuration in which a thin-film transistor (such as microcrystalline silicon or oxide semiconductor) having a small threshold shift is used as the switching element.

According to the fourth aspect of the present invention, it is possible to provide the capacitative element between the first-input-node and the second-node using existing components.

According to the fifth aspect of the present invention, an increase of an area for wiring and mounting by providing the capacitative element between the first-input-node and the second-node is suppressed. With this, it is possible to reduce a size of a picture frame of the panel. Additionally, reliability of the circuit operation is improved as a wiring load is reduced.

According to the sixth aspect of the present invention, the third electrode of the first first-node turnoff switching element is supplied with the potential of the outputted signal from the bistable circuit. Accordingly, a voltage between the second electrode and the third electrode of the first first-node turnoff switching element becomes relatively low during the selection period. With this, an outflow of an electric charge from the first-node via the first first-node turnoff switching element is suppressed. As a result, the potential of the first-node is reliably maintained at a high level during the selection period, and the stability of the circuit operation is effectively improved. Further, as timing of turn-off of the first-node comes after timing of turn-off of the first-output-node, an action of the first output control switching element to turn the first-output-node off becomes stronger, and the first-output-node is turned off more quickly. With this, it is possible to operate the circuits at high speed.

According to the seventh aspect of the present invention, the first electrode of the second second-node turnoff switching element is connected to the first-output-node for outputting the scanning signal. Accordingly, the second second-node turnoff switching element is turned to the ON state during the selection period. Further, for the second second-node turnoff switching element, the second electrode is connected to the second-node, and the third electrode is supplied with the OFF level potential. Accordingly, during the selection period, the potential of the second-node is pulled to the OFF level. As described above, the potential of the second-node reliably maintained at the OFF level during the selection period, and the stability of the circuit operation is effectively improved.

According to the eighth aspect of the present invention, each bistable circuit of the shift register that constitutes the scanning signal line drive circuit includes the second second-node turnoff switching element for changing the level of the first-output-node to the OFF level based on the reset signal. Accordingly, the potential of the first output node changes directly to the OFF level by changing a potential of the reset signal (for example, by the potential of the reset signal changing from a low level to a high level when an N-channel type thin-film transistor is employed as the switching element). Further, the two switching elements (the first first-output-node turnoff switching element and the second first-output-node turnoff switching element) function so that the potential of the first-output-node decreases during a period in which the potential of the first-output-node is to change from an ON level to an OFF level (reset period). Accordingly, even when a load capacitance of the scanning signal lines is large, it is possible to quickly decrease the potential of the first output node to an OFF level during the reset period, and an output of an abnormal pulse from the first output node is suppressed.

According to the ninth aspect of the present invention, each bistable circuit of the shift register that constitutes the scanning signal line drive circuit includes the second first-node turnoff switching element for changing the level of the first-node to the OFF level based on the reset signal. Accordingly, the potential of the first-node changes directly to the OFF level by changing the potential of the reset signal. Further, the two switching elements (the first first-node turnoff switching element and the second first-node turnoff switching element) function so that the potential of the first-node decreases during the reset period. Accordingly, even when the circuits are operated at high speed, it is possible to reliably turn the potential of the first-node to an OFF level during the reset period, and the stability of the circuit operation is improved.

According to the tenth aspect of the present invention, an increase of the potential of the first-node during the set period becomes relatively small, and the OFF current of the first first-node turnon switching element becomes relatively small. Accordingly, the potential of the first-node at a time point at which the selection period ends is relatively low, while maintaining a potential required for the output control. With this, a voltage supplied to the first electrode of the first output control switching element decreases, and breakdown of the first output control switching element is suppressed. In addition, as a current leakage from the first-node is suppressed, the stability of the circuit operation is improved.

According to the eleventh aspect of the present invention, the OFF current of the first first-node turnoff switching element becomes relatively small. Accordingly, even when a thin-film transistor having a large leak current is employed as the switching element, it is possible to sufficiently increase the potential of the first-output-node during the selection period, as well as to quickly decrease the potential of the first-output-node during the reset period.

According to the twelfth aspect of the present invention, for each bistable circuit of the shift register, a signal for driving the scanning signal line corresponding to the each bistable circuit and a signal for controlling an operation of a previous stage bistable circuit of the each bistable circuit are different. Accordingly, it is possible to make waveform bluntness of the reset signal for each bistable circuit small. With this, even when a load capacitance of the scanning signal line is large, the operation based on the reset signal is quickly performed in each bistable circuit, and the reliability of the circuit operation is improved.

According to the thirteenth aspect of the present invention, for each bistable circuit of the shift register, a signal for driving the scanning signal line corresponding to the each bistable circuit and a signal for controlling operations of the previous stage bistable circuit and a next stage bistable circuit of the each bistable circuit are different. Accordingly, it is possible to make waveform bluntness of the set signal and the reset signal for each bistable circuit small. With this, even when a load capacitance of the scanning signal line is large, the operation based on the set signal and the operation based on the reset signal are quickly performed in each bistable circuit, and the stability of the circuit operation is improved.

According to the fourteenth aspect of the present invention, as the second electrode of the first second-node turnon switching element is supplied with the clock signal, a power supply voltage becomes an electric charge supply source of the first second-node turnon switching element. Further, a load applied to the second-input-node is reduced. Accordingly, a flow of an electric charge from the second-input-node to the second-node is prevented, and the potential of the second-input-node quickly changes. In addition, similarly to the twelfth aspect of the present invention, the waveform bluntness of the reset signal becomes smaller. With this, a decrease of the potential of the second-node in a period after the reset period ends is suppressed.

According to the fifteenth aspect of the present invention, as the second electrode of the first output control switching element is supplied with the DC power supply potential, a change of the potential of the first-output-node from an OFF level to an ON level starts in the set period. Accordingly, the scanning signal line is quickly turned to the selected state during the selection period, and charging time of the pixel capacitance is sufficiently ensured. Further, as compared to the configuration in which the second electrode of the first output control switching element is supplied with the clock signal, a load applied to the wiring for the clock signal is reduced. Accordingly, an occurrence of the waveform bluntness in the clock signal is suppressed, and the power consumption is reduced.

According to the sixteenth aspect of the present invention, the potential of the scanning signal is fully turned to the ON level during the selection period, and it is possible to obtain the effect of power consumption reduction.

According to the seventeenth aspect of the present invention, by turning the second second-node turnon switching element to the ON state based on the clear signal before starting the operation of the shift register, the potential of the first-node and the potential of the first-output-node become the OFF level for all the bistable circuits at a time point at which the operation of the shift register starts, and therefore the stability of the circuit operation is improved.

According to the eighteenth aspect of the present invention, it is possible to obtain the same effect as that of the seventeenth aspect of the present invention while reducing the number of signals.

According to the nineteenth aspect of the present invention, it is possible to make the level of the second-node to the level lower than the OFF level by turning the second-node level lowering switching element to the ON state based on the refresh signal. Accordingly, it is possible to suppress a threshold shift of the switching element whose first electrode is connected to the second-node (the first first-node turnoff switching element and the first first-output-node turnoff switching element).

According to the twentieth aspect of the present invention, it is possible to obtain the same effect as that of the nineteenth aspect of the present invention without using the refresh signal.

According to the twenty-first aspect of the present invention, it is possible to reduce costs for manufacturing the scanning signal line drive circuit.

According to the twenty-second aspect of the present invention, it is possible to realize the display device having the scanning signal line drive circuit with which the same effect as that of the first aspect of the present invention is obtained.

MODES FOR CARRYING OUT THE INVENTION

Hereinafter, embodiments according to the present invention will be described with reference to the accompanying drawings. It should be noted that in the following description, a gate terminal (gate electrode), a drain terminal (drain electrode), and a source terminal (source electrode) of a thin-film transistor respectively correspond to a first electrode, a second electrode, and a third electrode. Further, the description is given assuming that all thin-film transistors provided within a bistable circuit are of an N-channel type.

1. First Embodiment 1.1 Overall Configuration and Operation

Figure 2:
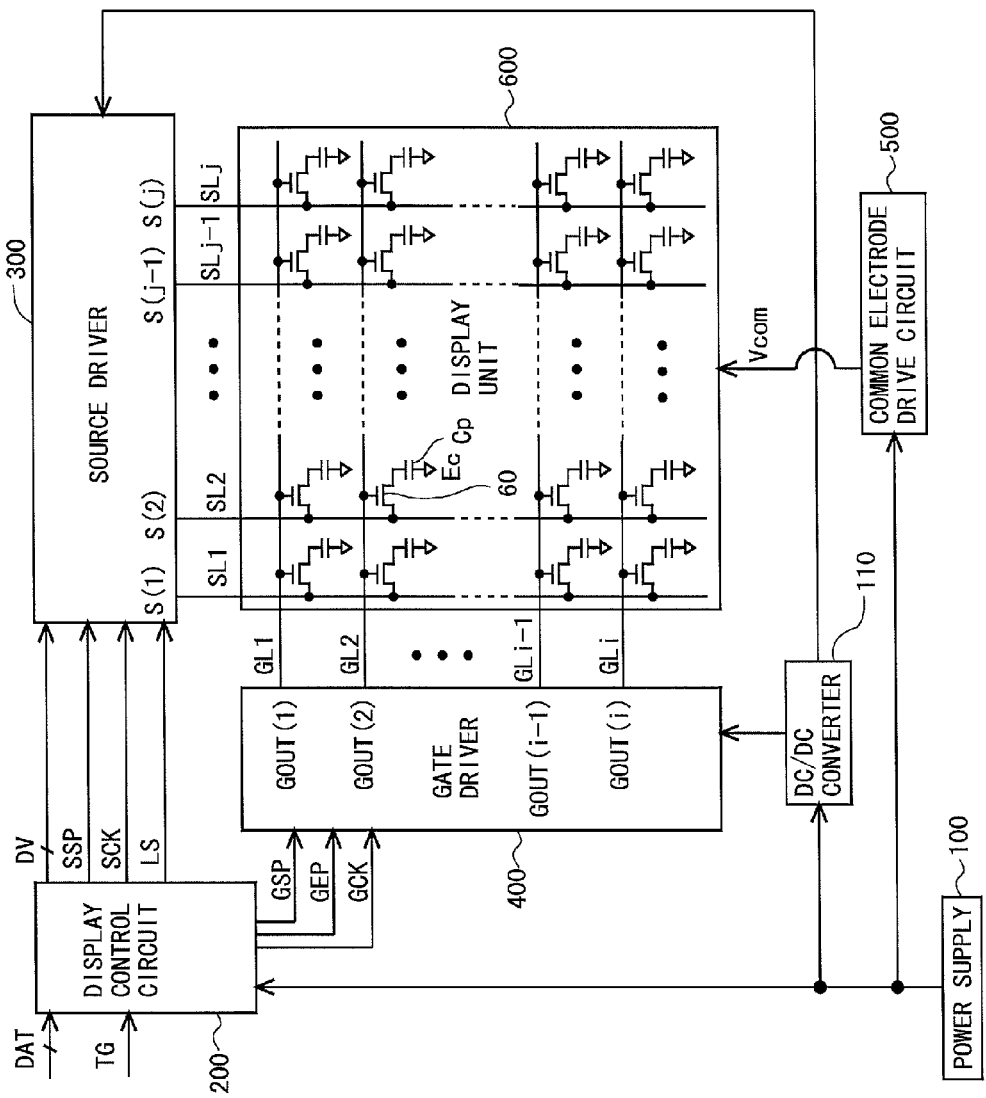
FIG. 2 is a block diagram for illustration of an overall configuration of the liquid crystal display device in the first embodiment.

FIG. 2 is a block diagram for illustration of an overall configuration of an active matrix-type liquid crystal display device according to a first embodiment of the present invention. As illustrated in FIG. 2, this liquid crystal display device is provided with a power supply 100, a DC/DC converter 110, a display control circuit 200, a source driver (video signal line drive circuit) 300, a gate driver (scanning signal line drive circuit) 400, a common electrode drive circuit 500, and a display unit 600. Here, the gate driver 400 is formed using amorphous silicon, polycrystalline silicon, microcrystalline silicon, oxide semiconductor (e.g., IGZO), or the like on a display panel including the display unit 600. Specifically, in this embodiment, the gate driver 400 and the display unit 600 are formed on the same substrate (an array substrate that is one of two substrates that constitute a liquid crystal panel).

The display unit 600 is provided with a pixel circuit having a plurality of (j) source bus lines (video signal lines) SL1 to SLj, a plurality of (i) gate bus lines (scanning signal lines) GL1 to GLi, and a plurality of (i×j) pixel formation portions which are provided at respective intersections between the source bus lines SL1 to SLj and the gate bus lines GL1 to GLi. The plurality of pixel formation portions are arranged in matrix and constitute a pixel array. Each of the pixel formation portions is configured by a thin-film transistor (TFT) 60 as a switching element having a gate terminal connected to a gate bus line that passes through a corresponding intersection and a source terminal connected to a source bus line that passes through the intersection, a pixel electrode connected to a drain terminal of the thin-film transistor 60, a common electrode Ec that is an opposite electrode provided in common to the plurality of pixel formation portions, and a liquid crystal layer provided in common to the plurality of pixel formation portions and sandwiched between the pixel electrodes and the common electrode Ec. Further, a liquid crystal capacitance formed by the pixel electrodes and the common electrode Ec constitutes a pixel capacitance Cp. While an auxiliary capacitance is generally provided in parallel with the liquid crystal capacitance in order to reliably hold a voltage in the pixel capacitance Cp, a description and illustration of the auxiliary capacitance is omitted as the auxiliary capacitance is not directly related to the present invention.

The power supply 100 supplies a predetermined power supply voltage to the DC/DC converter 110, the display control circuit 200, and the common electrode drive circuit 500.

The DC/DC converter 110 generates a predetermined direct voltage for operating the source driver 300 and the gate driver 400 based on the power supply voltage, and supplies it to the source driver 300 and the gate driver 400. The common electrode drive circuit 500 supplies a predetermined potential Vcom to the common electrode Ec.

The display control circuit 200 receives an externally supplied image signal DAT and an externally supplied timing signal group TG including a horizontal synchronizing signal and a vertical synchronizing signal, and outputs a digital video signal DV, and a source start pulse signal SSP, a source clock signal SCK, a latch strobe signal LS, a gate start pulse signal GSP, a gate end pulse signal GEP, and a gate clock signal GCK that are for controlling display of images in the display unit 600. It should be noted that in this embodiment, the gate clock signal GCK is configured by clock signals GCK1 (hereinafter referred to as a "first gate clock signal") and GCK2 (hereinafter referred to as a "second gate clock signal") of two phases as will be described later. Further, the gate clock signal GCK is generated from the power supply voltage, and its high level potential is VDD and its low level potential is VSS.

The source driver 300 receives the digital video signal DV, the source start pulse signal SSP, the source clock signal SCK, and the latch strobe signal LS that are outputted from the display control circuit 200, and applies driving video signals S(1) to S(j) respectively to the source bus lines SL1 to SLj.

Based on the gate start pulse signal GSP, the gate end pulse signal GEP, and the gate clock signal GCK that are outputted from the display control circuit 200, the gate driver 400 repeats application of active scanning signals GOUT(1) to GOUT(i) respectively to the gate bus lines GL1 to GLi with a cycle of single vertical scanning period. Herein, the gate driver 400 will be described later in detail.

In the above described manner, an image based on the image signal DAT externally supplied is displayed in the display unit 600, by applying the driving video signals S(1) to S(j) respectively to the source bus lines SL1 to SLj, and by applying the scanning signals GOUT (1) to GOUT (i) respectively to the gate bus lines GL1 to GLi.

1.2 Configuration and Operation of Gate Driver

Figure 3:
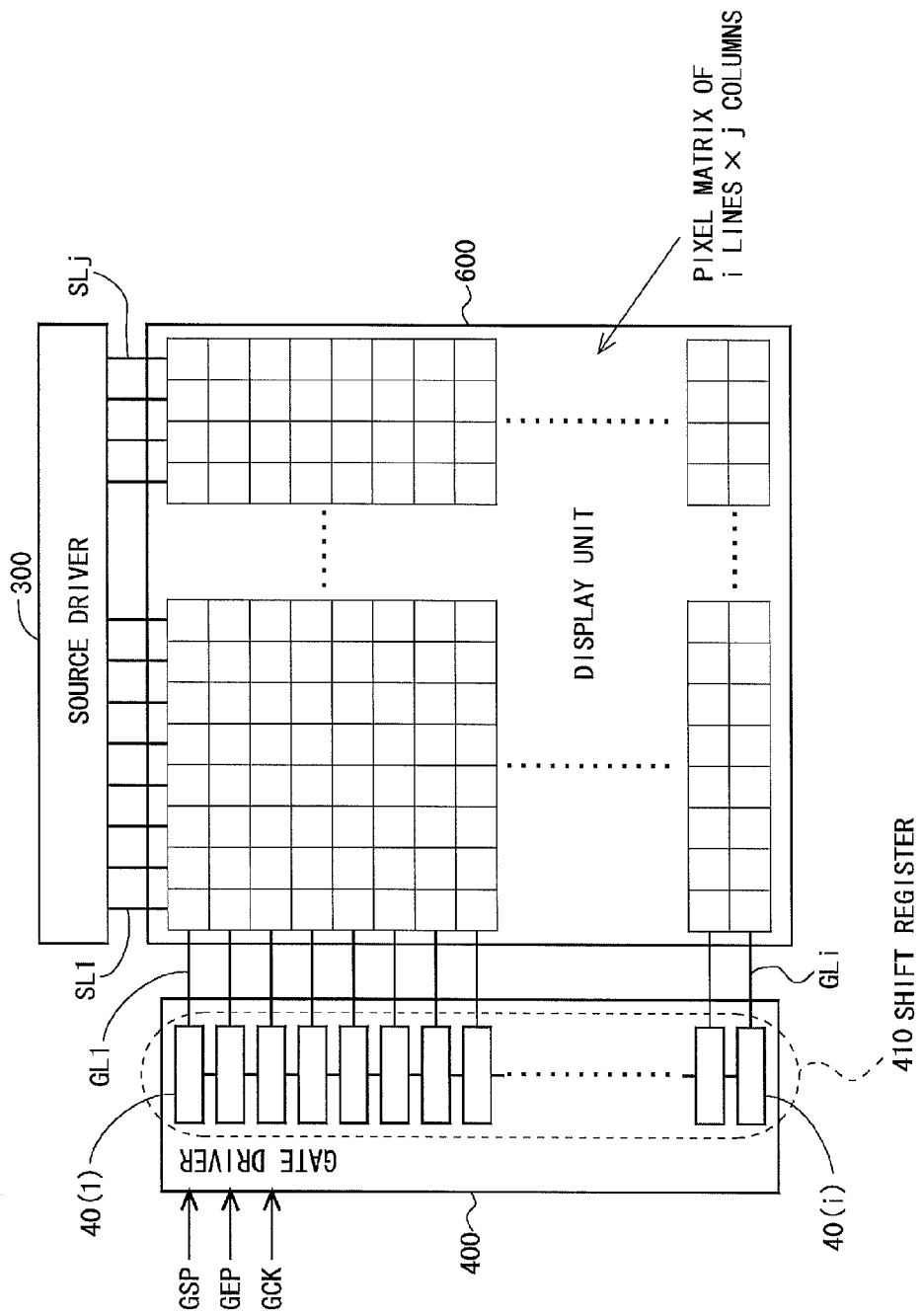
FIG. 3 is a block diagram for illustration of a configuration of the gate driver in the first embodiment.

Next, an outline of a configuration and an operation of the gate driver 400 according to this embodiment will be described with reference to FIG. 3 to FIG. 5. As illustrated in FIG. 3, the gate driver 400 is configured by a shift register 410 having a plurality of stages. The display unit 600 is provided with a pixel matrix having i lines×j columns, and the stages of the shift register 410 are provided so as to correspond to the lines of the pixel matrix respectively one on one. Further, each stage of the shift register 410 is configured as a bistable circuit that takes one of two states (a first state and a second state) at one time point, and outputs a signal indicating this state (hereinafter referred to as a "state signal"). As described above, the shift register 410 is configured by i bistable circuits 40(1) to 40(i). Here, in this embodiment, when a bistable circuit is in the first state, this bistable circuit outputs a state signal at a high level (H level), and when a bistable circuit is in the second state, this bistable circuit outputs a state signal at a low level (L level). It should be noted that in the following description, a period in which a state signal at a high level is outputted from a bistable circuit and a scanning signal at a high level is applied to a gate bus line corresponding to this bistable circuit is referred to as "selection period".

Figure 4:
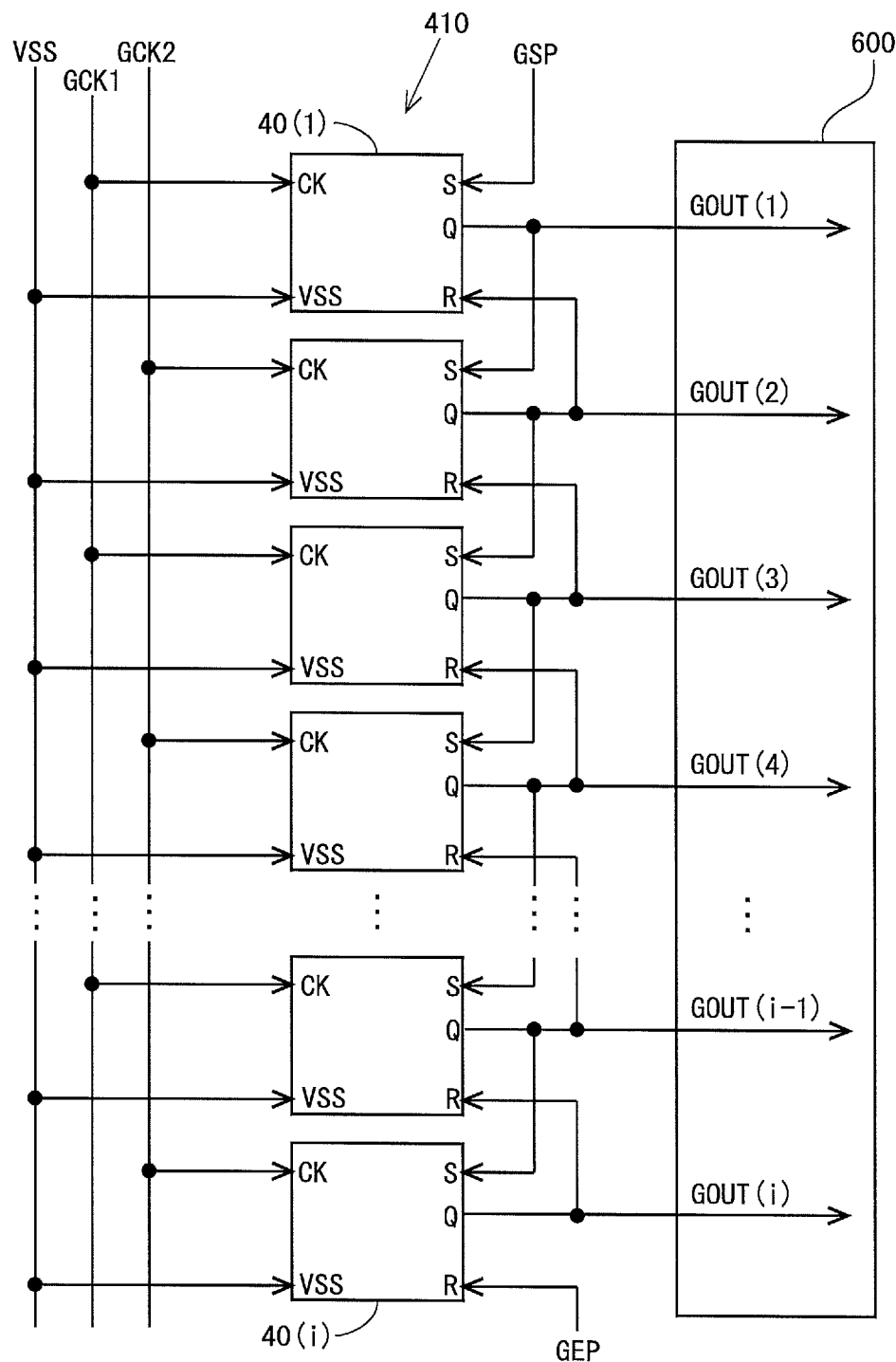
FIG. 4 is a block diagram showing a configuration of the shift register within the gate driver in the first embodiment.
Figure 5:
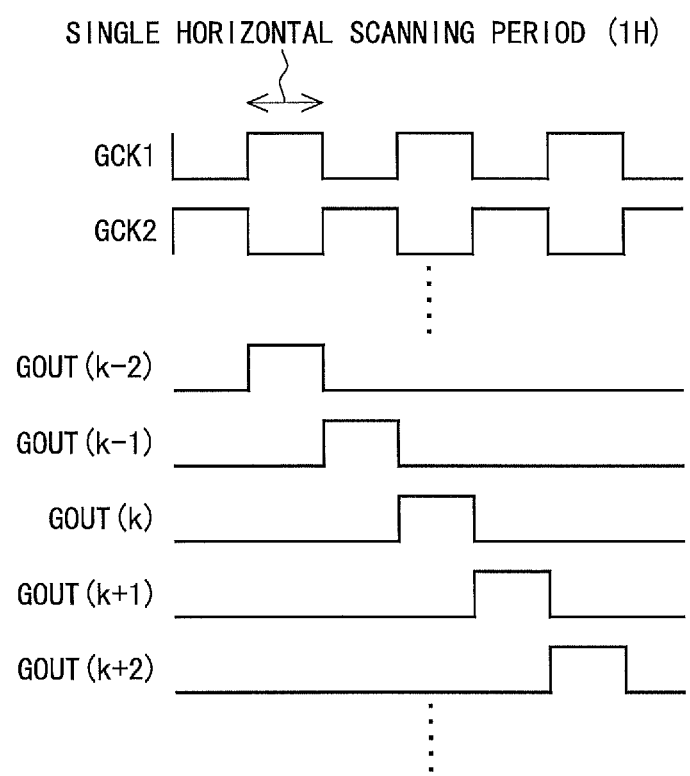
FIG. 5 is a signal waveform diagram for illustration of an operation of the gate driver in the first embodiment.

FIG. 4 is a block diagram showing a configuration of the shift register 410 within the gate driver 400. As described above, the shift register 410 is configured by the i bistable circuits 40(1) to 40(i). Each bistable circuit includes an input terminal for receiving a clock signal CK (hereinafter referred to as a "first clock"), an input terminal for receiving a low level DC power supply potential VSS (a magnitude of this potential is also referred to as a "VSS potential"), an input terminal for receiving a set signal S, an input terminal for receiving a reset signal R, and an output terminal for outputting a state signal Q.

The shift register 410 is supplied with, as the gate clock signal GCK, a first gate clock signal GCK1 and a second gate clock signal GCK2 that are clock signals of two phases. As illustrated in FIG. 5, the first gate clock signal GCK1 and the second gate clock signal GCK2 are out of phase with each other by a single horizontal scanning period, and either is driven to a high level (H level) only for a single horizontal scanning period in two horizontal scanning periods.

Signals supplied to the input terminals of each stage (each bistable circuit) of the shift register 410 are as described below. As for a first stage 40(1), the first gate clock signal GCK1 is supplied as the first clock CK. As for a second stage 40(2), the second gate clock signal GCK2 is supplied as the first clock CK. As for stages of a third stage and thereafter, the same configurations as those for the first stage and the second stage are applied for each two stages. Further, the first stage 40(1) is supplied with the gate start pulse signal GSP as the set signal S. As for each of the stages of the second stage 40(2) and thereafter, the state signal Q of a previous stage is supplied as the set signal S. Moreover, an i-th stage 40(i) is supplied with the gate end pulse signal GEP as the reset signal R. As for each of previous stages of a (i−1) th stage 40(i−1), the state signal Q of a next stage is supplied as the reset signal R. Here, the low level DC power supply potential VSS is supplied to all of the bistable circuits in common.

In the configuration described above, when the gate start pulse signal GSP is supplied as the set signal S to the first stage 40(1) of the shift register 410, a pulse included in the gate start pulse signal GSP (this pulse is included in the state signal Q outputted from each stage) is transferred sequentially from the first stage 40(1) to the i-th stage 40(i) based on the first gate clock signal GCK1 and the second gate clock signal GCK2. Then, along with the transferring of the pulse, the state signal Q outputted from each of the stages 40(1) to 40(i) is sequentially driven to a high level. Subsequently, the state signals Q outputted from the stages 40(1) to 40(i) are respectively supplied to the gate bus lines GL1 to GLi as the scanning signals GOUT(1) to GOUT(i). In this manner, as illustrated in FIG. 5, the scanning signals that are sequentially become at a high level (active) by each one horizontal scanning period are supplied to the gate bus lines within the display unit 600.

1.3 Configuration of Bistable Circuit

Figure 1:
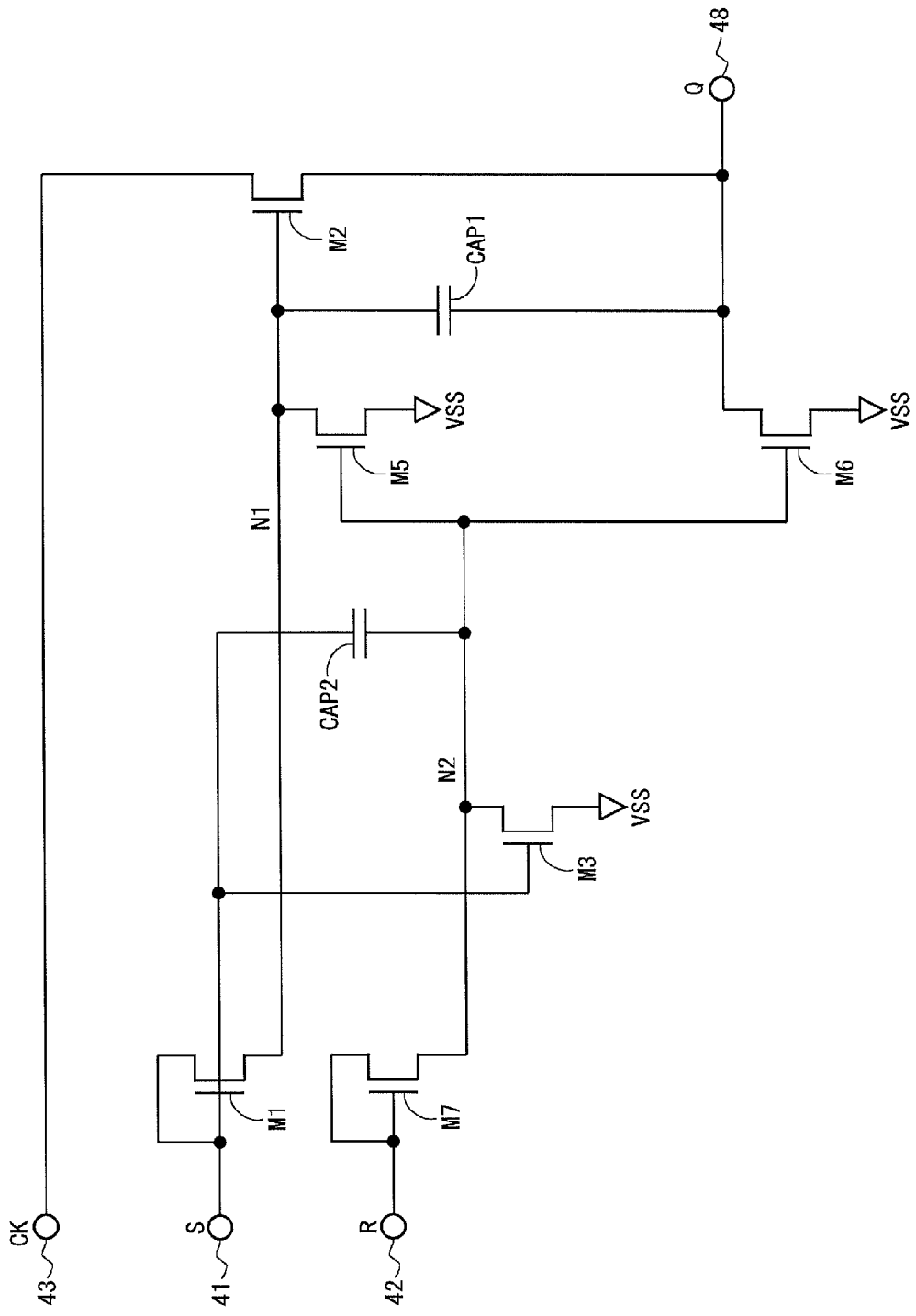
FIG. 1 is a circuit diagram showing a configuration of a bistable circuit included in a shift register within a gate driver of a liquid crystal display device according to a first embodiment of the present invention.

FIG. 1 is a circuit diagram showing a configuration of a bistable circuit (a configuration of a single stage in the shift register 410) according to this embodiment. As illustrated in FIG. 1, this bistable circuit is provided with six thin-film transistors M1 to M3 and M5 to M7, and two capacitors CAP1 and CAP2. Additionally, this bistable circuit includes three input terminals 41 to 43 and a single output terminal 48, in addition to the input terminal for the low level DC power supply potential VSS. Here, the input terminal for receiving the set signal S is indicated by a reference numeral 41, the input terminal for receiving the reset signal R is indicated by a reference numeral 42, and the input terminal for receiving the first clock CK is indicated by a reference numeral 43.

Further, the output terminal for outputting the state signal Q is indicated by a reference numeral 48.

Next, connecting relation among components within the bistable circuit is described. A source terminal of the thin-film transistor M1, a gate terminal of the thin-film transistor M2, a drain terminal of the thin-film transistor M5, and one end of the capacitor CAP1 are connected to each other. Here, a region (wiring) in which these components are connected to each other is referred to as a "first-node" for convenience sake. A drain terminal of the thin-film transistor M3, a gate terminal of the thin-film transistor M5, a gate terminal of the thin-film transistor M6, a source terminal of the thin-film transistor M7, and one end of the capacitor CAP2 are connected to each other. Here, a region (wiring) in which these components are connected to each other is referred to as a "second-node" for convenience sake. The first-node is indicated by a reference numeral N1, and the second-node is indicated by a reference numeral N2.

For the thin-film transistor M1, a gate terminal and a drain terminal are connected to the input terminal 41 (that is, diode-connected), and the source terminal is connected to the first-node N1. For the thin-film transistor M2, the gate terminal is connected to the first-node N1, a drain terminal is connected to the input terminal 43, and a source terminal is connected to the output terminal 48. For the thin-film transistor M3, a gate terminal is connected to the input terminal 41, the drain terminal is connected to the second-node N2, and a source terminal is connected to the input terminal for the DC power supply potential VSS. For the thin-film transistor M5, the gate terminal is connected to the second-node N2, the drain terminal is connected to the first-node N1, and a source terminal is connected to the input terminal for the DC power supply potential VSS. For the thin-film transistor M6, the gate terminal is connected to the second-node N2, a drain terminal is connected to the output terminal 48, and a source terminal is connected to the input terminal for the DC power supply potential VSS. For the thin-film transistor M7, a gate terminal and a drain terminal are connected to the input terminal 42 (that is, diode-connected), and the source terminal is connected to the second-node N2. For the capacitor CAP1, the one end is connected to the first-node N1, and the other end is connected to the output terminal 48. For the capacitor CAP2, the one end is connected to the second-node N2, and the other end is connected to the input terminal 41.

In this case, it is preferable that a capacitance value C2 of the capacitor CAP2 satisfies an equation (1) listed below where capacitance values of parasitic capacitances between the gates and the drains of the thin-film transistors M3, M5, and M6 are respectively C3, C5, and C6.

$$C2 \geq C5 + C6 - C3 \quad (1)$$

More specifically, it is preferable that the capacitance value C2 of the capacitor CAP2 satisfies an equation (2) listed below where capacitance values including wiring capacity of the input terminal 41, the first-node N1, and the output terminal 48 with respect to the second-node N2 are respectively C41, CN1, and C48.

$$C2 \geq CN1 + C48 - C41 \quad (2)$$

Next, functions of the components in the bistable circuit are described. The thin-film transistor M1 changes a potential of the first-node N1 to a high level when the set signal S is at a high level. The thin-film transistor M2 supplies a potential of the first clock CK to the output terminal 48 when the potential of the first-node N1 is at a high level. The thin-film transistor M3 changes a potential of the second-node N2 to the VSS potential when the set signal S is at a high level. The thin-film transistor M5 changes the potential of the first-node N1 to the VSS potential when the potential of the second-node N2 is at a high level. The thin-film transistor M6 changes a potential of the output terminal 48 to the VSS potential when the potential of the second-node N2 is at a high level. The thin-film transistor M7 changes the potential of the second-node N2 to a high level when the reset signal R is at a high level. The capacitor CAP1 functions as a compensation capacitance for maintaining the potential of the first-node N1 at a high level during a period in which a gate bus line connected to this bistable circuit is in a selected state. The capacitor CAP2 functions to stabilize a circuit operation by decreasing the potential of the second-node N2 when the gate bus line connected to this bistable circuit is in the selected state.

It should be noted that in this embodiment, the thin-film transistor M1 realizes a first-node turnon switching element, the thin-film transistor M2 realizes a first output control switching element, the thin-film transistor M3 realizes a first second-node turnoff switching element, the thin-film transistor M5 realizes a first first-node turnoff switching element, the thin-film transistor M6 realizes a first first-output-node turnoff switching element, and the thin-film transistor M7 realizes a first second-node turnon switching element. Further, the input terminal 41 realizes a first-input-node, the input terminal 42 realizes a second-input-node, and the output terminal 48 realizes a first-output-node.

1.4 Operation of Bistable Circuit

Figure 6:
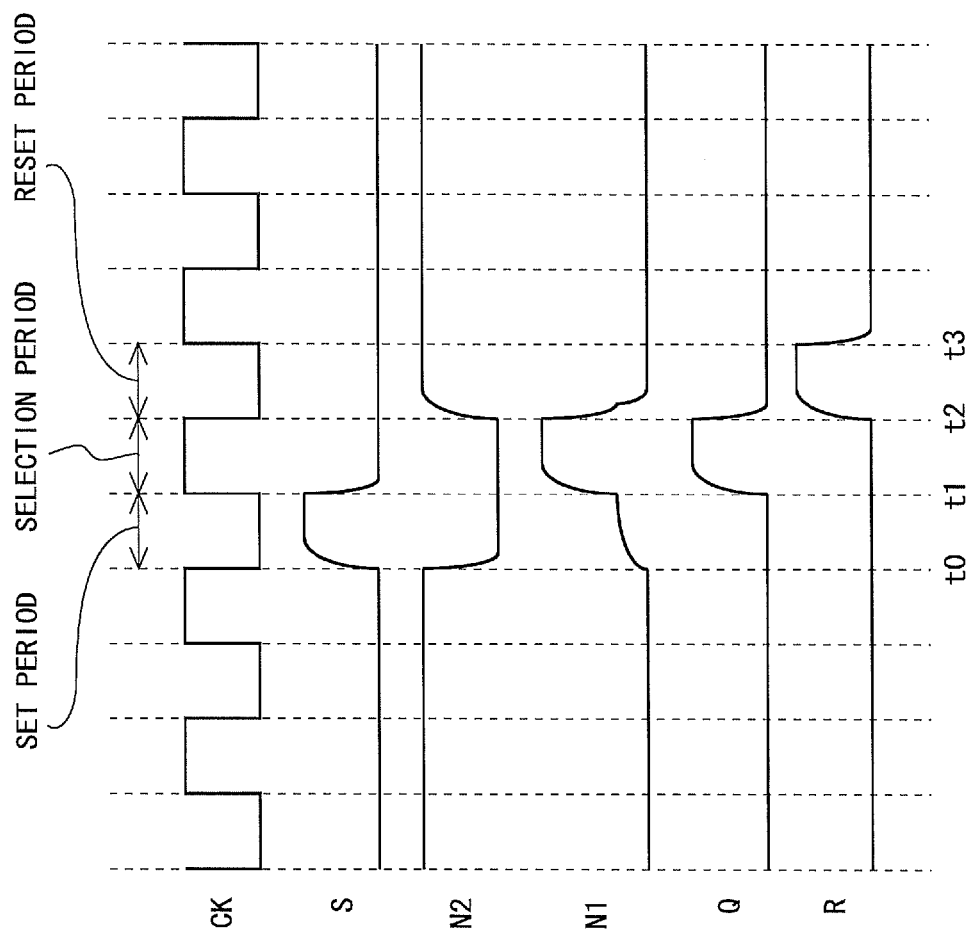
FIG. 6 is a signal waveform diagram for illustration of an operation of the bistable circuit in the first embodiment.

Next, an operation of the bistable circuit according to this embodiment will be described with reference to FIG. 1 and FIG. 6. In FIG. 6, a period from time t1 to time t2 corresponds to the selection period. It should be noted that in the following description, a single horizontal scanning period immediately before the selection period is referred to as a "set period", and a single horizontal scanning period immediately after the selection period is referred to as a "reset period". Further, a period other than the selection period, the set period, and the reset period is referred to as a "normal operation period".

In the normal operation period (periods before time t0 and after time t3), the potential of the second-node N2 is maintained at a high level. Accordingly, the thin-film transistors M5 and M6 are in the ON state. As there is the parasitic capacitance between the gate and the drain of the thin-film transistor M2, a noise is generated at the first-node N1 due to fluctuation of a waveform of the first clock CK (see FIG. 6). However, as the thin-film transistor M5 is in the ON state, the potential of the first-node N1 is pulled to a low level. Further, a noise is also generated in the state signal Q (the output terminal 48) due to the noise generated at the first-node N1 and fluctuation of a video signal voltage. However, as the thin-film transistor M6 is in the ON state, a potential of the state signal Q is pulled to a low level. Thus, the potential of the first-node N1 and the potential of the state signal Q are maintained at a low level during this period.

In the set period (when reaching time t0), the set signal S changes from a low level to a high level. As the thin-film transistor M1 is diode-connected as illustrated in FIG. 1, the thin-film transistor M1 is turned to the ON state by the set signal S driven to a high level, and the capacitor CAP1 is charged (precharged, in this case). With this, the potential of the first-node N1 changes from a low level to a high level, and the thin-film transistor M2 is turned to the ON state. However, in the set period, as the first clock CK is at a low level, the potential of the state signal Q is maintained at a low level. Further, the thin-film transistor M3 is turned to the ON state by the set signal S driven to a high level, and the potential of the second-node N2 becomes a low level. With this, the thin-film transistors M5 and M6 are turned to the OFF state. Thus, in the set period, as the set signal S is driven to a high level and the potential of the second-node N2 becomes a low level, the capacitor CAP2 is charged based on a potential difference between the input terminal 41 and the second-node N2.

In the selection period (when reaching time t1), the set signal S changes from a high level to a low level. At this time, as the potential of the second-node N2 is at a low level, the thin-film transistor M5 is in the OFF state. Thus, the first-node N1 is turned to a floating state. Here, at time t1, the first clock CK changes from a low level to a high level. Because there is the parasitic capacitance between the gate and the drain of the thin-film transistor M2 as described above, the potential of the first-node N1 increases as a potential of the input terminal 43 increases (the first-node N1 is bootstrapped). As a result, the thin-film transistor M2 is fully turned to the ON state, and the potential of the state signal Q increases up to a level sufficient for turning a gate bus line connected to the output terminal 48 of this bistable circuit to the selected state. In the meantime, as there are also the parasitic capacitances between the gates and the drains of the thin-film transistors M5 and M6, the potential of the second-node N2 is going to increase as the potential of the first-node N1 and the potential of the state signal Q increase. However, because the capacitor CAP2 is charged based on the potential difference between the input terminal 41 and the second-node N2 during the set period, and because the set signal S changes from a high level to a low level during this period, the potential of the second-node N2 is maintained at a low level.

In the reset period (when reaching time t2), the first clock CK changes from a high level to a low level. At time t2, the thin-film transistor M2 is in the ON state, and therefore the potential of the state signal Q decreases as the potential of the input terminal 43 decreases. By the potential of the state signal Q decreasing in this manner, the potential of the first-node N1 also decreases via the capacitor CAP1. Further, the reset signal R changes from a low level to a high level during this period. Accordingly, the thin-film transistor M7 is turned to the ON state, and the potential of the second-node N2 becomes a high level. With this, the thin-film transistors M5 and M6 are turned to the ON state. As a result, the potential of the first-node N1 and the potential of the state signal Q decrease down to a low level in the reset period.

1.5 Effects

Figure 7:
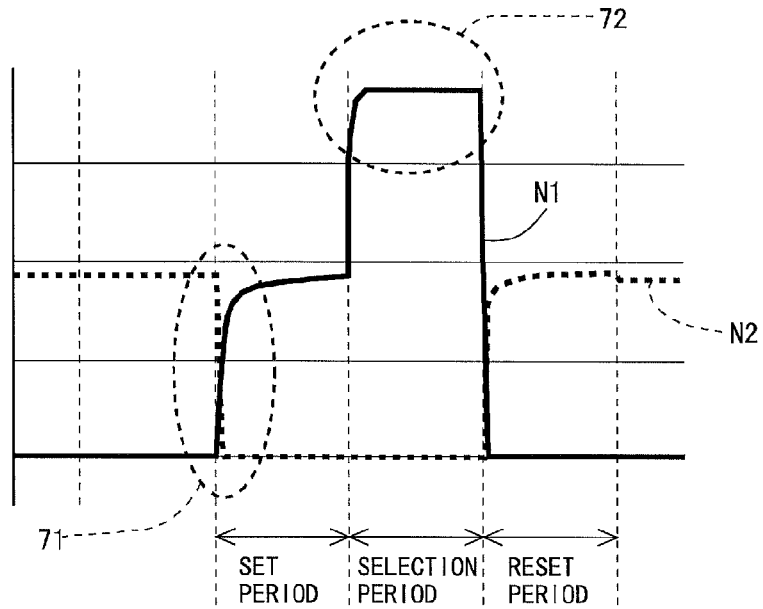
FIG. 7 is a signal waveform diagram showing changes of a potential of a first-node and a potential of a second-node in the first embodiment.
Figure 8:
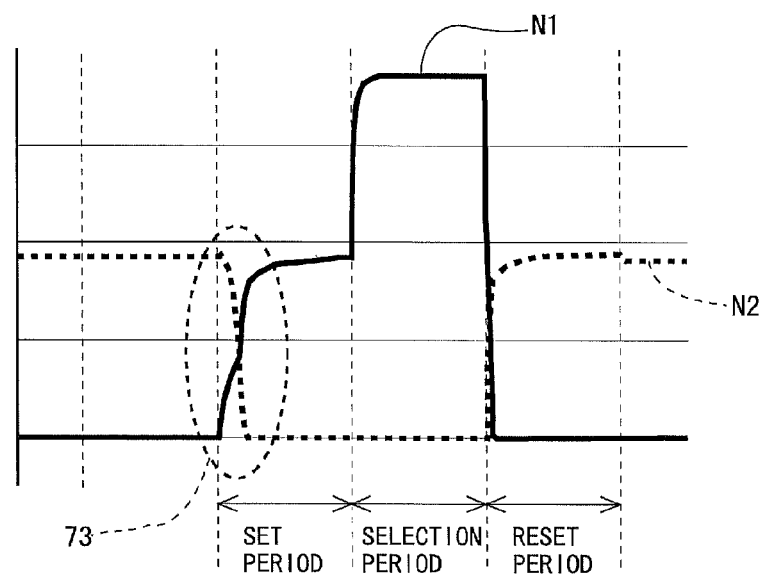
FIG. 8 is a signal waveform diagram showing changes of a potential of a first-node and a potential of a second-node in a conventional configuration shown in FIG. 51.
Figure 9:
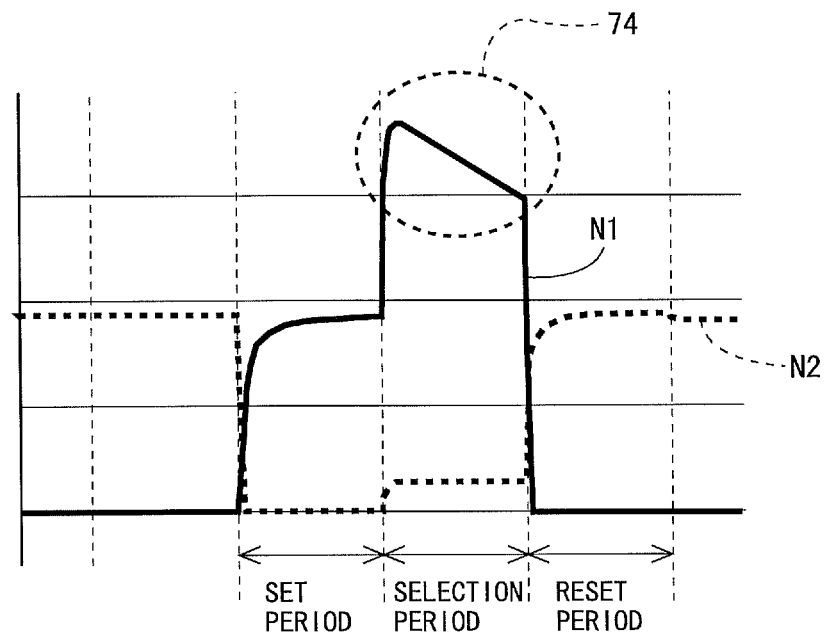
FIG. 9 is a signal waveform diagram showing changes of a potential of a first-node and a potential of a second-node in a conventional configuration shown in FIG. 52.

Effects of this embodiment will be described with reference to FIG. 7 to FIG. 9. FIG. 7 is a signal waveform diagram showing changes of the potentials of the first-node N1 and the second-node N2 according to this embodiment. FIG. 8 is a signal waveform diagram showing changes of the potentials of the first-node N1 and the second-node N2 according to the conventional configuration shown in FIG. 51. FIG. 9 is a signal waveform diagram showing changes of the potentials of the first-node N1 and the second-node N2 according to the conventional configuration shown in FIG. 52.

Figure 51:
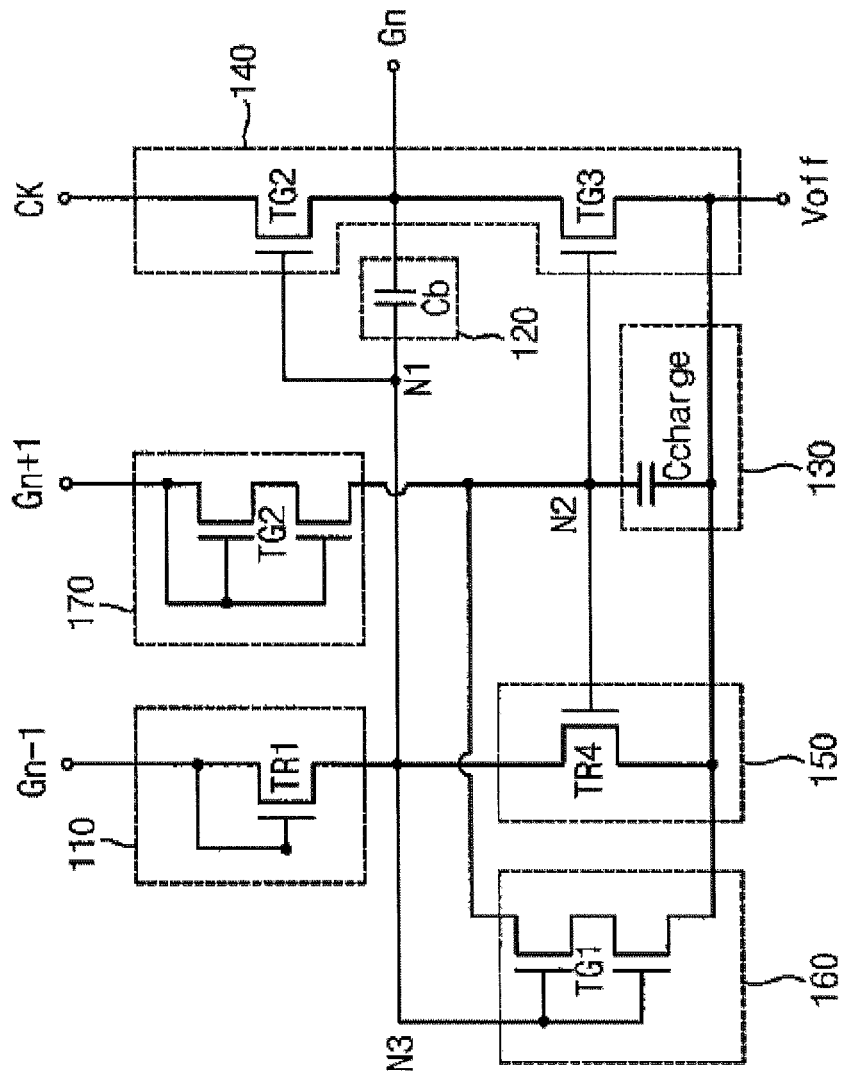
FIG. 51 is a circuit diagram showing one example of a configuration of a bistable circuit included in a shift register in the conventional display device.

According to the conventional configuration shown in FIG. 51, when the potential of the second-node N2 decreases due to the increase of the potential of the first-node N1, the potential of the second-node N2 decreases in the following order. First, the potential of the first-node N1 increases by a set signal Gn−1 changing from a low level to a high level. Next, the potential of the second-node N2 decreases by the transistor group TG1 being turned to the ON state based on the increase of the potential of the first-node N1. In this manner, the potential of the second-node N2 decreases after the potential of the first-node N1 has increased. In the meantime, as illustrated in FIG. 51, each bistable circuit is provided with the transistor TR4 for decreasing the potential of the first-node N1 based on the potential of the second-node N2. Accordingly, in a time period immediately after the set period has started, the potential of the first-node N1 is both going to decrease based on the potential of the second-node N2 and to increase based on the set signal Gn−1. As a result, as can be seen from a portion of a waveform indicated by a reference numeral 73 in FIG. 8, the potential of the first-node N1 during the set period does not increase quickly. Therefore, the circuit operation lacks stability.

By contrast, according to this embodiment, the potential of the second-node N2 decreases directly by a potential of the set signal S changing from a low level to a high level. As the thin-film transistor M5 is turned to the OFF state by the decrease of the potential of the second-node N2, the increase of the potential of the first-node N1 during the set period may not be prevented. As a result, as can be seen from a portion of a waveform indicated by a reference numeral 71 in FIG. 7, the potential of the first-node N1 during the set period increases quickly. Therefore, stability of the circuit operation is improved as compared to the conventional configuration.

Further, according to the conventional configuration shown in FIG. 51, because there is a parasitic capacitance between the gate and the drain of the transistor TG2 in which the first electrode is connected to the first-node N1 and the second electrode is supplied with the clock CK, a noise is generated at the first-node N1 due to fluctuation of the waveform of the clock CK. Accordingly, the potential of the second-node N2 decreases due to the noise. As a result, the transistor TR4 having a function of decreasing the potential of the first-node N1 is not fully turned to the ON state, and the noise that has been generated at the first-node N1 increases.

By contrast, relating to the second-node N2 for decreasing the potential of the first-node, as this embodiment does not employ the configuration of "decreasing the potential of the second-node N2 by increasing the potential of the first-node N1", generation of a large noise at the first-node N1 is suppressed. In addition, as the capacitor CAP2 is charged during the set period, and as the set signal S changes from a high level to a low level during the selection period, the potential of the second-node N2 is maintained at a low level during the selection period. Accordingly, a decrease of the potential of the first-node N1 during the set period is suppressed, and the stability of the circuit operation is ensured.

Figure 52:
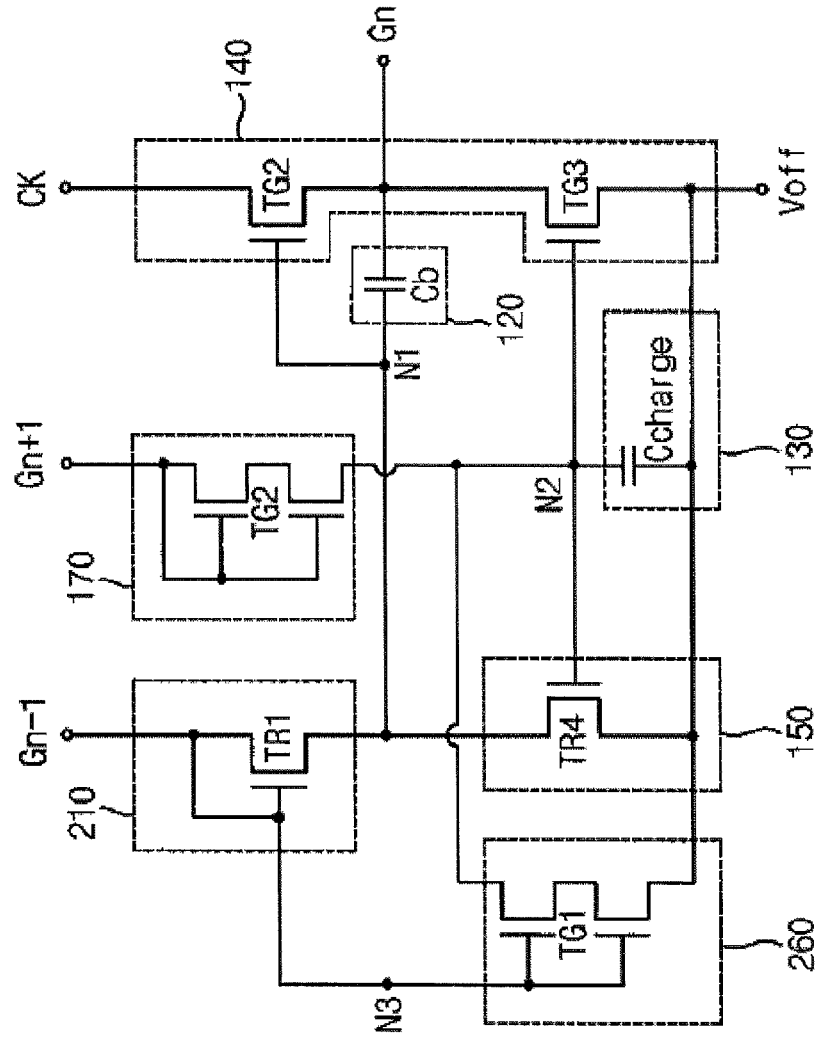
FIG. 52 is a circuit diagram showing another example of the configuration of the bistable circuit included in the shift register in the conventional display device.

Further, according to the conventional configuration shown in FIG. 52, after the potential of the second-node N2 increases based on the increase of a potential of the set signal Gn−1, the second-node N2 is turned to the floating state in the selection period. Here, during the selection period, the potential of the second-node N2 increases due to the parasitic capacitances between gates and drains of the transistors TG3 and TR4. Accordingly, the transistors TG3 and TR4 are slightly turned to the ON state during the selection period. With this, the increase of the potential of the gate signal Gn (corresponds to the state signal Q according to this embodiment) is prevented, and the potential of the first-node N1 that should be maintained at a high level decreases as shown by a portion indicated by a reference numeral 74 in FIG. 9.

By contrast, according to this embodiment, an electric charge that is positive on a side of the input terminal 41 is charged in the capacitor CAP2 during the set period. Then, in the selection period, the set signal S supplied to the input terminal 41 decreases from a high level to a low level. Accordingly, even when the potential of the second-node N2 is going to increase during the selection period due to the presence of the parasitic capacitances between the gates and the drains of the thin-film transistors M5 and M6, an increase of the potential of the second-node N2 is suppressed as the potential of the capacitor CAP2 on a side of the other end (on the side of the input terminal 41) decreases. With this, a decrease of the potential of the first-node N1 during the selection period is suppressed. As a result, the potential of the first-node N1 is maintained at a sufficiently high level during the selection period as shown by a portion indicated by a reference numeral 72 in FIG. 7. It should be noted that in order to reliably suppress the increase of the potential of the second-node N2 during the selection period, it is preferable that the relation between the capacitance values of the thin-film transistors M3, M5, and M6 and the capacitance value of the capacitor CAP2 satisfies the equation (1). In addition, although there is a possibility that a current leakage occurs in the thin-film transistors M3 and M7 due to an influence of the noises occurring in the set signal S and the reset signal R, and the potential of the second-node N2 decreases, according to this embodiment, a decrease of the potential of the second-node N2 due to such a current leakage is suppressed by the electric charge being charged to the capacitor CAP2.

Moreover, according to this embodiment, the capacitor CAP2 also has the same function as that of a frame capacitor Ccharge in the configurations illustrated in FIG. 51 and FIG. 52. Therefore, a shift register having superior operational stability can be achieved without increasing the number of necessary circuit elements, as compared to the conventional configuration.

1.6 Modified Examples

Next, modified examples of the first embodiment will be described.

1.6.1 Modified Examples for Configuration Near Thin-Film Transistor M1

Figure 10:
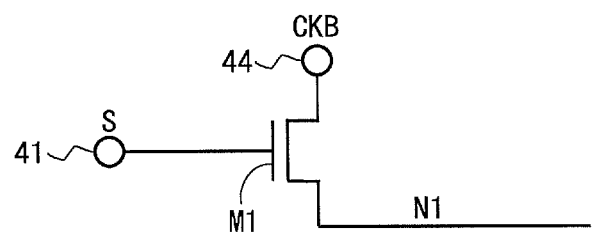
FIG. 10 is a diagram showing a configuration near a thin-film transistor M1 according to a first modified example of the first embodiment.
Figure 11:
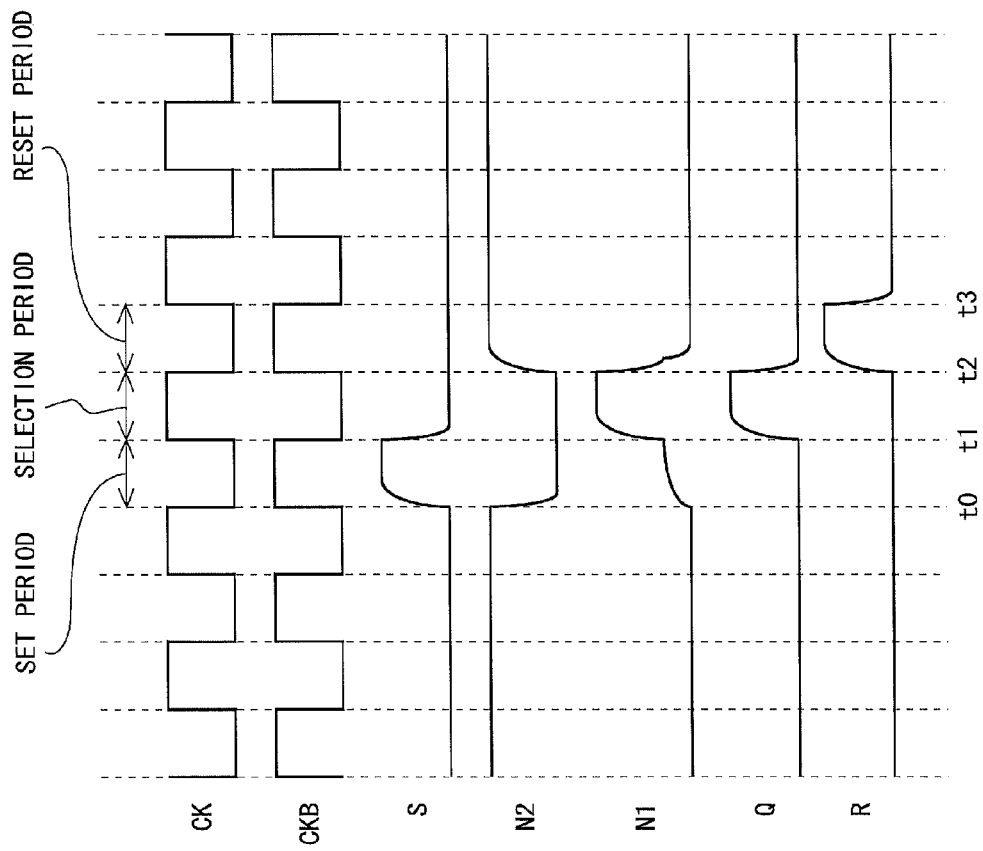
FIG. 11 is a signal waveform diagram for illustration of an operation of a bistable circuit in the first modified example of the first embodiment.
Figure 12:
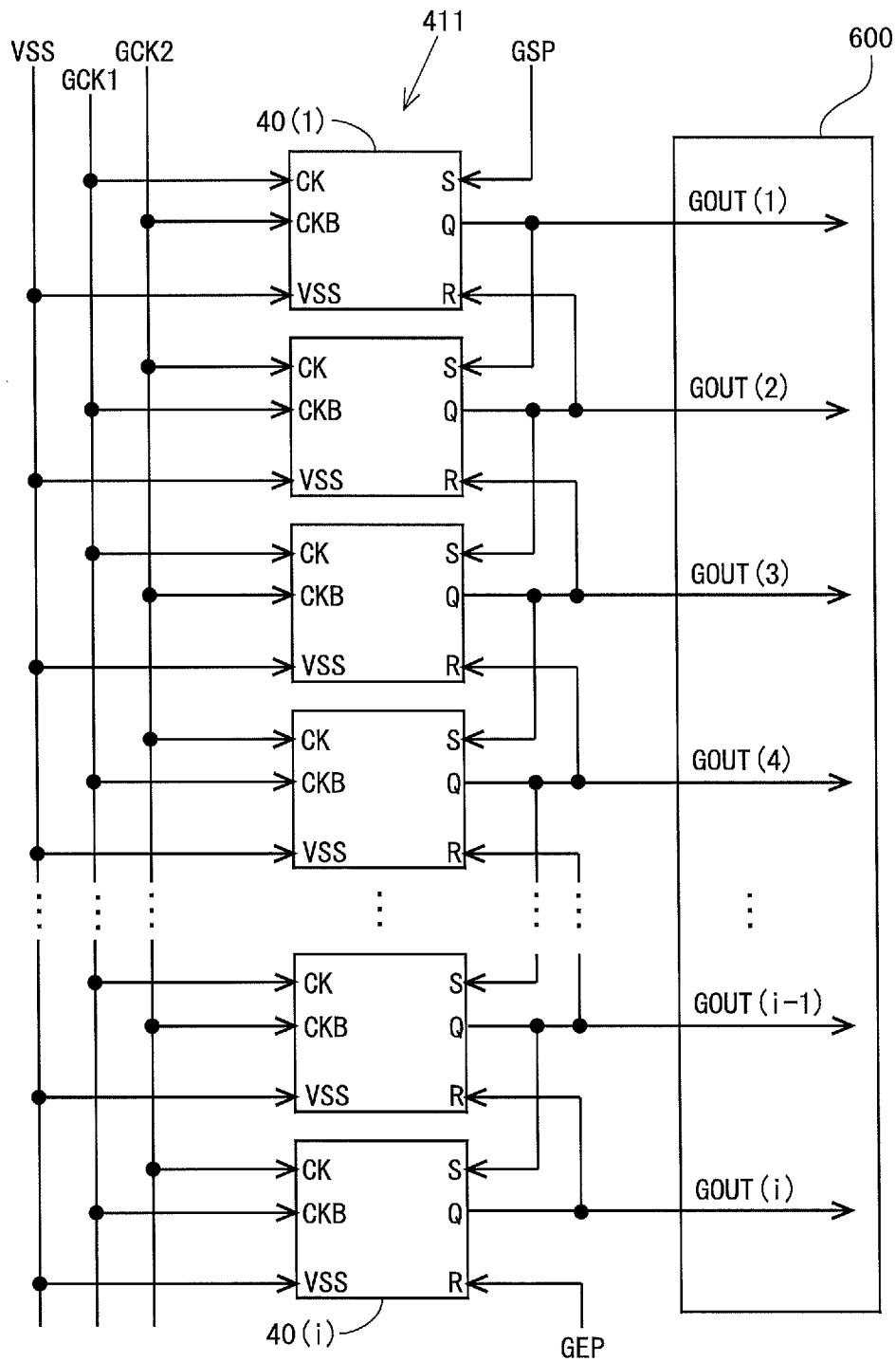
FIG. 12 is a block diagram showing a configuration of a shift register within a gate driver in the first modified example of the first embodiment.

In the first embodiment, for the thin-film transistor M1, the gate terminal and the drain terminal are connected to the input terminal 41, and the source terminal is connected to the first-node N1. However, the present invention is not limited to this. As illustrated in FIG. 10, the thin-film transistor M1 may be configured such that the gate terminal is connected to the input terminal 41, the drain terminal is connected to an input terminal 44 for receiving a clock signal CKB (hereinafter referred to as a "second clock") (hereinafter, the input terminal for receiving the second clock CKB is indicated by the reference numeral 44), and the source terminal is connected to the first-node N1 (first modified example). When this configuration is employed, a shift register 411 is configured as illustrated in FIG. 12 so that the bistable circuits are supplied with the first clock CK and the second clock CKB that are alternately turned to a high level every other single horizontal scanning period as illustrated in FIG. 11. Specifically, according to the first modified example, an odd-numbered stage of the shift register 411 is supplied with the first gate clock signal GCK1 as the first clock CK, and is supplied with the second gate clock signal GCK2 as the second clock CKB. An even-numbered stage of the shift register 411 is supplied with the second gate clock signal GCK2 as the first clock CK, and is supplied with the first gate clock signal GCK1 as the second clock CKB.

According to the first modified example, the drain terminal of the thin-film transistor M1 is supplied with the second clock CKB. As illustrated in FIG. 12, each bistable circuit is supplied with one of the first gate clock signal GCK1 and the second gate clock signal GCK2 as the second clock CKB, and the first gate clock signal GCK1 and the second gate clock signal GCK2 are generated from the power supply voltage as described above. Therefore, according to the first modified example, the power supply voltage is an electric charge supply source for the first-node N1. Accordingly, unlike the first embodiment, a flow of the electric charge from the input terminal 41 to the first-node N1 is prevented, and a potential of the input terminal 41 quickly increases. It should be noted that with a configuration in which the drain terminal of the thin-film transistor M1 is connected to an input terminal for receiving a high level DC power supply potential VDD (a magnitude of this potential is also referred to as a "VDD potential"), it is possible to achieve the same effect as that of the configuration illustrated in FIG. 10.

Figure 13:
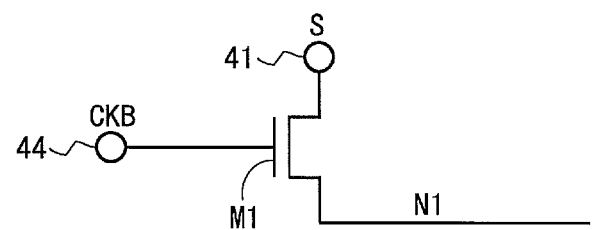
FIG. 13 is a diagram showing a configuration near a thin-film transistor M1 according to a second modified example of the first embodiment.

Further, as illustrated in FIG. 13, the thin-film transistor M1 may be configured such that the gate terminal is connected to the input terminal 44, the drain terminal is connected to the input terminal 41, and the source terminal is connected to the first-node N1 (second modified example). According to the second modified example, the thin-film transistor M1 is turned to the ON state based on the power supply voltage. Accordingly, the thin-film transistor M1 is quickly turned to the ON state in the set period, and the potential of the first-node N1 quickly increases.

1.6.2 Modified Examples for Configuration near Thin-Film Transistor M7

Figure 14:
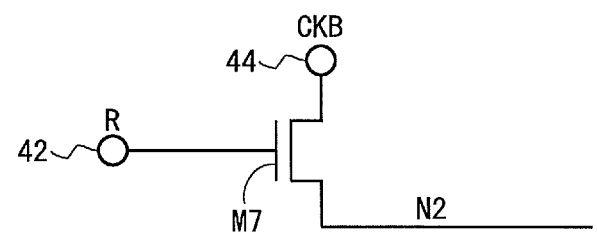
FIG. 14 is a diagram showing a configuration near a thin-film transistor M7 according to a third modified example of the first embodiment.

In the first embodiment, for the thin-film transistor M7, the gate terminal and the drain terminal are connected to the input terminal 42, and the source terminal is connected to the second-node N2. However, the present invention is not limited to this. As illustrated in FIG. 14, the thin-film transistor M7 may be configured such that the gate terminal is connected to the input terminal 42, the drain terminal is connected to the input terminal 44, and the source terminal is connected to the second-node N2 (third modified example). According to the third modified example, as the drain terminal of the thin-film transistor M7 is supplied with the second clock CKB, the power supply voltage is an electric charge supply source for the second-node N2. Accordingly, unlike the first embodiment, a flow of the electric charge from the input terminal 42 to the second-node N2 is prevented, and a potential of the input terminal 42 quickly increases. It should be noted that with a configuration in which the drain terminal of the thin-film transistor M7 is connected to the input terminal for the high level DC power supply potential VDD, it is possible to achieve the same effect as that of the configuration illustrated in FIG. 14.

Figure 15:
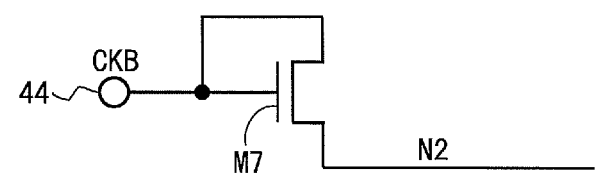
FIG. 15 is a diagram showing a configuration near a thin-film transistor M7 according to a fourth modified example of the first embodiment.
Figure 16:
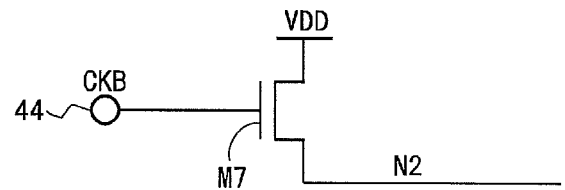
FIG. 16 is a diagram showing a configuration near a thin-film transistor M7 according to a fifth modified example of the first embodiment.

Further, as illustrated in FIG. 15, the thin-film transistor M7 may be configured such that the gate terminal and the drain terminal are connected to the input terminal 44, and the source terminal is connected to the second-node N2 (fourth modified example). Moreover, as illustrated in FIG. 16, the thin-film transistor M7 may be configured such that the gate terminal is connected to the input terminal 44, the drain terminal is connected to the input terminal for the high level DC power supply potential VDD, and the source terminal is connected to the second-node N2 (fifth modified example). According to the configuration illustrated in FIG. 1 (the configuration of the first embodiment), the thin-film transistor M7 is turned to the ON state only once in a single vertical scanning period. However, according to the fourth modified example and the fifth modified example, the thin-film transistor M7 is turned to the ON state every two horizontal scanning periods, and therefore the electric charge is supplied to the second-node N2 with a short cycle. Accordingly, the potential of the second-node N2 is reliably maintained at a high level during the normal operation period. In the meantime, as the set signal S and the second clock CKB are driven to a high level during the set period (see the period from time t0 to time t1 in FIG. 11), there is a possibility that the thin-film transistor M3 and the thin-film transistor M7 are turned to the ON state substantially at the same timing and thus the circuit operation possibly becomes unstable. Therefore, it is preferable that a transistor size (channel width/channel length) of the thin-film transistor M7 be sufficiently smaller than a transistor size of the thin-film transistor M3. With this, a driving force of the thin-film transistor M7 becomes smaller than a driving force of the thin-film transistor M3, and the potential of the second-node N2 decreases even when the thin-film transistor M3 and the thin-film transistor M7 are turned to the ON state substantially at the same timing during the set period, and the circuit operation becoming unstable is suppressed.

It should be noted that according to the third to the fifth modified examples, the shift register 411 is configured as illustrated in FIG. 12.

1.6.3 Modified Examples for Configuration Near Thin-Film Transistor M3

Figure 17:
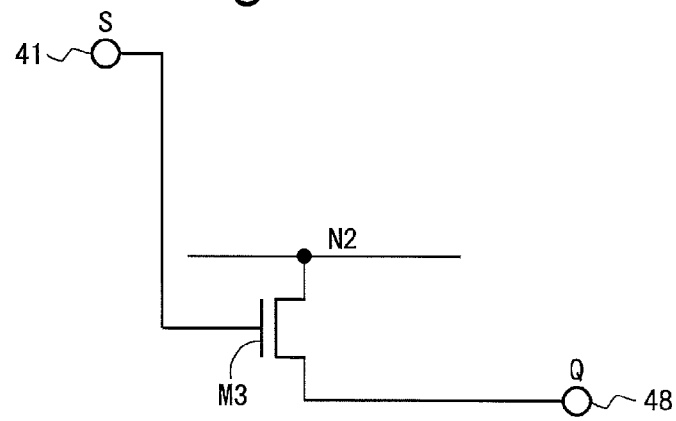
FIG. 17 is a diagram showing a configuration near a thin-film transistor M3 according to a sixth modified example of the first embodiment.
Figure 18:
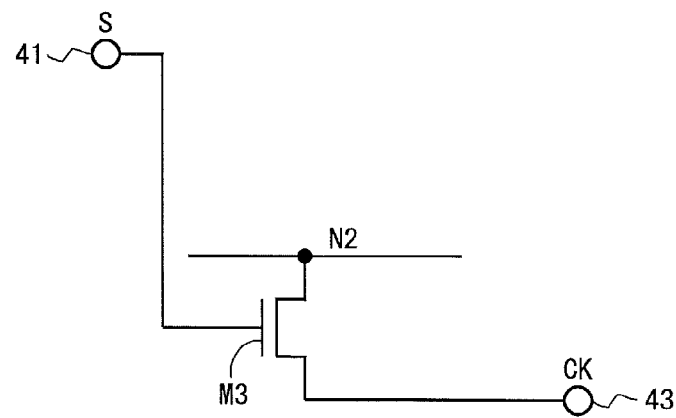
FIG. 18 is a diagram showing a configuration near a thin-film transistor M3 according to a seventh modified example of the first embodiment.

In the first embodiment, for the thin-film transistor M3, the gate terminal is connected to the input terminal 41, the drain terminal is connected to the second-node N2, and the source terminal is connected to the input terminal for the DC power supply potential VSS. However, the present invention is not limited to this. As illustrated in FIG. 17, the source terminal of the thin-film transistor M3 may be connected to the output terminal 48 (sixth modified example). Further, as illustrated in FIG. 18, the source terminal of the thin-film transistor M3 may be connected to the input terminal 43 (seventh modified example). The reason of these are described below. During the set period, the potential of the second-node N2 should be maintained at a low level as the potential of the first-node N1 is required to increase. Further, as can be seen from FIG. 6, the potential of the output terminal 48 (the potential of the state signal Q) and the potential of the input terminal 43 (the potential of the first clock CK) are at a low level during the set period. Thus, for the thin-film transistor M3 in which the gate terminal is supplied with the set signal S and the drain terminal is connected to the second-node N2, the potential of the second-node N2 becomes a low level in the set period even when the source terminal is connected to the output terminal 48 or the input terminal 43.

1.6.4 Arrangement of Capacitor CAP2

Figure 19:
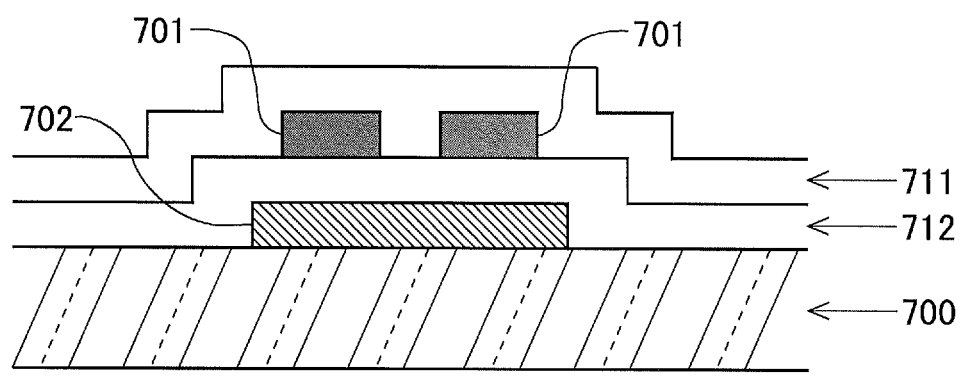
FIG. 19 is a partial cross-sectional view of an array substrate on which a gate driver, pixel circuits, and the like are formed.

Next, a preferred configuration of an arrangement of the capacitor CAP2 will be described. FIG. 19 is a partial cross-sectional view of an array substrate on which the gate driver 400 and the pixel circuits are provided. The array substrate has a layered structure so as to form the gate driver 400 and the pixel circuits, and the layered structure includes two metallic films (metallic layers). Specifically, as illustrated in FIG. 19, a metallic film 702, a protective film 712, a metallic film 701, and a protective film 711 are layered over a glass substrate 700. The metallic film 701 is used to form the source electrodes (and the drain electrodes) of the thin-film transistors provided for the gate driver 400 and the pixel circuits. Therefore, hereinafter, the metallic film 701 is referred to as a "source metal" 701. The metallic film 702 is used to form the gate electrodes of the thin-film transistors. Therefore, hereinafter, the metallic film 702 is referred to as a "gate metal" 702. Here, the source metal 701 and the gate metal 702 are used as wiring patterns formed within the gate driver 400 or the pixel circuits, in addition to as the electrodes of the thin-film transistor.

Figure 20:
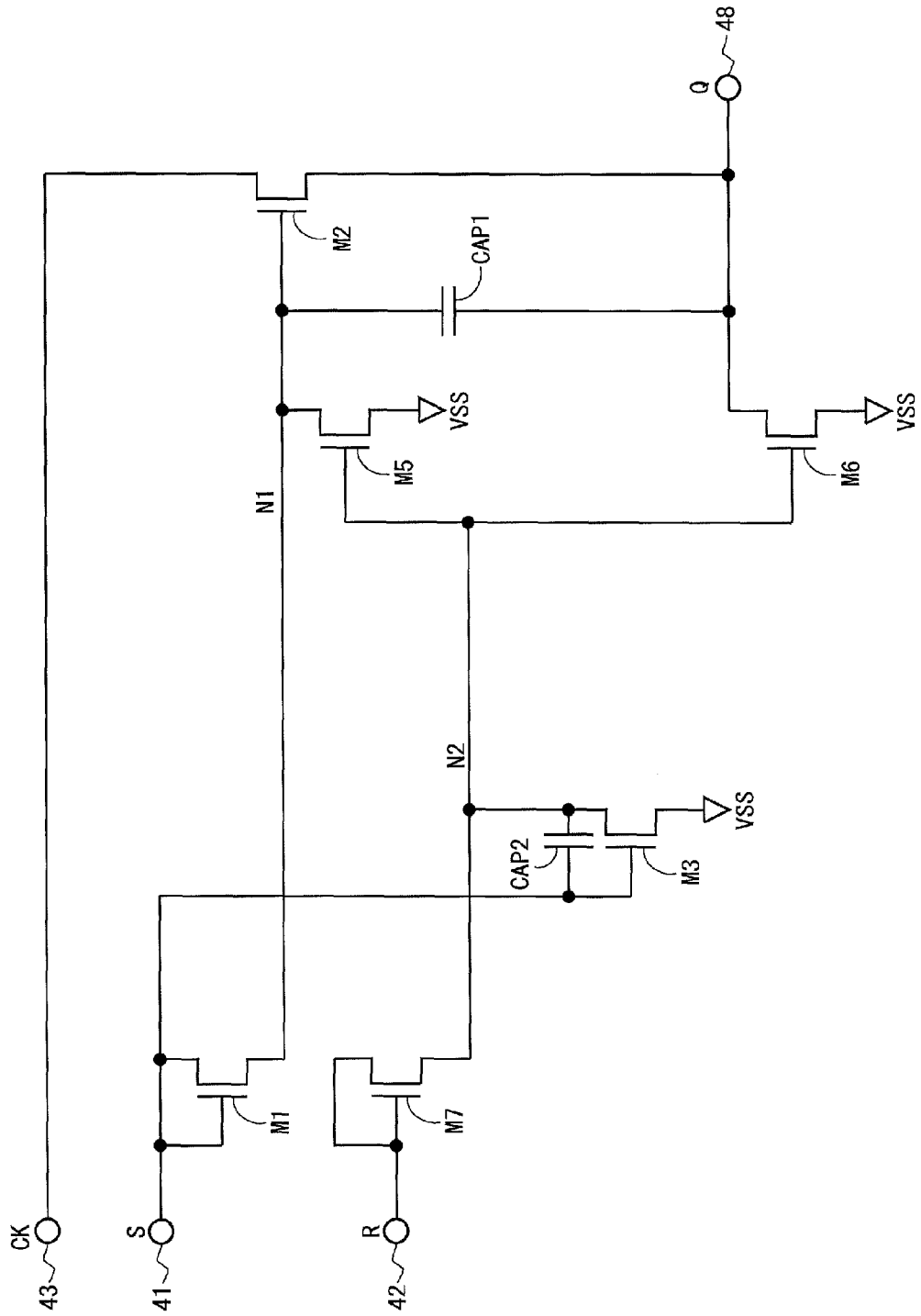
FIG. 20 is a circuit diagram for illustration of a preferred arrangement of a capacitor CAP2 in the first embodiment.

According to the first embodiment, as for the capacitor CAP2, one end is connected to the second-node N2, and the other end is connected to the input terminal 41. Regarding the capacitor CAP2, it is preferable that the electrode on the side of the one end be made of the source metal 701, and the electrode on the side of the other end be made of the gate metal 702. Further, as illustrated in FIG. 20, it is preferable that the capacitor CAP2 and the thin-film transistor M3 be arranged adjacent to each other. At this time, for the thin-film transistor M3, the drain electrode is made of the source metal 701 and the gate electrode is made of the gate metal 702. By employing such a configuration, an increase of an area for wiring and an area for mounting by providing the capacitor CAP2 is suppressed. With this, it is possible to reduce a size of a picture frame of the panel. Additionally, reliability of the circuit operation is improved as a wiring load is reduced.

2. Second Embodiment

2.1 Configuration of Bistable Circuit

Figure 21:
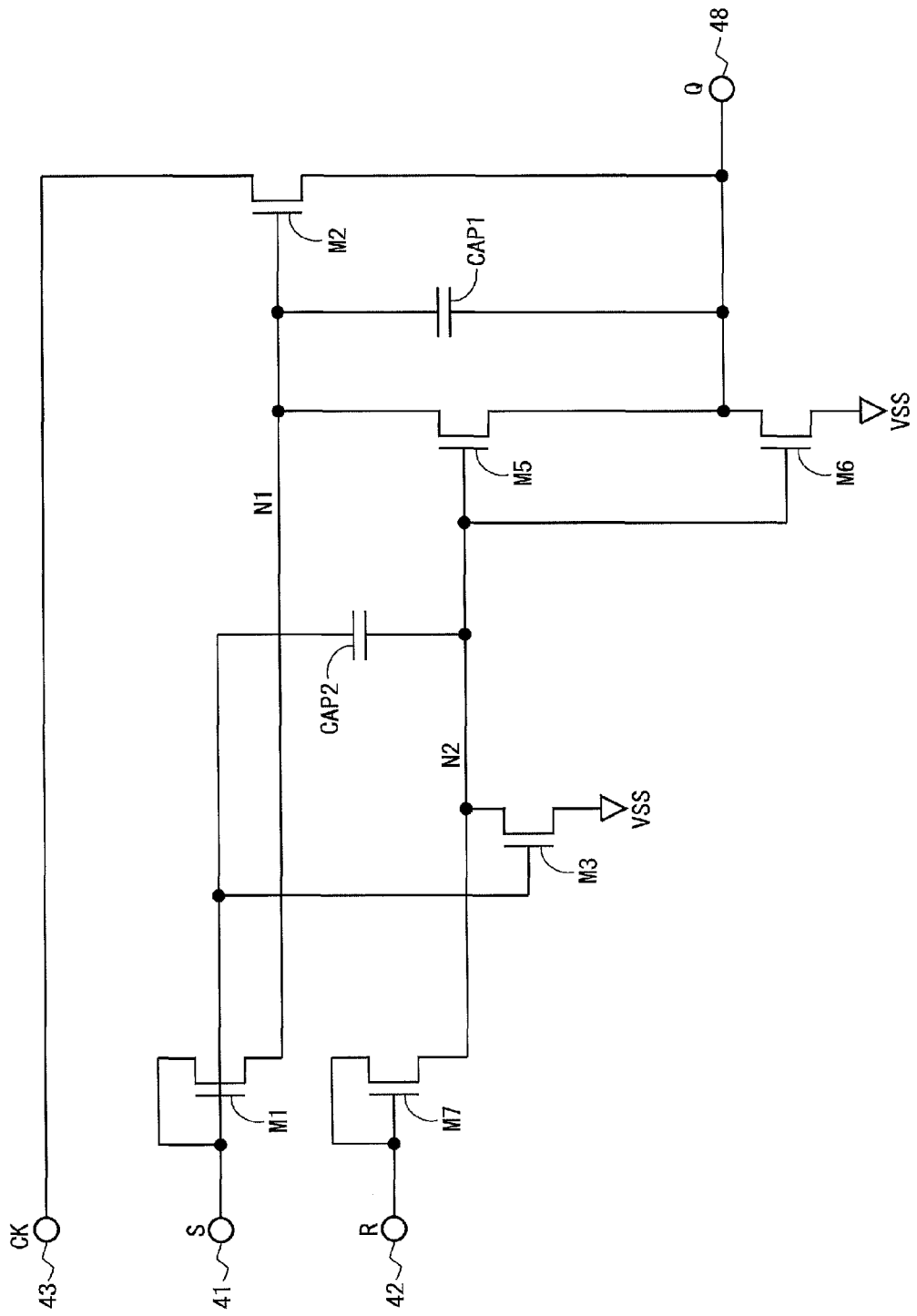
FIG. 21 is a circuit diagram showing a configuration of a bistable circuit according to a second embodiment of the present invention.

FIG. 21 is a circuit diagram showing a configuration of a bistable circuit according to a second embodiment of the present invention. Here, an overall configuration and an operation of a liquid crystal display device and a configuration and an operation of a gate driver are the same as those in the first embodiment, and therefore descriptions for these are omitted.

According to the first embodiment, for the thin-film transistor M5, the gate terminal is connected to the second-node N2, the drain terminal is connected to the first-node N1, and the source terminal is connected to the input terminal for the DC power supply potential VSS. However, the present invention is not limited to this. As illustrated in FIG. 21, the source terminal of the thin-film transistor M5 may be connected to the output terminal 48.

2.2 Effects

According to this embodiment, the source terminal of the thin-film transistor M5 is supplied with the potential of the state signal Q. Here, in the selection period, the potential of the first-node N1 connected to the drain terminal of the thin-film transistor M5 is at a high level, and the state signal Q is also at a high level (see FIG. 6). Accordingly, as compared to the first embodiment employing the configuration in which the source terminal of the thin-film transistor M5 is supplied with the DC power supply potential VSS, a voltage between the drain and the source of the thin-film transistor M5 during the selection period is reduced. With this, during the selection period, an outflow of an electric charge from the first-node N1 via the thin-film transistor M5 is suppressed. As a result, the potential of the first-node N1 is reliably maintained at a high level during the selection period, and the stability of the circuit operation is effectively improved.

3. Third Embodiment

3.1 Configuration of Bistable Circuit

Figure 22:
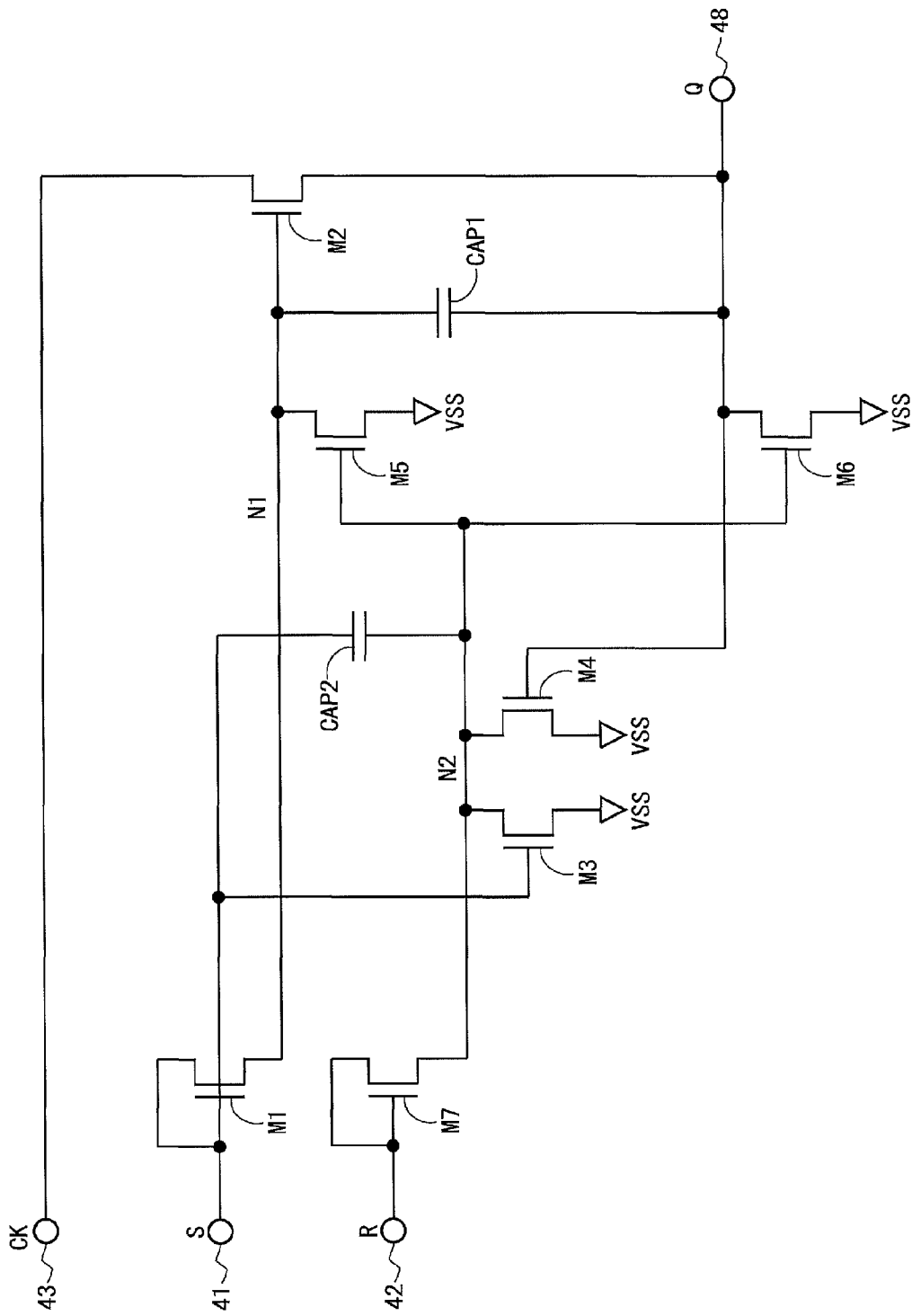
FIG. 22 is a circuit diagram showing a configuration of a bistable circuit according to a third embodiment of the present invention.

FIG. 22 is a circuit diagram showing a configuration of a bistable circuit according to a third embodiment of the present invention. Here, an overall configuration and an operation of a liquid crystal display device and a configuration and an operation of a gate driver are the same as those in the first embodiment, and therefore descriptions for these are omitted.

According to this embodiment, the bistable circuit is provided with a thin-film transistor M4, in addition to the components of the first embodiment illustrated in FIG. 1. For the thin-film transistor M4, a gate terminal is connected to the output terminal 48, a drain terminal is connected to the second-node N2, and a source terminal is connected to the input terminal for the DC power supply potential VSS. The thin-film transistor M4 functions so as to change the potential of the second-node N2 to the VSS potential when the potential of the output terminal 48 is at a high level. The thin-film transistor M4 realizes a second second-node turnoff switching element.

3.2 Effects

As described above, the gate terminal of the thin-film transistor M4 is connected to the output terminal 48. Further, the potential of the state signal Q (the potential of the output terminal 48) becomes a high level in the selection period. Thus, the thin-film transistor M4 is turned to the ON state during the selection period. With this, during the selection period, the potential of the second-node N2 is pulled to a low level. Therefore, according to this embodiment, the potential of the second-node N2 is reliably maintained at a low level during the selection period, and the stability of the circuit operation is effectively improved.

4. Fourth Embodiment

4.1 Configuration of Bistable Circuit

Figure 23:
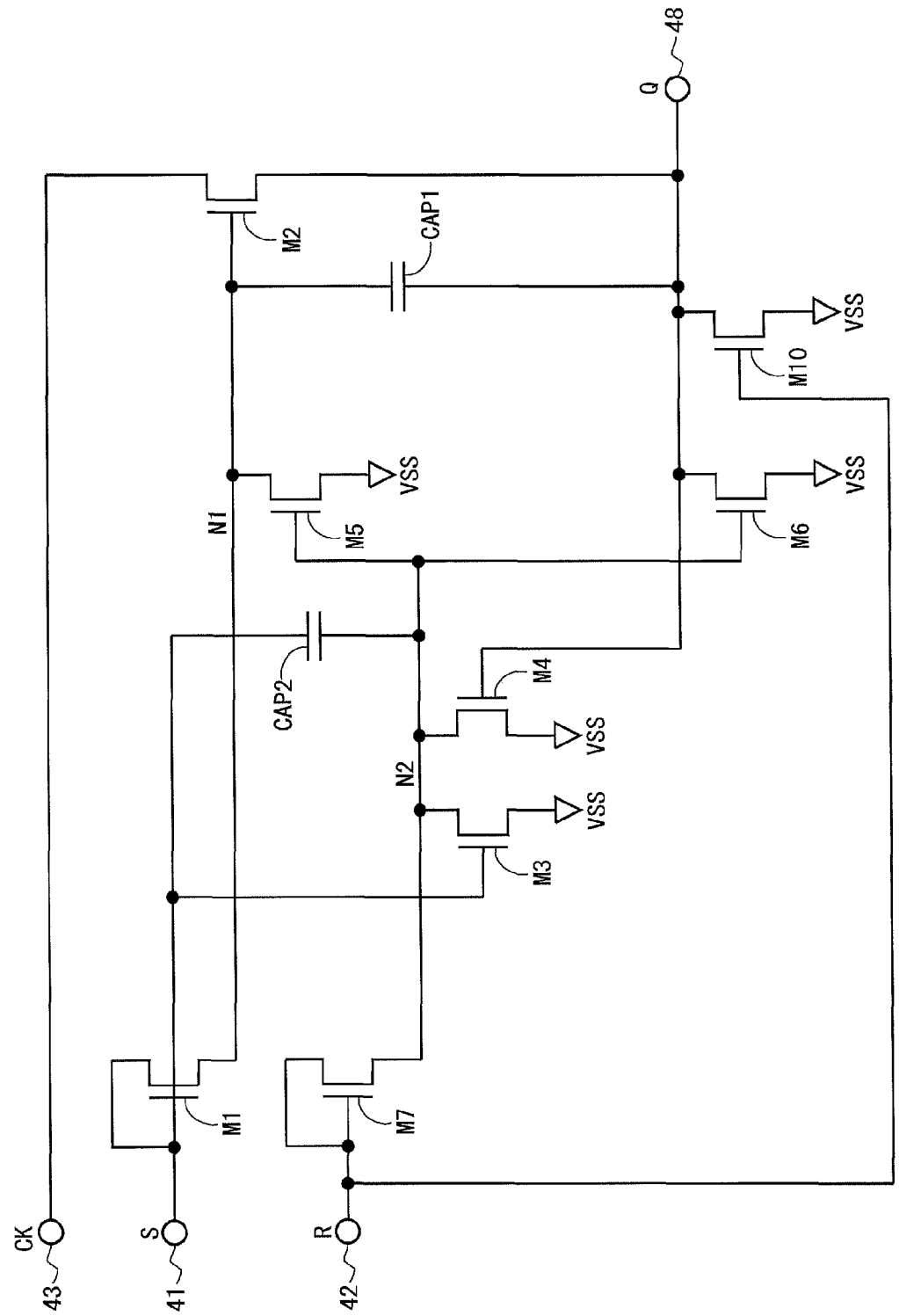
FIG. 23 is a circuit diagram showing a configuration of a bistable circuit according to a fourth embodiment of the present invention.

FIG. 23 is a circuit diagram showing a configuration of a bistable circuit according to a fourth embodiment of the present invention. Here, an overall configuration and an operation of a liquid crystal display device and a configuration and an operation of a gate driver are the same as those in the first embodiment, and therefore descriptions for these are omitted.

According to this embodiment, a bistable circuit is provided with a thin-film transistor M10, in addition to the components of the third embodiment illustrated in FIG. 22. For the thin-film transistor M10, a gate terminal is connected to the input terminal 42, a drain terminal is connected to the output terminal 48, and a source terminal is connected to the input terminal for the DC power supply potential VSS. The thin-film transistor M10 functions so as to change the potential of the state signal Q to the VSS potential when the reset signal R is at a high level. The thin-film transistor M10 realizes a second first-output-node turnoff switching element. It should be noted that, it is possible to employ a configuration in which the thin-film transistor M10 is provided in addition to the components of the first embodiment illustrated in FIG. 1.

4.2 Effects

Figure 24:
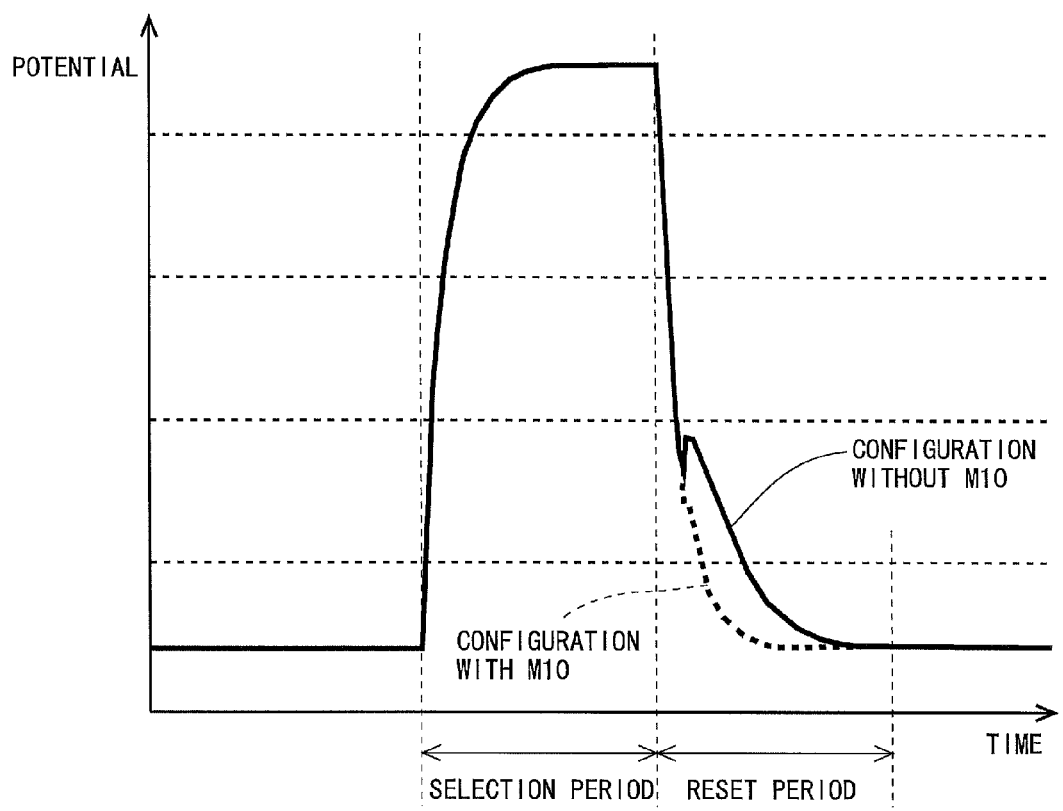
FIG. 24 is a diagram showing a simulation outcome regarding changes of a potential of a state signal in the fourth embodiment.

According to the first to third embodiments, during the reset period, the potential of the second-node N2 changes from a low level to a high level by the reset signal R changing from a low level to a high level and the thin-film transistor M7 being turned to the ON state. Then, the potential of the state signal Q decreases by the potential of the second-node N2 changing from a low level to a high level and the thin-film transistor M6 being turned to the ON state. By contrast, according to this embodiment, the thin-film transistor M10 is turned to the ON state by the reset signal R changing from a low level to a high level. Accordingly, the potential of the state signal Q decreases directly by the reset signal R changing from a low level to a high level. In addition, in this embodiment, during the reset period, the two thin-film transistors M6 and M10 function so as to decrease the potential of the state signal Q. Accordingly, it is possible to quickly decrease the potential of the state signal Q down to a low level during the reset period even when a load capacitance of the gate bus lines is large. FIG. 24 is a diagram showing a simulation outcome regarding changes of the potential of the state signal Q. As illustrated in FIG. 24, according to the configuration having the thin-film transistor M10, the potential of the state signal Q quickly decreases during the reset period, as compared to a configuration without the thin-film transistor M10. As described above, according to this embodiment, even when the load capacitance of the gate bus lines is large, the potential of the state signal Q quickly decreases during the reset period and an output of an abnormal pulse from the output terminal 48 is suppressed.

4.3 Modified Example

Figure 25:
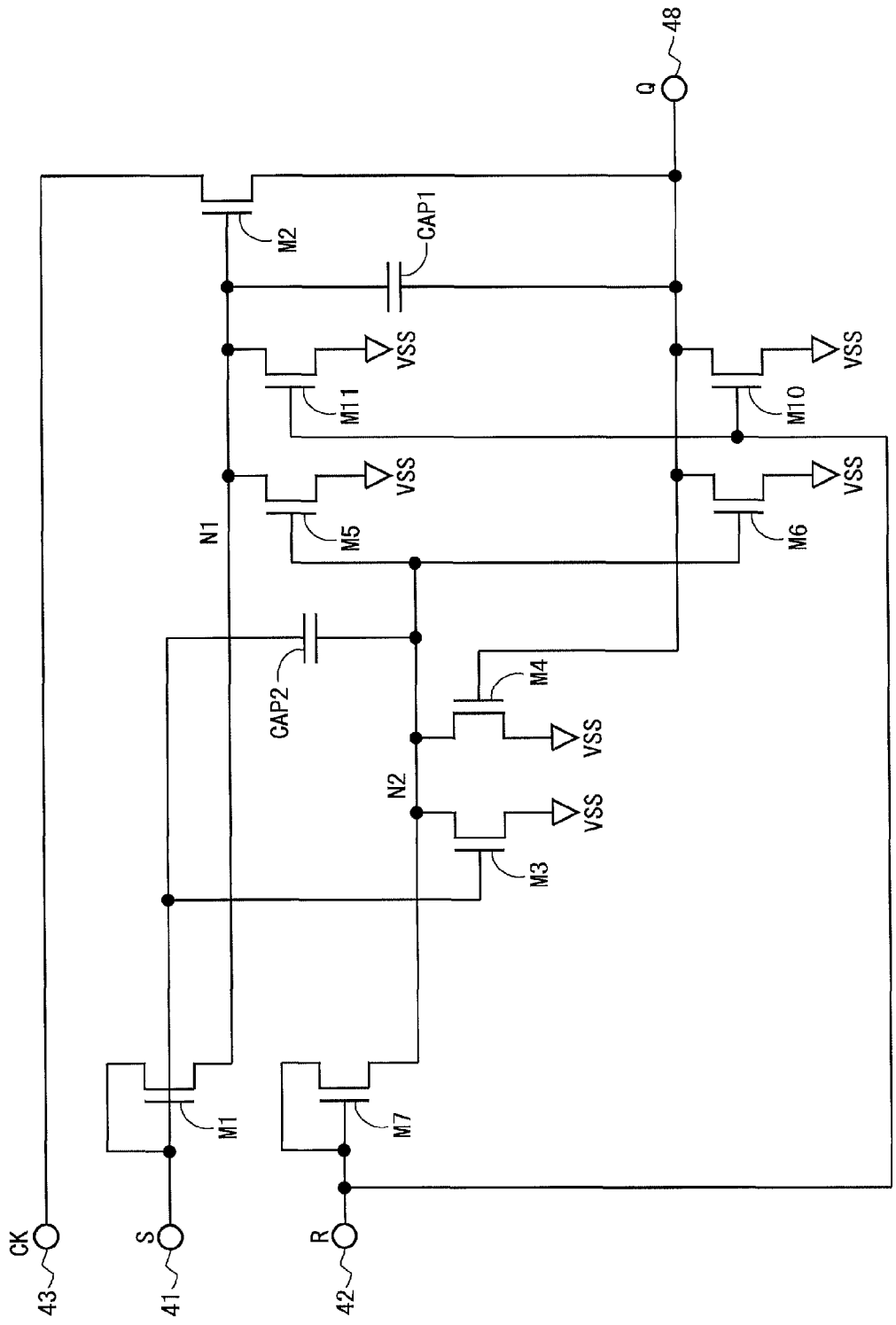
FIG. 25 is a circuit diagram showing a configuration of a bistable circuit according to a modified example of the fourth embodiment.

FIG. 25 is a circuit diagram showing a configuration of a bistable circuit according to a modified example of the fourth embodiment. In this modified example, the bistable circuit is provided with a thin-film transistor M11, in addition to the components illustrated in FIG. 23. For the thin-film transistor M11, a gate terminal is connected to the input terminal 42, a drain terminal is connected to the first-node N1, and a source terminal is connected to the input terminal for the DC power supply potential VSS. The thin-film transistor M11 functions so as to change the potential of the first-node N1 to the VSS potential when the reset signal R is at a high level. The thin-film transistor M11 realizes a second first-node turnoff switching element.

According to the first to third embodiments, during the reset period, the potential of the second-node N2 changes from a low level to a high level by the reset signal R changing from a low level to a high level and the thin-film transistor M7 being turned to the ON state. Then, the potential of the first-node N1 decreases down to a low level by the potential of the second-node N2 changing from a low level to a high level and the thin-film transistor M5 being turned to the ON state. By contrast, according to this modified example, the thin-film transistor M11 is turned to the ON state by the reset signal R changing from a low level to a high level. Accordingly, the potential of the first-node N1 decreases to the VSS potential directly by the reset signal R changing from a low level to a high level. In addition, in this modified example, the two thin-film transistors M5 and M11 function so as to decrease the potential of the first-node N1 during the reset period. Accordingly, it is possible to reliably decrease the potential of the first-node N1 down to a low level during the reset period even in a case in which the circuit is operated at high speed. With this, the stability of the circuit operation when the load capacitance of the gate bus lines is large is improved.

5. Fifth Embodiment

5.1 Configuration of Bistable Circuit

Figure 26:
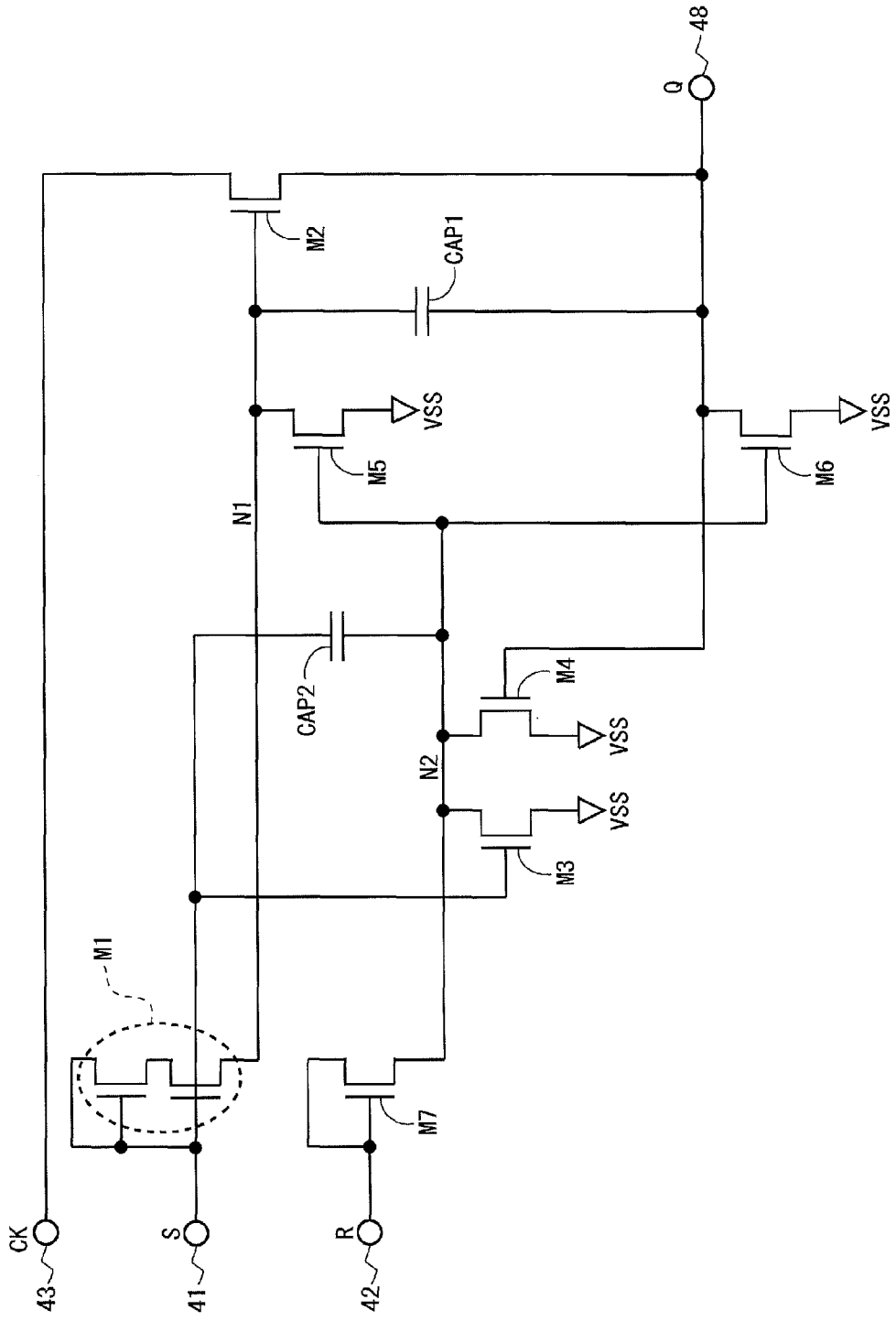
FIG. 26 is a circuit diagram showing a configuration of a bistable circuit according to a fifth embodiment of the present invention.

FIG. 26 is a circuit diagram showing a configuration of a bistable circuit according to a fifth embodiment of the present invention. Here, an overall configuration and an operation of a liquid crystal display device and a configuration and an operation of a gate driver are the same as those in the first embodiment, and therefore descriptions for these are omitted.

According to the first to fourth embodiments, the first-node N1 is precharged based on change of the set signal S from a low level to a high level during the set period. Here, when a high level potential is the VDD potential and a low level potential is the VSS potential for the first clock CK, a potential Vn of the first-node N1 immediately before the set period ends theoretically becomes a value expressed by an equation (3) listed below. Here, Vth is a threshold voltage of the thin-film transistor M1.

$$Vn = VDD - Vth \quad (3)$$

In the selection period, the first clock CK changes from a low level to a high level. Because there is the parasitic capacitance between the gate and the drain of the thin-film transistor M2 as described above, the potential of the first-node N1 increases as the potential of the input terminal 43 increases. Then, the potential Vn of the first-node N1 immediately before the selection period ends theoretically becomes a value expressed by an equation (4) listed below.

$$Vn = 2 \times VDD - Vth \quad (4)$$

In the meantime, when employing a thin-film transistor using a material having high mobility such as microcrystalline silicon (μc-Si) or oxide semiconductor (e.g., IGZO) for its semiconductor layer, it is possible to sufficiently drive the gate bus lines without increasing the potential of the first-node N1 up to a level as shown by the equation (4). In this regard, an increase of the potential of the first-node N1 based on the parasitic capacitance between the gate and the drain of the thin-film transistor M2 is inevitable. Therefore, in this embodiment, as illustrated in FIG. 26, the configuration is such that the thin-film transistor M1 for increasing the potential of the first-node N1 based on the set signal S is multigated. According to this configuration, when the first-node N1 is precharged during the set period, the potential Vn of the first-node N1 theoretically becomes a value expressed by an equation (5) listed below. Here, n is the number of the gate electrodes of the thin-film transistor M1.

$$Vn = VDD - n*Vth \quad (5)$$

5.2 Effects

As can be seen from the equation (3) and the equation (5), according to this embodiment, the potential of the first-node N1 immediately after the precharge in the set period decreases as compared to the first to fourth embodiments. Accordingly, comparing this embodiment with the first to fourth embodiments, the potential of the first-node N1 immediately before the selection period ends is lower in this embodiment than in the first to fourth embodiments. With this, a voltage supplied to the gate terminal of the thin-film transistor M2 decreases, and breakdown of the gate insulating film in the thin-film transistor M2 is suppressed. In particular, for a thin-film transistor using oxide semiconductor (e.g., IGZO) for the semiconductor layer, as its pressure resistance is relatively low, it is possible to effectively suppress breakdown of the gate insulating film in the thin-film transistor M2 by employing the configuration according to this embodiment.

Figure 27:
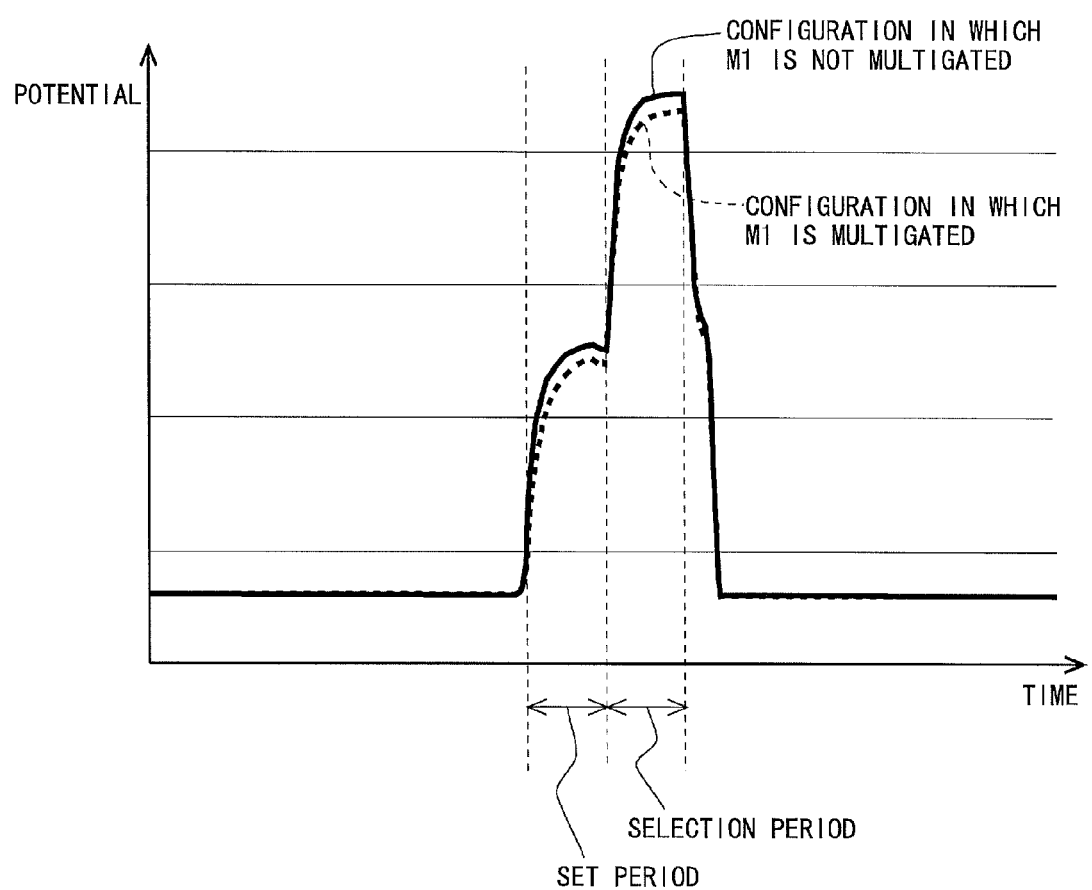
FIG. 27 is a diagram showing a simulation outcome regarding changes of a potential of a first-node in the fifth embodiment.

FIG. 27 is a diagram showing a simulation outcome regarding changes of the potential of the first-node N1. As illustrated in FIG. 27, according to the configuration in which the thin-film transistor M1 is multigated, an increase of the potential of the first-node N1 during the set period is smaller as compared to a configuration in which the thin-film transistor M1 is not multigated. As a result, the potential of the first-node N1 immediately before the selection period ends is lower in the configuration in which the thin-film transistor M1 is multigated than in the configuration in which the thin-film transistor M1 is not multigated.

As described above, according to this embodiment, even when employing a thin-film transistor using a material having a relatively small pressure resistance such as oxide semiconductor (e.g., IGZO) for its semiconductor layer, breakdown of the gate insulating film of the thin-film transistor is suppressed, and therefore it is possible to improve the stability of the circuit operation.

5.3 Modified Example

Figure 28:
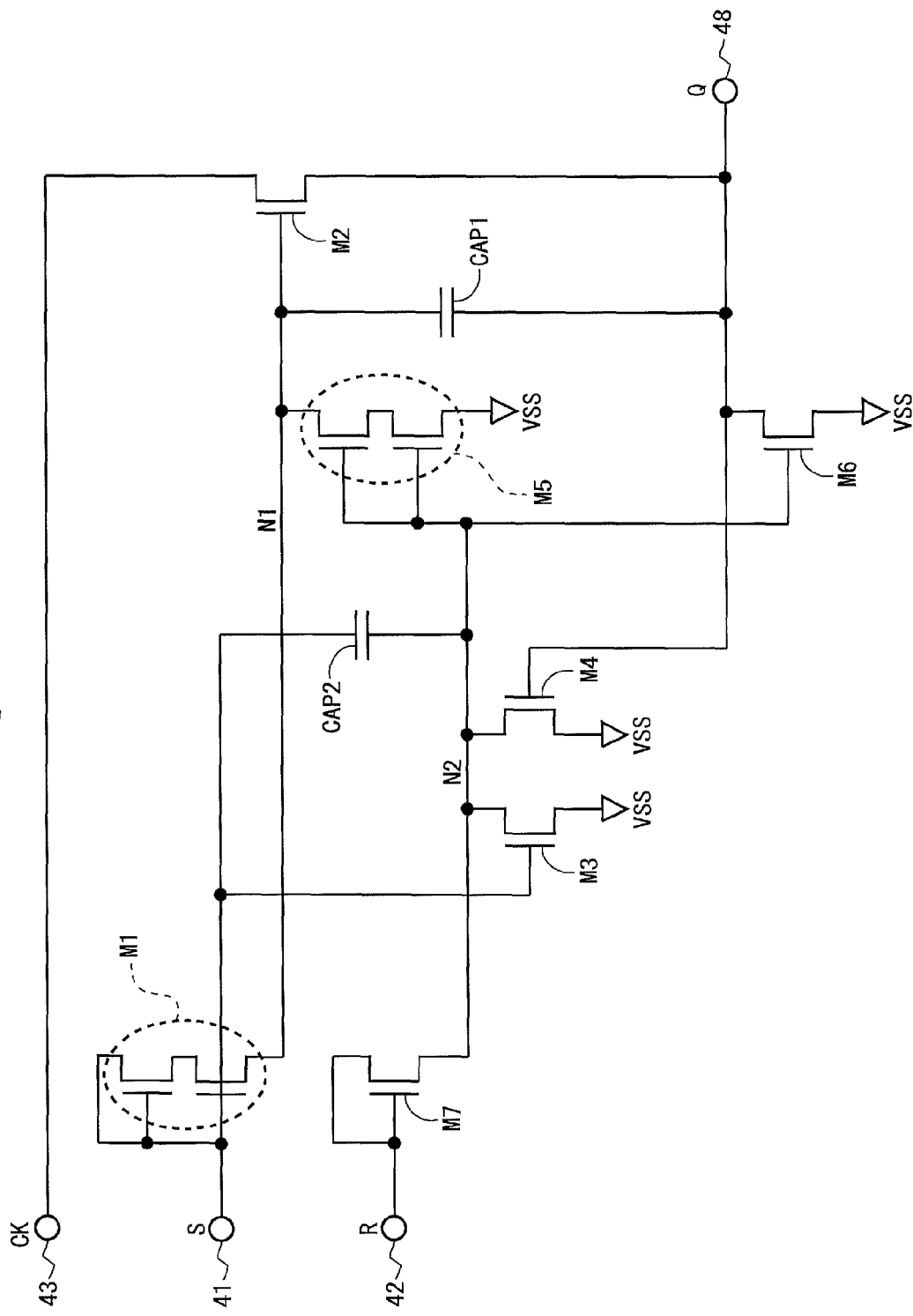
FIG. 28 is a circuit diagram showing a configuration of a bistable circuit according to a modified example of the fifth embodiment.

FIG. 28 is a circuit diagram showing a configuration of a bistable circuit according to a modified example of the fifth embodiment. In this modified example, the thin-film transistor M5 is multigated in addition to the thin-film transistor M1.

According to the first to fourth embodiments, when a thin-film transistor having a large leak current when a high voltage is applied between the drain and the source (a leak current when the voltage between the gate and the source is 0 V) is employed, there is a concern that the potential of the first-node N1 possibly decreases during the selection period. Reasons of this are described below. As can be seen from FIG. 1 and FIG. 6, in the selection period, the voltages between the drains and the sources of the thin-film transistors M1 and M5 increase. Further, in the selection period, the potential of the set signal S and the potential of the second-node N2 are at a low level. Accordingly, during the selection period, current leakages occur in the thin-film transistors M1 and M5, and the potential of the first-node N1 decreases. When the potential of the first-node N1 decreases in the selection period in this manner, there is a possibility that the potential of the state signal Q may not increase up to the high level potential of the first clock CK. Additionally, the potential of the state signal Q decreases by an electric charge flowing from a side of the output terminal 48 to a side of the input terminal 43 via the thin-film transistor M2 in the reset period, and time required for decreasing the potential of the state signal Q down to a low level becomes longer when the potential of the first-node N1 connected to the gate terminal of the thin-film transistor M2 is low. Thus, in this modified example, as illustrated in FIG. 28, the configuration is such that the thin-film transistors M1 and M5 whose drain terminal or the source terminal is connected to the first-node N1 are multigated.

According to this modified example, OFF currents of the thin-film transistors M1 and M5 are relatively small. Accordingly, even when employing a thin-film transistor using, for example, microcrystalline silicon (μc-Si) for its semiconductor layer, that is, a thin-film transistor having a large leak current, it is possible to sufficiently increase the potential of the state signal Q during the selection period, as well as to quickly decrease the potential of the state signal Q during the reset period.

Figure 29:
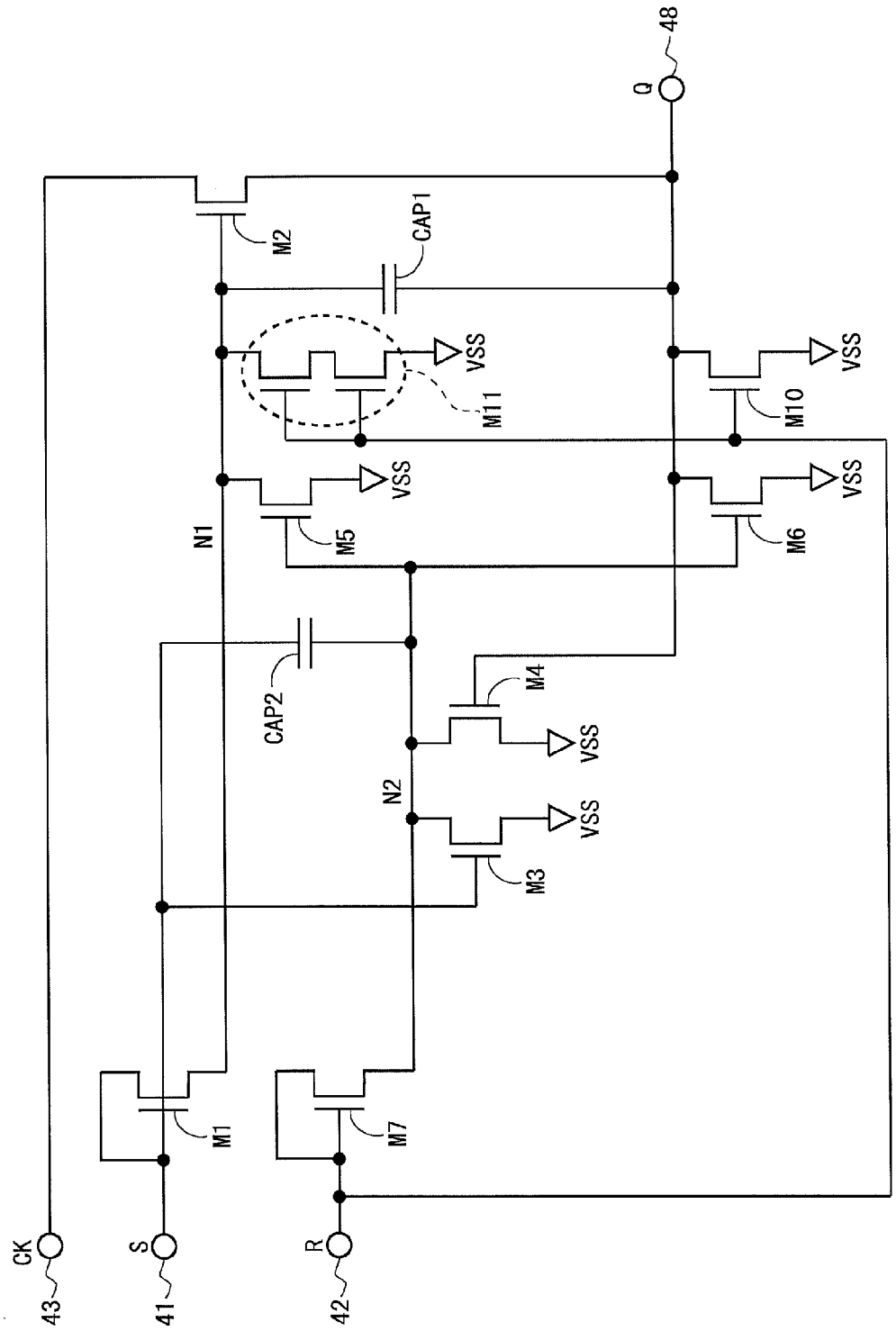
FIG. 29 is a circuit diagram when thin-film transistor M11 is multigated in the configuration shown in FIG. 25 as for the modified example of the fifth embodiment.

Alternatively, in light of the same purport as above, in the configuration according to modified example of the fourth embodiment (see FIG. 25), the configuration may be such that the thin-film transistor M11 is multigated as illustrated in FIG. 29.

6. Sixth Embodiment

6.1 Configuration of Bistable Circuit

Figure 30:
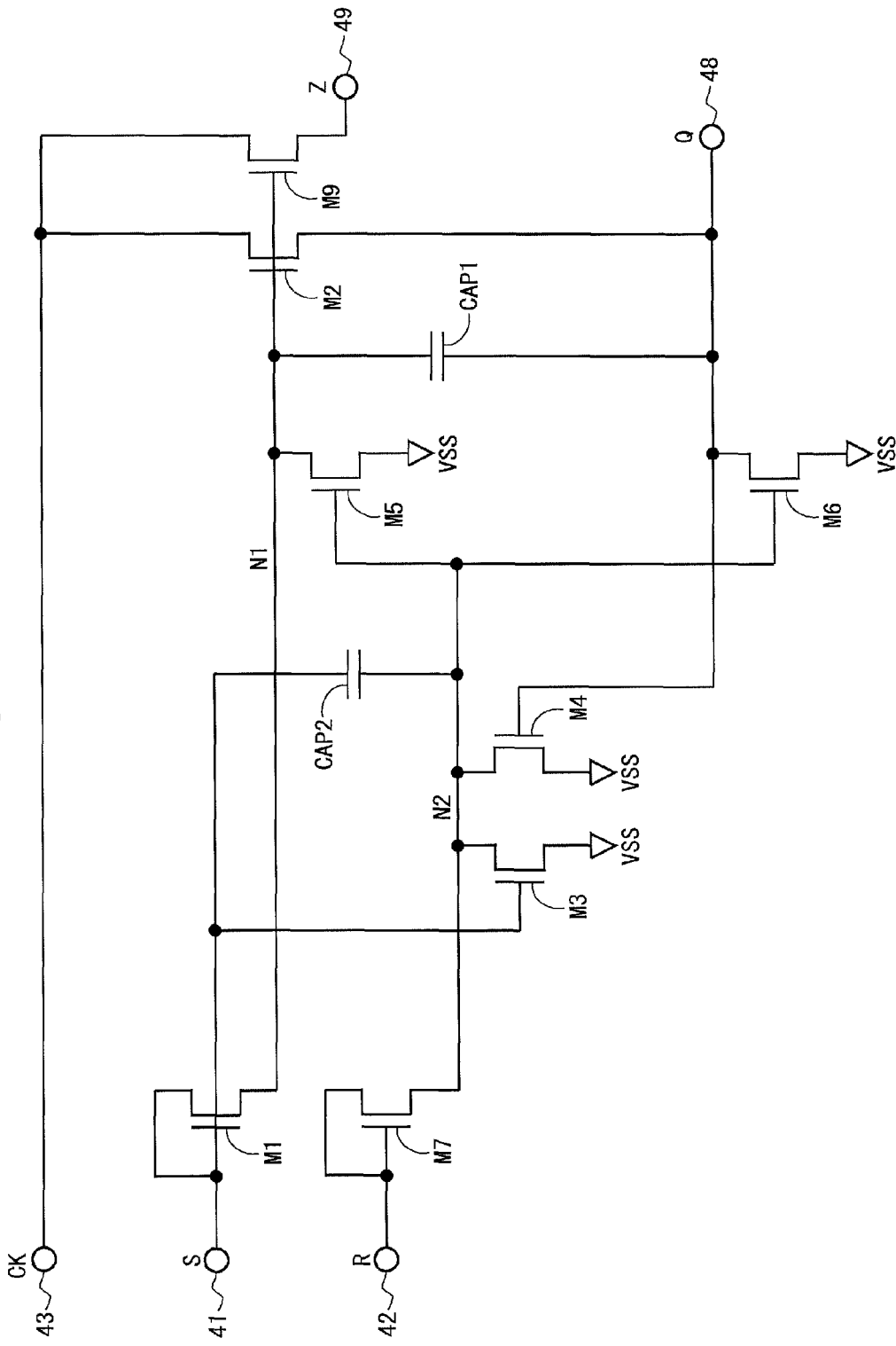
FIG. 30 is a circuit diagram showing a configuration of a bistable circuit according to a sixth embodiment of the present invention.
Figure 31:
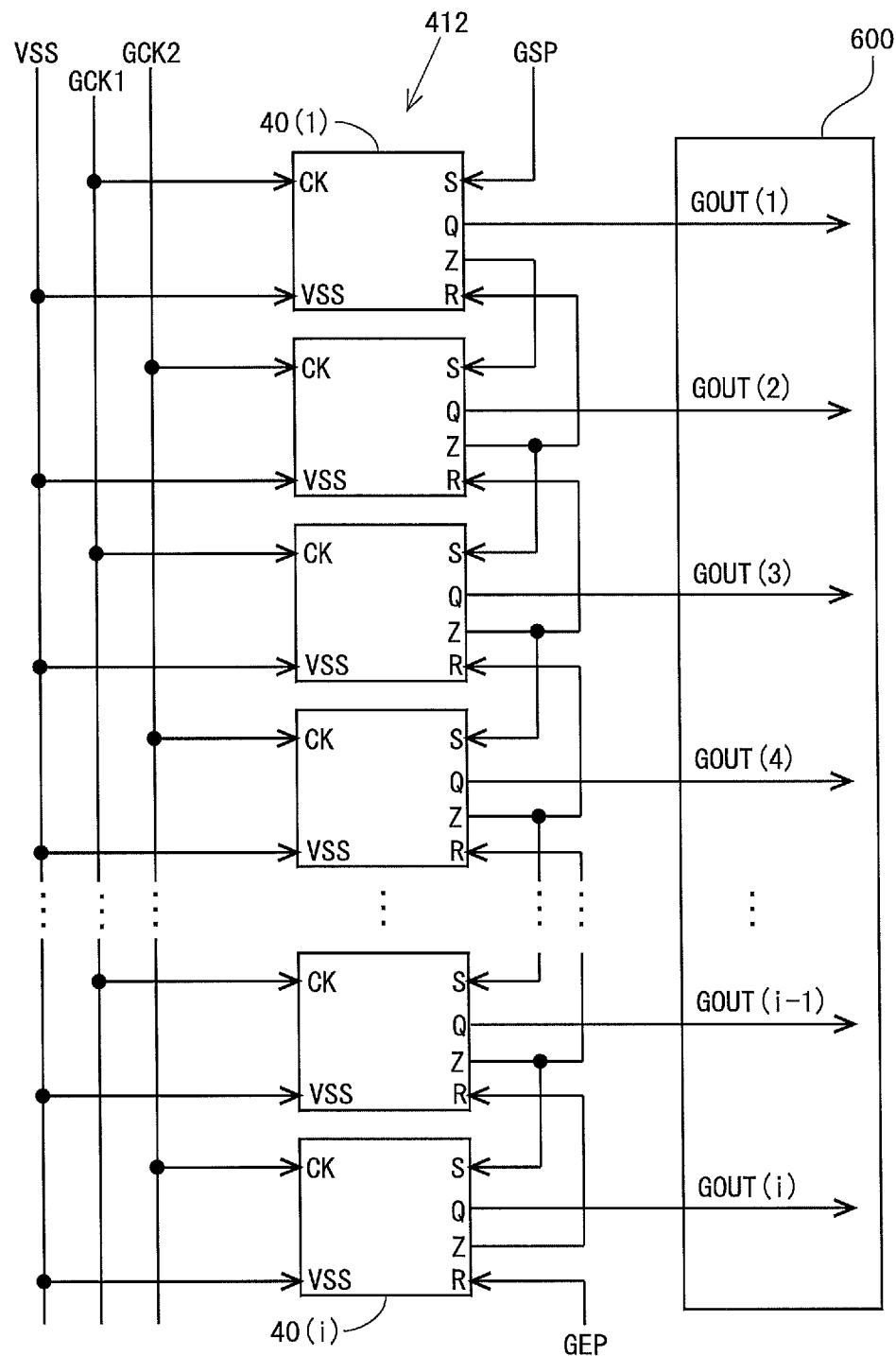
FIG. 31 is a block diagram showing a configuration of a shift register within a gate driver in the sixth embodiment.

FIG. 30 is a circuit diagram showing a configuration of a bistable circuit according to a sixth embodiment of the present invention. According to this embodiment, the bistable circuit is provided with a thin-film transistor M9 and an output terminal 49, in addition to the components of the third embodiment illustrated in FIG. 22. The thin-film transistor M9 realizes a second output control switching element, and the output terminal 49 realizes a second-output-node. A signal outputted from the output terminal 49 of each bistable circuit is supplied, as a signal (hereinafter referred to as a "different stage control signal") Z for controlling an operation of the bistable circuit of a stage different from the each bistable circuit, to the bistable circuit of the different stage. Further, according to this embodiment, a shift register 412 is configured as illustrated in FIG. 31. Specifically, the different stage control signal Z outputted from the output terminal 49 of each stage of the shift register 412 is supplied to a previous stage as the reset signal R, and is supplied to a next stage as the set signal S. The state signal Q outputted from the output terminal 48 of each stage of the shift register 412 is used only for driving a gate bus line connected to this output terminal 48. It should be noted that the configuration may be such that the thin-film transistor M9 and the output terminal 49 are provided in addition to the components of the first embodiment illustrated in FIG. 1.

6.2 Effects

According to this embodiment, for each stage of the shift register 412, the signal for driving a gate bus line corresponding to the each stage and the signal for controlling operations of a previous stage and a next stage of the each stage are different. Accordingly, it is possible to make waveform bluntness of the set signal S and the reset signal R small for each bistable circuit. With this, even when a load capacitance of the gate bus line is large, the operation based on the set signal S and the operation based on the reset signal R are quickly performed in each bistable circuit, and the stability of the circuit operation is improved.

6.3 Modified Example

6.3.1 First Modified Example

Figure 32:
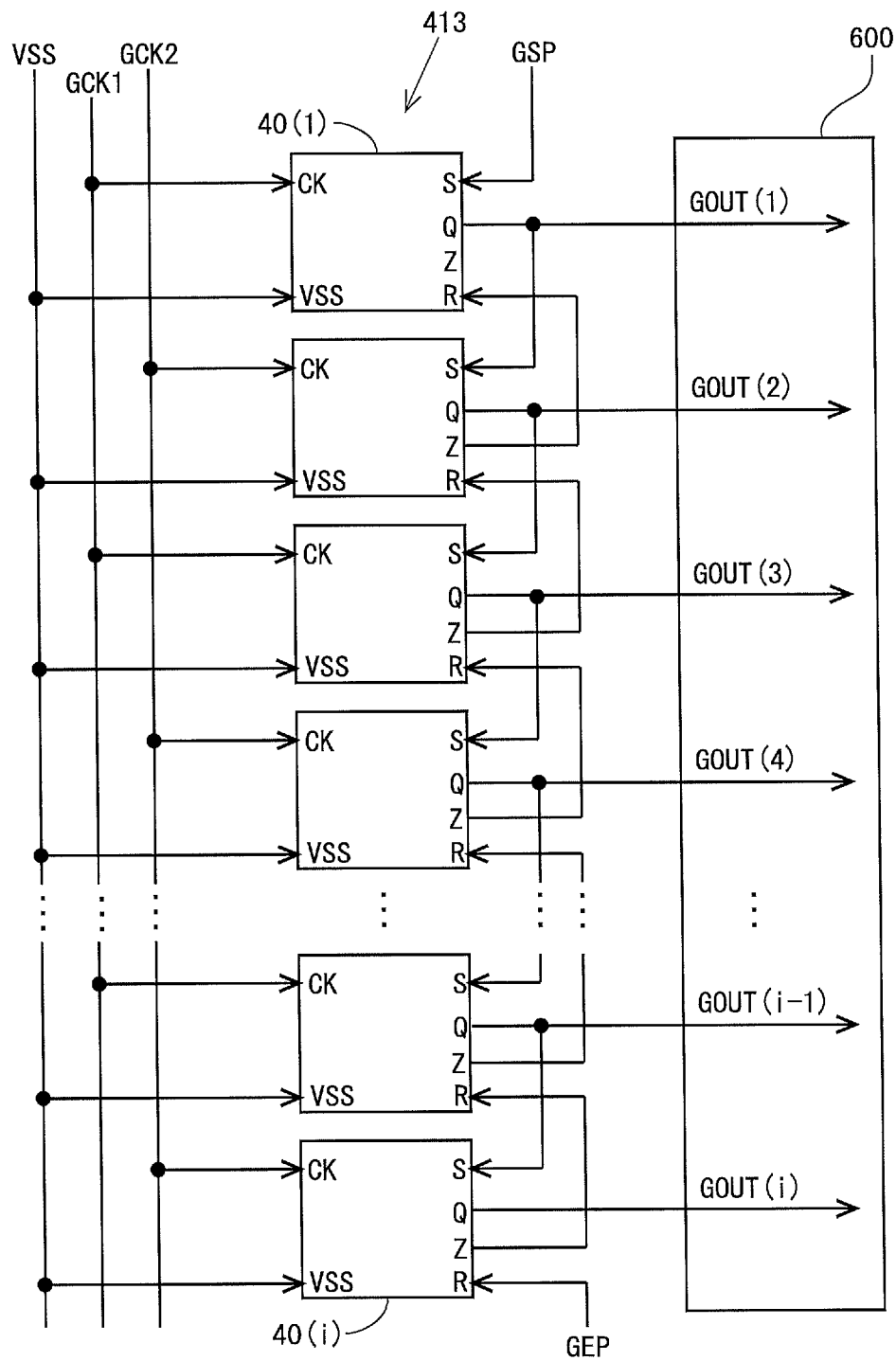
FIG. 32 is a block diagram showing a configuration of a shift register within a gate driver in a first modified example of the sixth embodiment.

FIG. 32 is a block diagram showing a configuration of a shift register 413 within the gate driver 400 according to a first modified example of the sixth embodiment. Unlike the sixth embodiment, in this modified example, the different stage control signal Z outputted from the bistable circuit is not supplied to the next stage as the set signal S. Specifically, in this modified example, the different stage control signal Z outputted from the bistable circuit is used only as the reset signal R. Accordingly, the state signal Q outputted from the bistable circuit is used as the set signal S for controlling the operation of the next stage, in addition to as the signal for driving the gate bus line.

As can be seen from FIG. 6, regarding the set period, it is sufficient that the potential of the first-node N1 increases up to a sufficient level until a time point at which the set period ends. Further, regarding the reset period, the potential of the state signal Q should quickly decrease down to a low level after the reset period starts. Considering these points, in terms of the circuit operation, the waveform bluntness occurring in the reset signal R is considered more unfavorable than the waveform bluntness occurring in the set signal S. Therefore, by employing the configuration in which the different stage control signal Z is used only as the reset signal R as in this modified example, a load applied to the output terminal 49 is reduced as compared to the sixth embodiment, and a rise time of the reset signal R for each stage in the shift register 413 is reduced. With this, the potential of the state signal Q quickly decreases down to a low level after the selection period ends, and the reliability of the circuit operation is improved.

6.3.2 Second Modified Example

Figure 33:
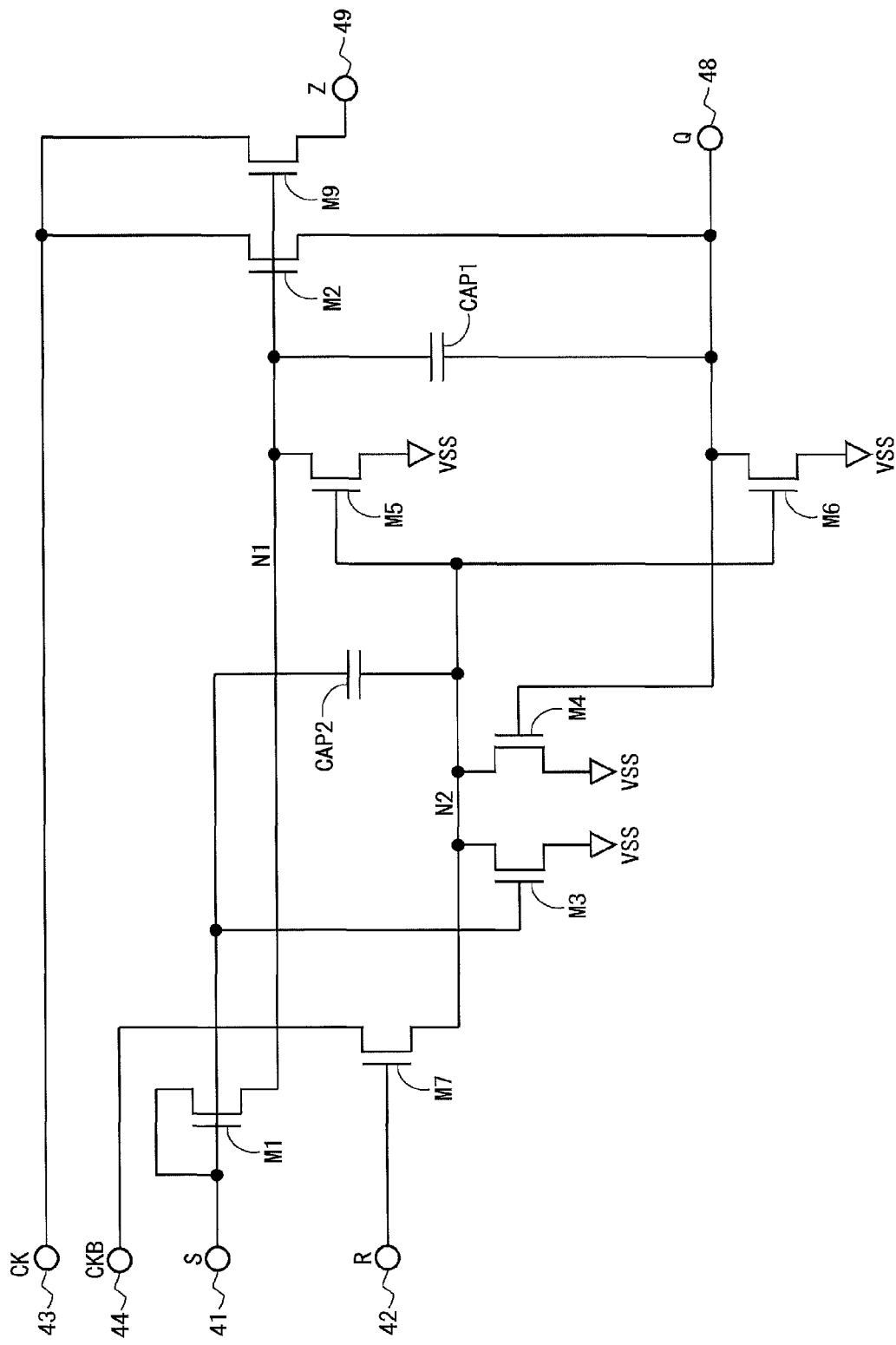
FIG. 33 is a circuit diagram showing a configuration of a bistable circuit according to a second modified example of the sixth embodiment.
Figure 34:
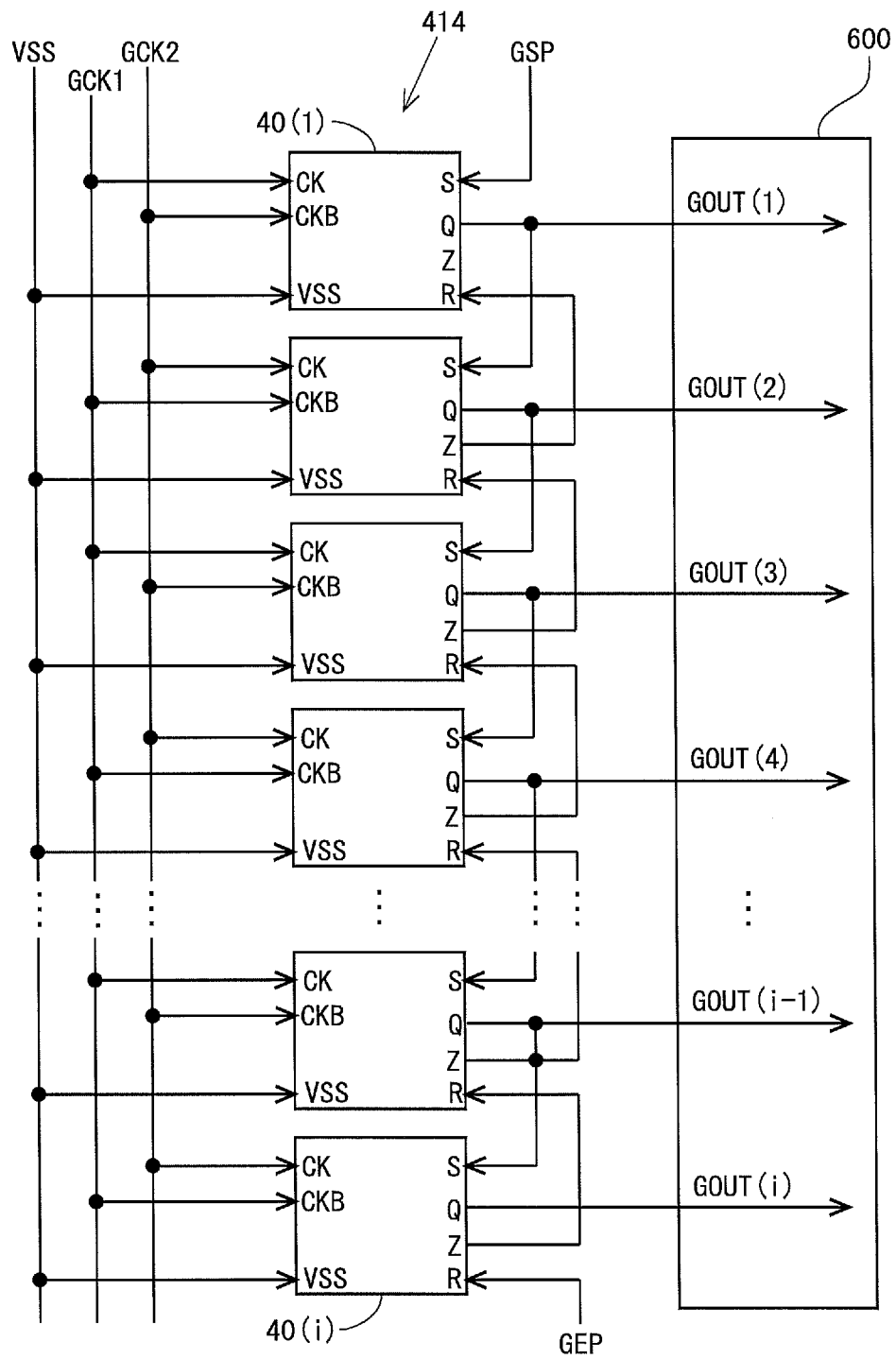
FIG. 34 is a block diagram showing a configuration of a shift register within a gate driver in the second modified example of the sixth embodiment.

FIG. 33 is a circuit diagram showing a configuration of a bistable circuit according to a second modified example of the sixth embodiment. In this modified example, the drain terminal of the thin-film transistor M7 is connected to the input terminal 44 for receiving the second clock CKB. When this configuration is employed, a shift register 414 is configured as illustrated in FIG. 34 so that the first clock CK and the second clock CKB that are alternately turned to a high level every other single horizontal scanning period as illustrated in FIG. 11 are supplied to the bistable circuit.

In this modified example, as the drain terminal of the thin-film transistor M7 is supplied with the second clock CKB, the power supply voltage becomes an electric charge supply source of the second-node N2. Further, a load applied to the input terminal 42 is reduced. Accordingly, as compared to the sixth embodiment, a flow of an electric charge from the input terminal 42 to the second-node N2 is prevented, and the potential of the input terminal 42 quickly increases.

According to the third modified example of the first embodiment (see FIG. 14), while rise timing of the reset signal R and rise timing of the second clock CKB are substantially the same, it takes longer until the reset signal R fully rises than the second clock CKB. This also applies when these signals fall. This is because the state signal Q outputted from the bistable circuit is not only used as the reset signal R of the previous stage but also as the scanning signal for driving the gate bus line and the set signal S of the next stage, and thus the load applied to the gate bus line becomes large. Therefore, the reset signal R is more susceptible to waveform bluntness than the second clock CKB. Accordingly, during a period after time t3 in FIG. 11, the potential of the gate terminal of the thin-film transistor M7 sometimes becomes higher than the VSS potential, after the potential of the drain terminal of the thin-film transistor M7 decreases down to the VSS potential. As a result, there is a concern that the potential of the second-node N2 decreases during the period after time t3. By contrast, according to this modified example, the signal used as the reset signal R and the signal used as the scanning signal and the set signal S are different. Specifically, the different stage control signal Z outputted from the output terminal 49 of each stage of the shift register 414 is used as the reset signal R for the previous stage of the each stage, and the state signal Q outputted from the output terminal 48 of each stage of the shift register 414 is used as the scanning signal for driving the gate bus line corresponding to the each stage and the set signal S for the next stage of the each stage. With this, the signal outputted from the output terminal 49 having a relatively small load (the different stage control signal Z) becomes the reset signal R, and therefore the waveform bluntness of the reset signal R is suppressed. Thus, a decrease of the potential of the second-node N2 in the period after the reset period ends is suppressed.

6.3.3 Third Modified Example

Figure 35:
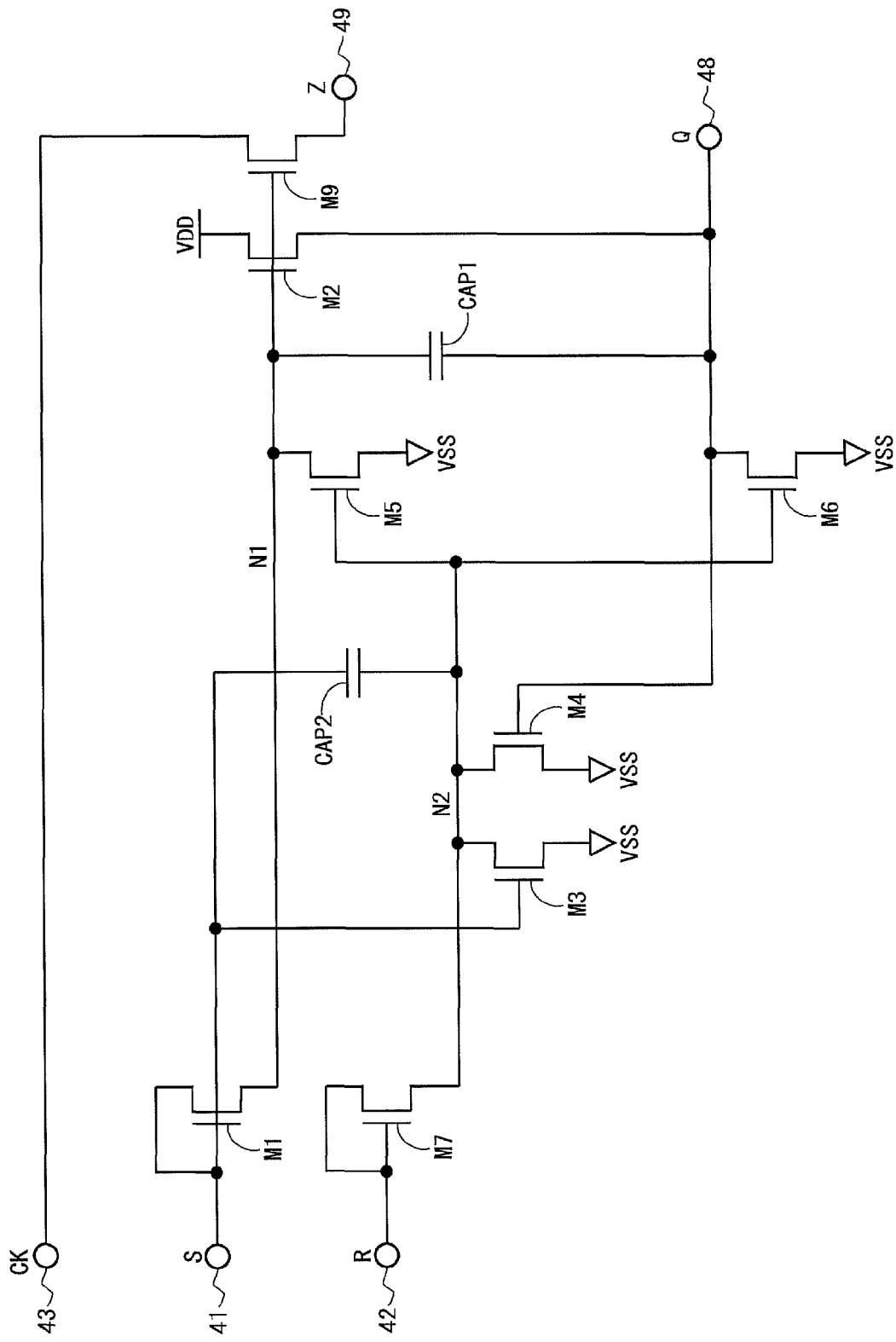
FIG. 35 is a circuit diagram showing a configuration of a bistable circuit according to a third modified example of the sixth embodiment.
Figure 36:
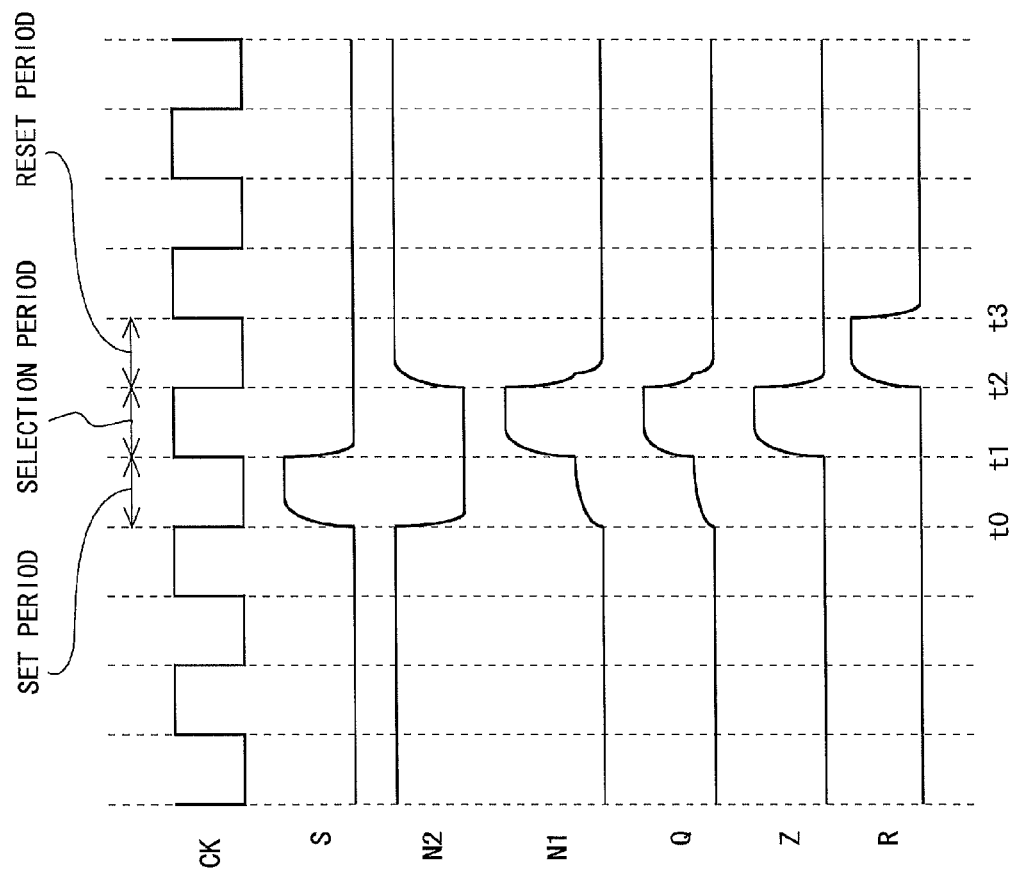
FIG. 36 is a signal waveform diagram for illustration of an operation of the bistable circuit in the third modified example of the sixth embodiment.

FIG. 35 is a circuit diagram showing a configuration of a bistable circuit according to a third modified example of the sixth embodiment. In this modified example, the drain terminal of the thin-film transistor M2 is connected to the input terminal for the high level DC power supply potential VDD. According to this modified example, the bistable circuit operates during the set period and the selection period as described below (see FIG. 36).

In the set period (when reaching time t0), the set signal S changes from a low level to a high level. With this, the thin-film transistor M1 is turned to the ON state, and the capacitor CAP1 is charged (here, precharged). Accordingly, the potential of the first-node N1 changes from a low level to a high level, the thin-film transistors M2 and M9 are turned to the ON state. As the drain terminal of the thin-film transistor M2 is supplied with the VDD potential, the potential of the state signal Q increases by the thin-film transistor M2 being turned to the ON state. The potential of the different stage control signal Z is maintained at a low level, as the first clock CK is at a low level in the set period. Further, the thin-film transistor M3 is turned to the ON state by the set signal S being driven to a high level, and the potential of the second-node N2 becomes a low level.

In the selection period (when reaching time t1), the set signal S changes from a high level to a low level. With this, similarly to the first embodiment, the first-node N1 is turned to the floating state. Here, at time t1, the first clock CK changes from a low level to a high level. As there is a parasitic capacitance between the gate and the drain of the thin-film transistor M9, the potential of the first-node N1 increases as the potential of the input terminal 43 increases. As a result, the thin-film transistors M2 and M9 are fully turned to the ON state. By the thin-film transistor M2 being fully turned to the ON state, the potential of the state signal Q increases up to the VDD potential. Additionally, by the thin-film transistor M2 being fully turned to the ON state, the potential of the different stage control signal Z increases up to the high level potential of the first clock CK. It should be noted that the potential of the second-node N2 is maintained at a low level similarly to the first embodiment.

According to this modified example, an increase of the potential of the state signal Q starts in the set period. Accordingly, the gate bus line is quickly turned to the selected state in the selection period, and charging time of the pixel capacitance is sufficiently ensured. Further, as the configuration is such that the drain terminal of the thin-film transistor M2 is supplied with the VDD potential instead of the clock signal, a load applied to the wiring for the clock signal is reduced. Accordingly, an occurrence of the waveform bluntness in the clock signal is suppressed, and the power consumption is reduced.

In the meantime, in this modified example, a voltage source for the scanning signal and a voltage source for driving circuits are different systems. Here, it is preferable that relation between a potential VCK on a high level side of the clock signal and a potential VGH on a high level side of the scanning signal (a potential for turning the thin-film transistor whose gate terminal is connected to the gate bus line through which the scanning signal is transmitted to the ON state) satisfy an equation (6) and an equation (7) listed below.

$$VCK \geq VGH/2 \quad (6)$$

$$VCK \leq VGH \quad (7)$$

The reason why it is preferable to satisfy the above equation (6) is as follows. During the selection period, the potential of the scanning signal should increase sufficiently so that the thin-film transistor 60 (see FIG. 2) of each pixel formation portion within a display unit 600 is turned to the ON state. Accordingly, the potential of the first-node N1 should be equal to or higher than above VGH during the selection period. Here, in the selection period, the potential of the first-node N1 ideally becomes two times higher than VCK. Accordingly, when VCK is made lower than a half of VGH, the potential of the first-node N1 does not become equal to or higher than VGH during the selection period. As a result, the potential of the scanning signal for driving each gate bus line does not sufficiently increase in the selection period.

More specifically, it is preferable that an equation (8) listed below be established where a reference potential is 0 V, an increased voltage of the first-node N1 during the selection period is A×VCK, a threshold voltage of the thin-film transistor M1 is V1$th$, and a threshold voltage of the thin-film transistor M2 is V2$th$.

$$(1+A) \times VCK - V1th - V2th \geq VGH \quad (8)$$

The equation (8) can be modified as an equation (9) listed below.

$$VCK \geq (VGH + V1th + V2th)/(1+A) \quad (9)$$

Where the threshold voltages V1$th$ and V2$th$ are 0, and A is 1 in the equation (9), the equation (6) is derived.

Further, the reason why it is preferable to satisfy the equation (7) is as follows. In general, a power consumption W due to electrical signals is proportional to a product of the square of a voltage (amplitude) V, a capacitance C, and a frequency f. Here, as the frequency f is relatively large for the clock signal and the power consumption W is proportional to the square of the voltage V, the power consumption W is reduced to a large extent by decreasing the voltage V of the clock signal, that is the potential VCK on the high level side of the clock signal. Therefore, it is preferable that the equation (7) be established. It should be noted that, according to this modified example, the thin-film transistor M2 having a relatively large parasitic capacitance is not supplied with the clock signal, and therefore the size of the capacitance C that influences a magnitude of the power consumption W due to the clock signal is made smaller even when the equation (7) is not established. Thus, it is possible to obtain an effect of power consumption reduction.

7. Seventh Embodiment

7.1 Configuration of Bistable Circuit

Figure 37:
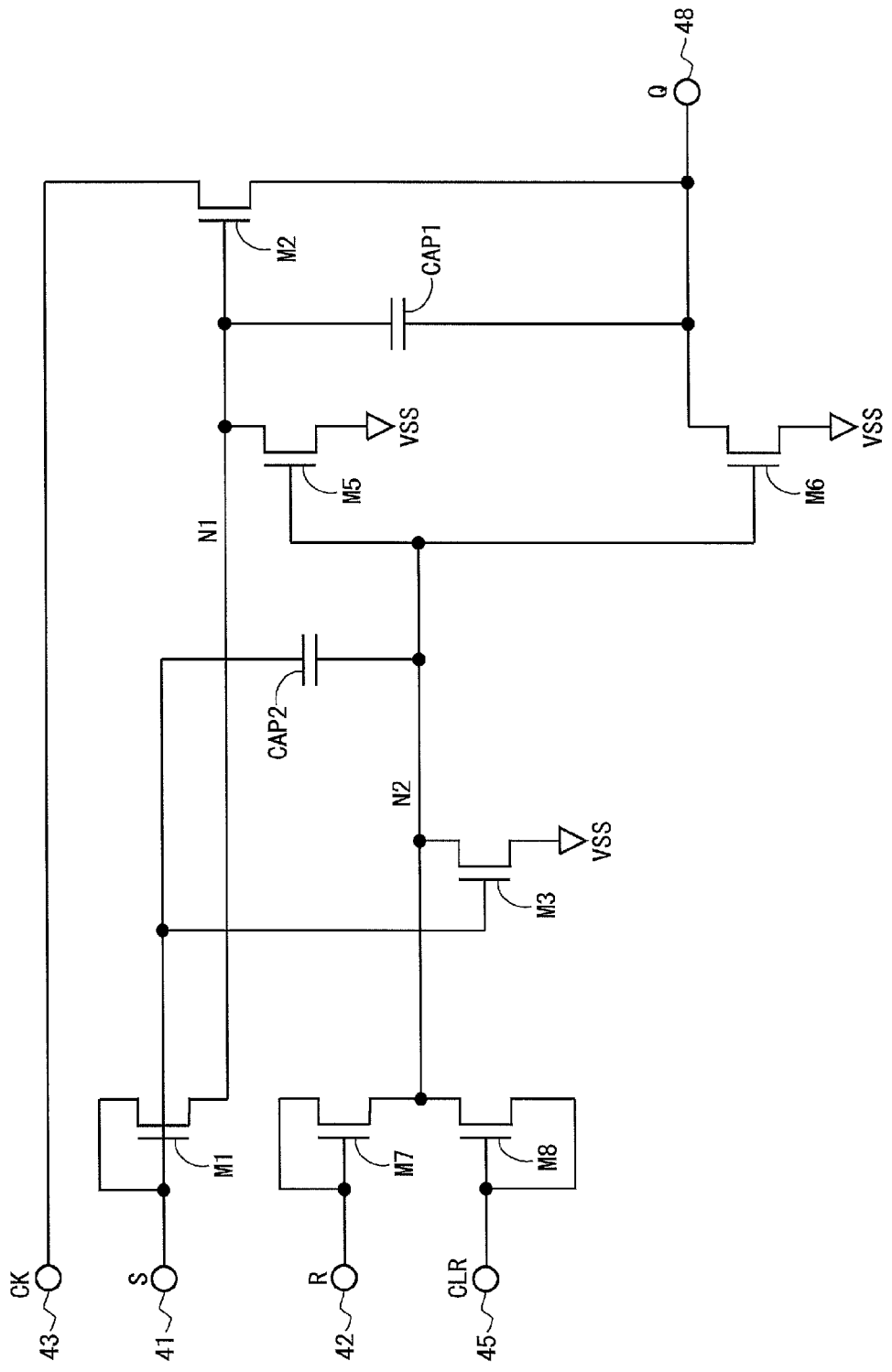
FIG. 37 is a circuit diagram showing a configuration of a bistable circuit according to a seventh embodiment of the present invention.
Figure 38:
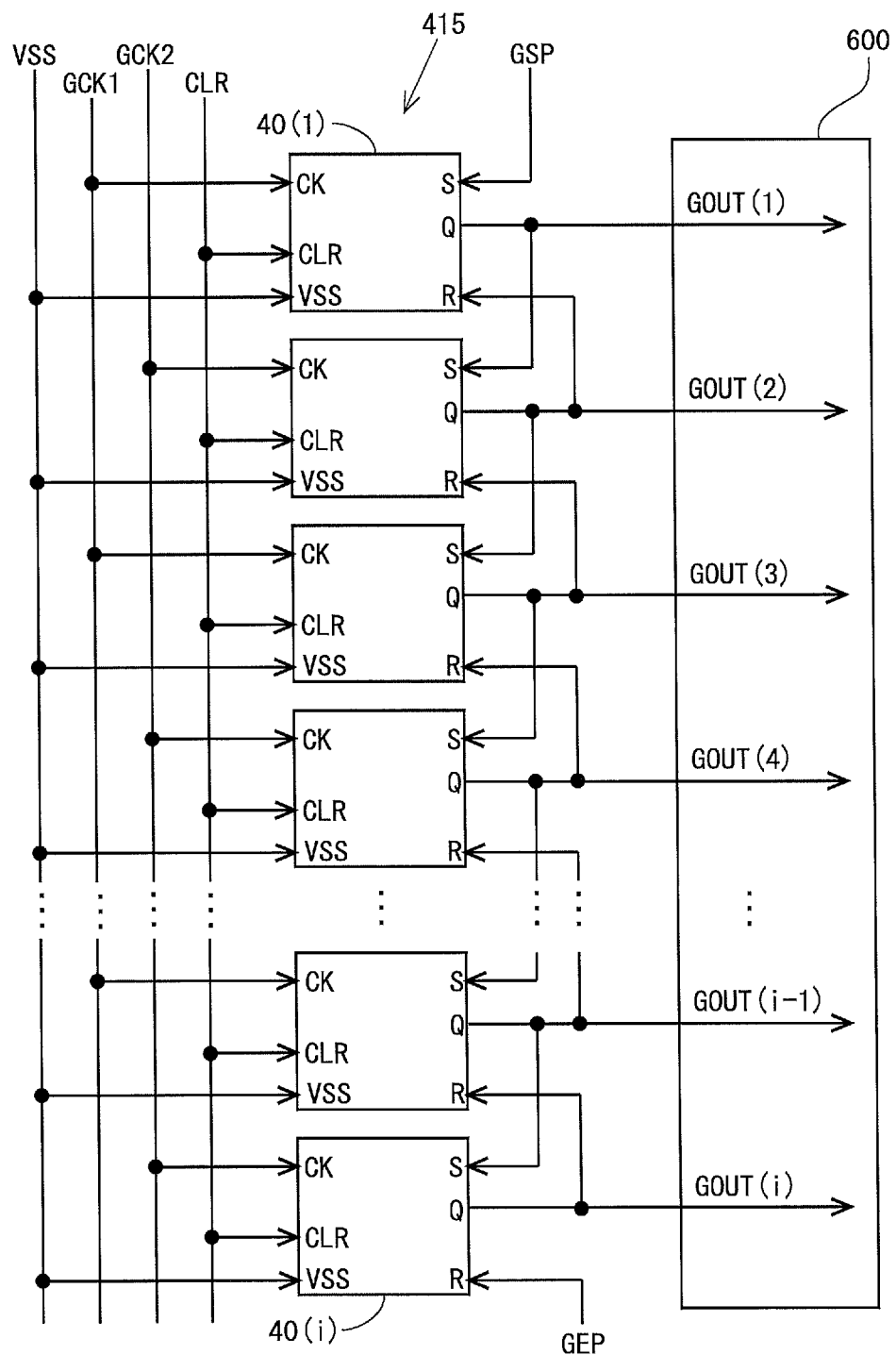
FIG. 38 is a block diagram showing a configuration of a shift register within a gate driver in the seventh embodiment.
Figure 39:
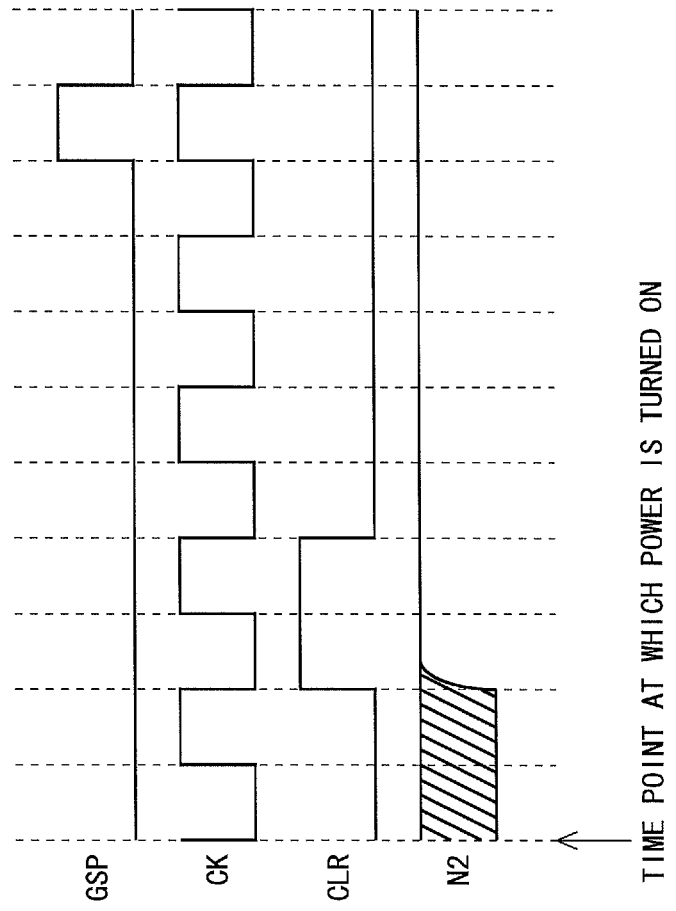
FIG. 39 is a signal waveform diagram for illustration of an operation of the bistable circuit in the seventh embodiment.

FIG. 37 is a circuit diagram showing a configuration of a bistable circuit according to a seventh embodiment of the present invention. According to this embodiment, the bistable circuit is provided with a thin-film transistor M8 in addition to the components of the first embodiment illustrated in FIG. 1. The thin-film transistor M8 realizes a second second-node turnon switching element. For the thin-film transistor M8, a gate terminal and a drain terminal are connected to an input terminal 45 for receiving a clear signal CLR for initializing each bistable circuit, and a source terminal is connected to the second-node N2. Here, the input terminal 45 realizes a third-input-node. The thin-film transistor M8 functions so as to change the potential of the second-node N2 to a high level when the clear signal CLR is at a high level. When this configuration is employed, a shift register 415 is configured as illustrated in FIG. 38 so that each bistable circuit is supplied with the clear signal CLR. It should be noted that as illustrated in FIG. 39, the clear signal CLR is turned to a high level only during a certain period before an initial pulse of the gate start pulse signal GSP occurs, out of period after the power of the device is turned on, and is turned to a low level other than the certain period. Further, while timing at which the clear signal CLR changes synchronizes with timing at which the first clock CK changes in FIG. 39, it is not necessary that these timing synchronize with each other.

In the first to sixth embodiments, the second-node N2 is charged only by the reset signal R. Accordingly, after the power of the device is turned on, in each bistable circuit, the potential of the second-node N2 is indeterminate until the reset signal R is first driven to a high level. For example, when the potential of the second-node N2 after the power of the device is turned on is the VSS potential, the thin-film transistors M5 and M6 are turned to the OFF state during a period in which a first image is displayed. Accordingly, when a noise is generated at the first-node N1 due to the presence of the parasitic capacitance between the gate and the drain of the thin-film transistor M2, the potential of the state signal Q that should be essentially maintained at a low level is not maintained at a low level.

By contrast, according to this embodiment, after the power of the device is turned on and before an operation of the shift register 415 starts, the clear signal CLR becomes a high level. The thin-film transistor M8 is diode-connected as illustrated in FIG. 37, and therefore the thin-film transistor M8 is turned to the ON state by the clear signal CLR driven to a high level, and the potential of the second-node N2 changes to a high level from an indeterminate state. Accordingly, the thin-film transistors M5 and M6 are turned to the ON state before the operation of the shift register 415 starts. With this, the potential of the first-node N1 and the potential of the state signal Q are at a low level for all the bistable circuits at a time point at which the operation of the shift register 415 starts, and thus the stability of the circuit operation is improved.

Figure 40:
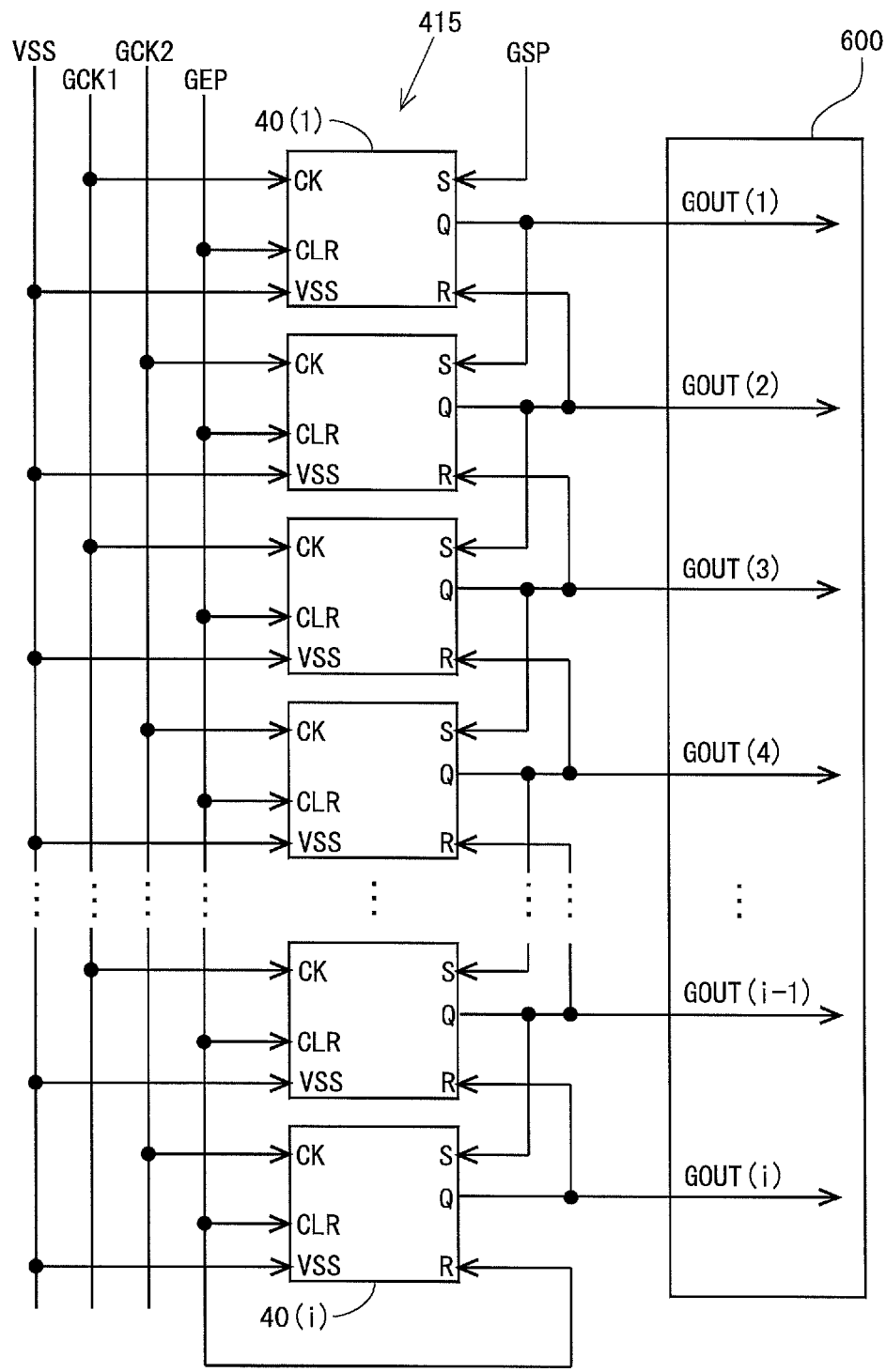
FIG. 40 is a block diagram showing a configuration of the shift register within the gate driver when using a gate end pulse signal as a clear signal in the seventh embodiment.
Figure 41:
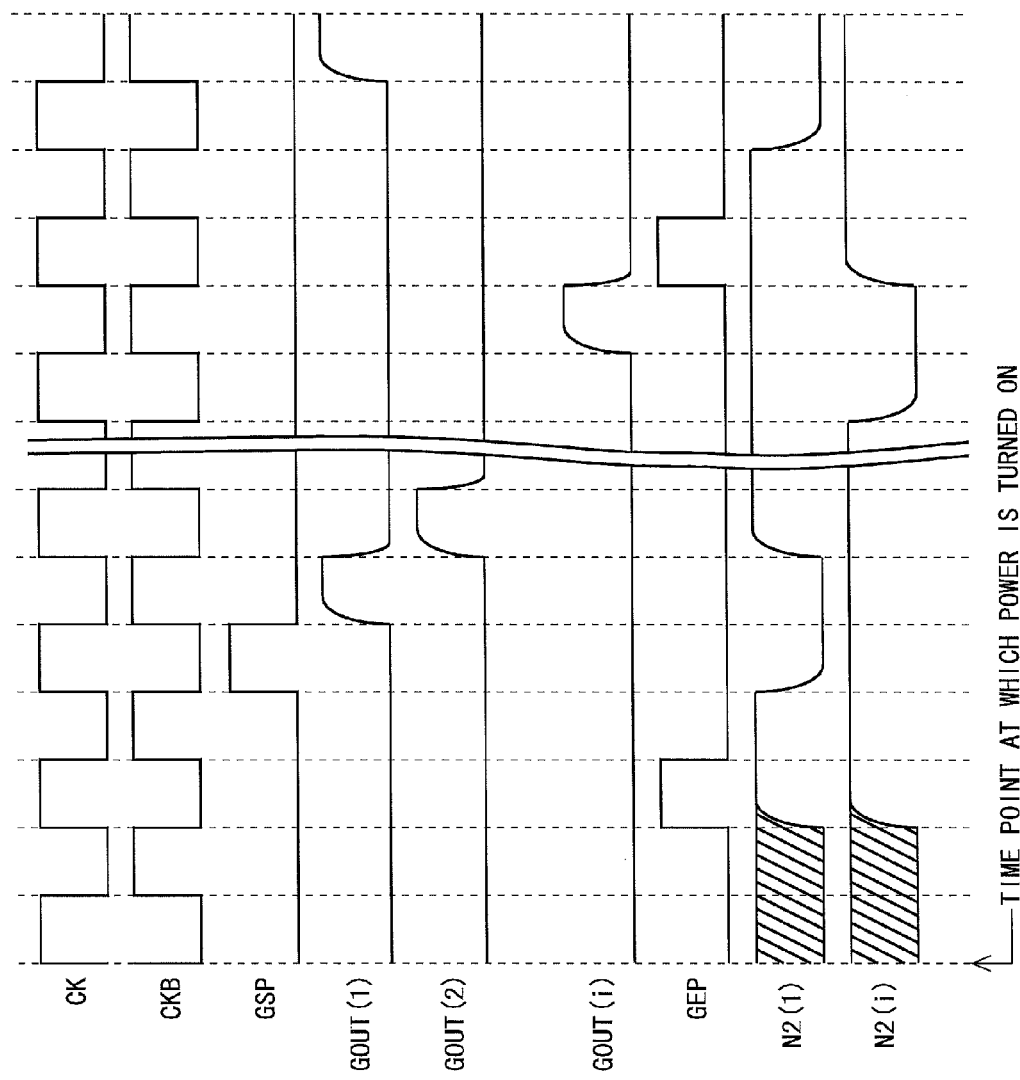
FIG. 41 is a signal waveform diagram for illustration of a preferred driving method when using the gate end pulse signal as a clear signal in the seventh embodiment.

It should be noted that it is preferable that there be a period in which the clear signal CLR is at a high level during a vertical blanking period (a period from a pulse of the gate end pulse signal GEP is generated until a pulse of the gate start pulse signal GSP is generated). With this, the potential of the first-node N1 and the potential of the state signal Q become a low level for all of the bistable circuits every single vertical scanning period, and therefore the stability of the circuit operation is further improved. Further, as illustrated in FIG. 40, the gate end pulse signal GEP may be used as the clear signal CLR. With this, the stability of the circuit operation is further improved while reducing the number of signals. Moreover, when the gate end pulse signal GEP is used as the clear signal CLR, as illustrated in FIG. 41, it is preferable that driving of the shift register start according to an oscillation of the gate end pulse signal GEP.

7.2 Modified Example

7.2.1 First Modified Example

Figure 42:
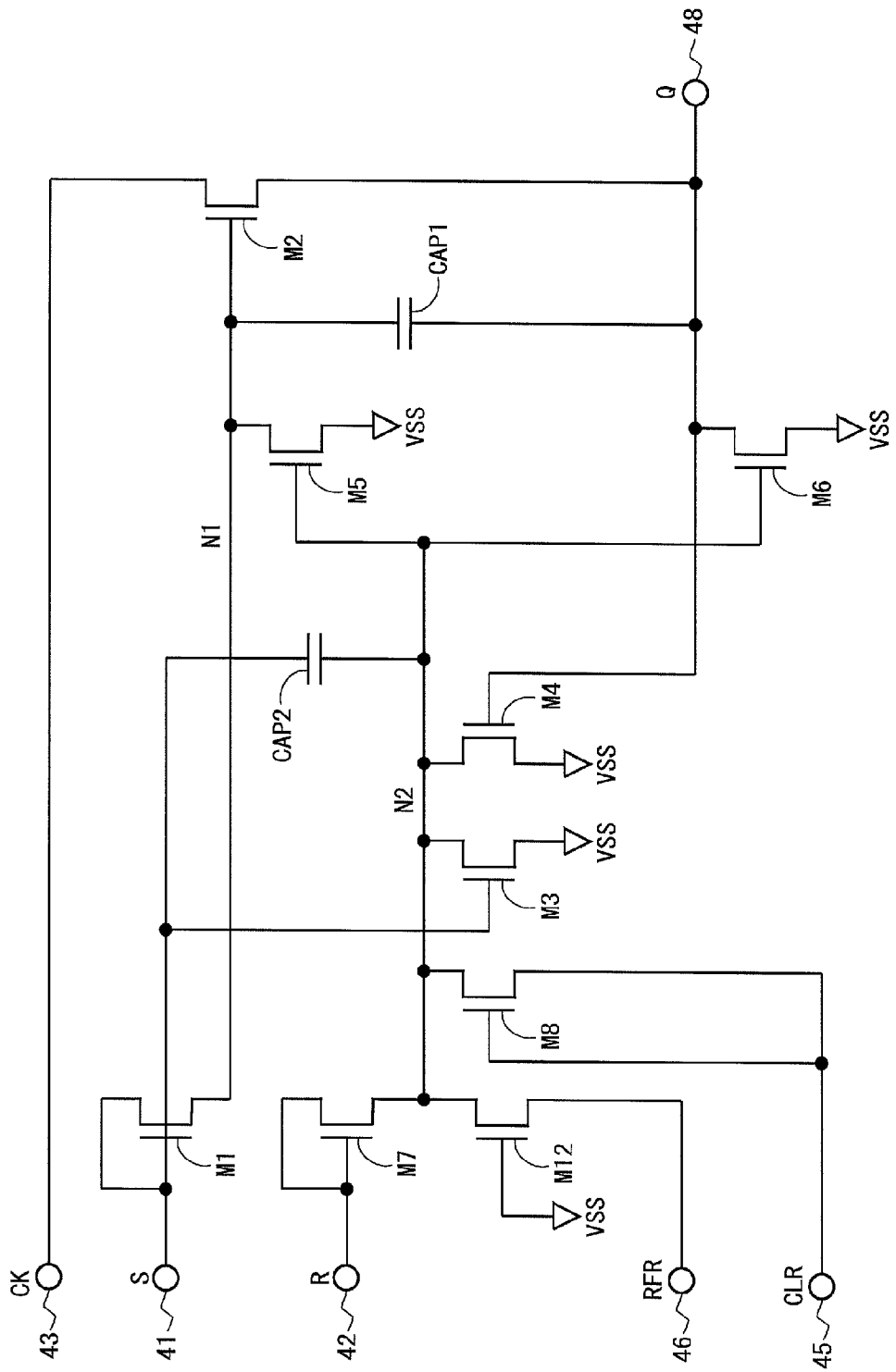
FIG. 42 is a circuit diagram showing a configuration of a bistable circuit according to a first modified example of the seventh embodiment.

FIG. 42 is a circuit diagram showing a configuration of a bistable circuit according to a first modified example of the seventh embodiment. In this modified example, a thin-film transistor M12 is provided in addition to the components of the seventh embodiment illustrated in FIG. 37. The thin-film transistor M12 realizes a second-node level lowering switching element. For the thin-film transistor M12, a gate terminal is connected to the input terminal for the DC power supply potential VSS at a low level, a drain terminal is connected to the second-node N2, and a source terminal is connected to an input terminal 46 for receiving a refresh signal RFR for decreasing the potential of the second-node N2 down to a potential lower than the VSS potential. Here, the input terminal 46 realizes a fourth-input-node.

Figure 43:
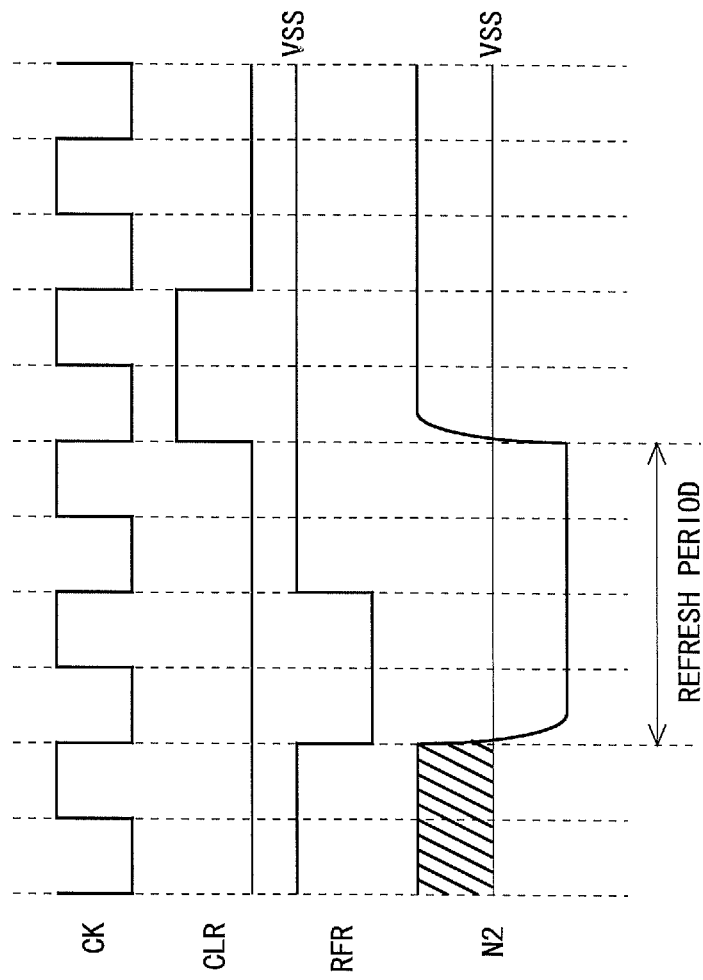
FIG. 43 is a signal waveform diagram for illustration of an operation of the bistable circuit in the first modified example of the seventh embodiment.

As illustrated in FIG. 43, the refresh signal RFR is maintained at the VSS potential during a period excluding a certain period. Specifically, it is turned to a potential lower than the VSS potential only during a certain period before the clear signal CLR is driven to a high level. It should be noted that while timing at which the refresh signal RFR changes synchronizes with the timing at which the first clock CK changes in FIG. 43, it is not necessary that these timing synchronize with each other.

In the first to seventh embodiments, the potential of the second-node N2 is maintained at a high level for most period. Accordingly, for the most period, the thin-film transistors M5 and M6 are in the ON state. Therefore, regarding the thin-film transistors M5 and M6, there is a concern that characteristics may deteriorate due to a threshold shift. By contrast, according to this modified example, the potential of the second-node N2 is maintained at a potential lower than the VSS potential during a period from a time point at which the potential of the refresh signal RFR becomes lower than the VSS potential until a time point at which the clear signal CLR changes from a low level to a high level (a refresh period in FIG. 43). Accordingly, during this period, a negative voltage is applied between the gates and the sources of the thin-film transistors M5 and M6. With this, during the operation of the shift register, it is possible to prevent or suppress the above-described threshold shift of the thin-film transistors M5 and M6. It should be noted that, it is preferable that the refresh period be provided in the vertical blanking period (a period from a pulse of the gate end pulse signal GEP is generated until a pulse of the gate start pulse signal GSP is generated).

In the meantime, as the thin-film transistors M5 and M6 are turned to the OFF state during the refresh period, there is a concern that the potential of the first-node N1 increases due to fluctuation of the potential of the first clock CK. Therefore, it is preferable to maintain the first gate clock signal GCK1 and the second gate clock signal GCK2 at a low level during the refresh period. With this, the first clock CK supplied to each bistable circuit becomes a low level in the refresh period, and the potential of the first-node N1 is maintained at low level even when the thin-film transistors M5 and M6 are in the OFF state. As a result, the stability of the circuit operation is further improved.

7.2.2 Second Modified Example

Figure 44:
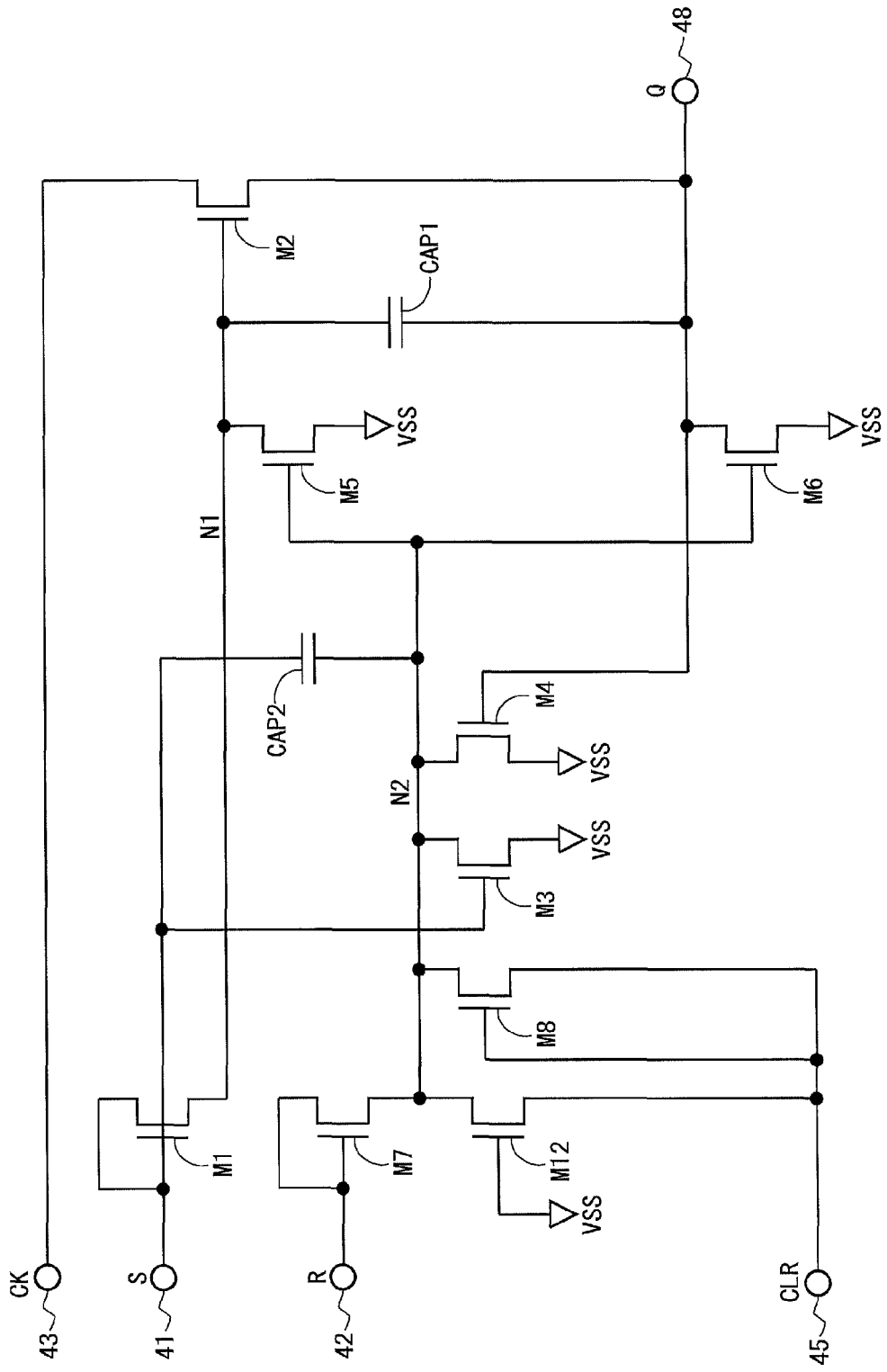
FIG. 44 is a circuit diagram showing a configuration of a bistable circuit according to a second modified example of the seventh embodiment.

FIG. 44 is a circuit diagram showing a configuration of a bistable circuit according to a second modified example of the seventh embodiment. Similarly to the first modified example, in this modified example, the thin-film transistor M12 is provided in addition to the components of the seventh embodiment illustrated in FIG. 37. In the meantime, according to the first modified example, the bistable circuit is configured such that the gate terminal and the drain terminal of the thin-film transistor M8 are supplied with the clear signal CLR, and the source terminal of the thin-film transistor M12 is supplied with the refresh signal RFR. By contrast, in this modified example, the bistable circuit is configured such that the gate terminal and the drain terminal of the thin-film transistor M8, and the source terminal of the thin-film transistor M12 are supplied with the clear signal CLR.

Figure 45:
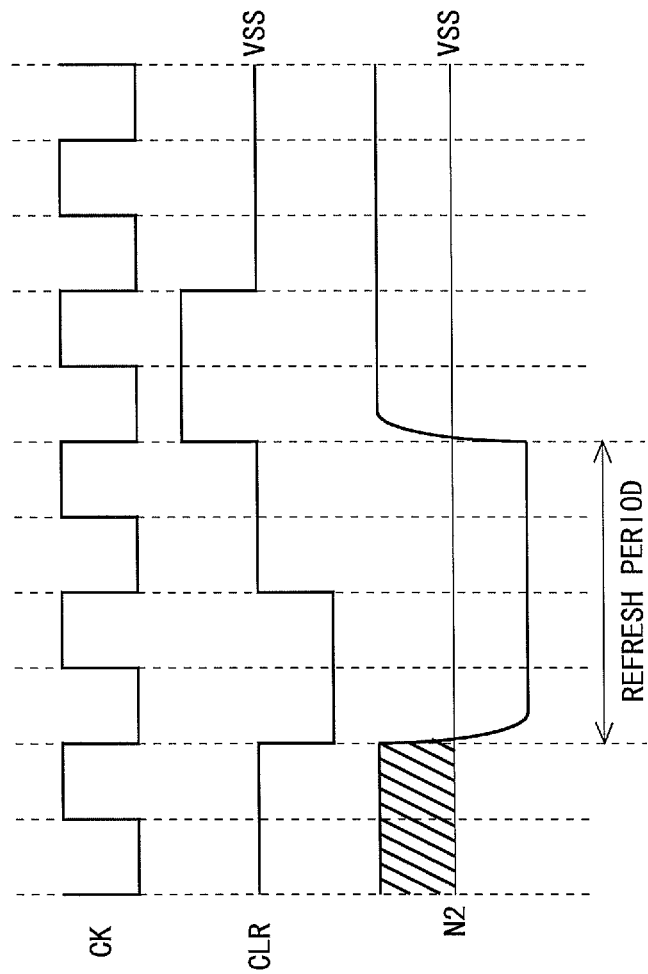
FIG. 45 is a signal waveform diagram for illustration of an operation of the bistable circuit in the second modified example of the seventh embodiment.

In this modified example, as illustrated in FIG. 45, the clear signal CLR is turned to a potential lower than the VSS potential during a certain period, turned to a potential higher than the VSS potential during a certain different period, and maintained at the VSS potential during a period other than these periods (most period). Specifically, the potential of the clear signal CLR is turned to the potential lower than the VSS potential during a certain period before the period during which the potential of the clear signal CLR is higher than the VSS potential. It is preferable that the periods during which the potential of the clear signal CLR is turned to the potential other than the VSS potential be provided in the vertical blanking period (a period from a pulse of the gate end pulse signal GEP is generated until a pulse of the gate start pulse signal GSP is generated). It should be noted that while timing at which the clear signal CLR changes synchronizes with timing at which the first clock CK changes in FIG. 45, it is not necessary that these timing synchronize with each other.

According to this modified example, when the potential of the clear signal CLR becomes lower than the VSS potential, the thin-film transistor M12 is turned to the ON state, and the potential of the second-node N2 decreases down to a potential lower than the VSS potential. Further, when the potential of the clear signal CLR becomes higher than the VSS potential, the thin-film transistor M8 is turned to the ON state, and the potential of the second-node N2 becomes a high level. As described above, according to this modified example, it is possible to obtain the same effect as that of the first modified example without using the refresh signal RFR according to the first modified example.

8. Reference Example

According to the above embodiments, for the capacitor CAP2, the one end is connected to the second-node N2, and the other end is connected to the input terminal 41. However, the other end of the capacitor CAP2 may be connected to other than the input terminal 41. This will be described below as a reference example.

8.1 First Reference Example

Figure 46:
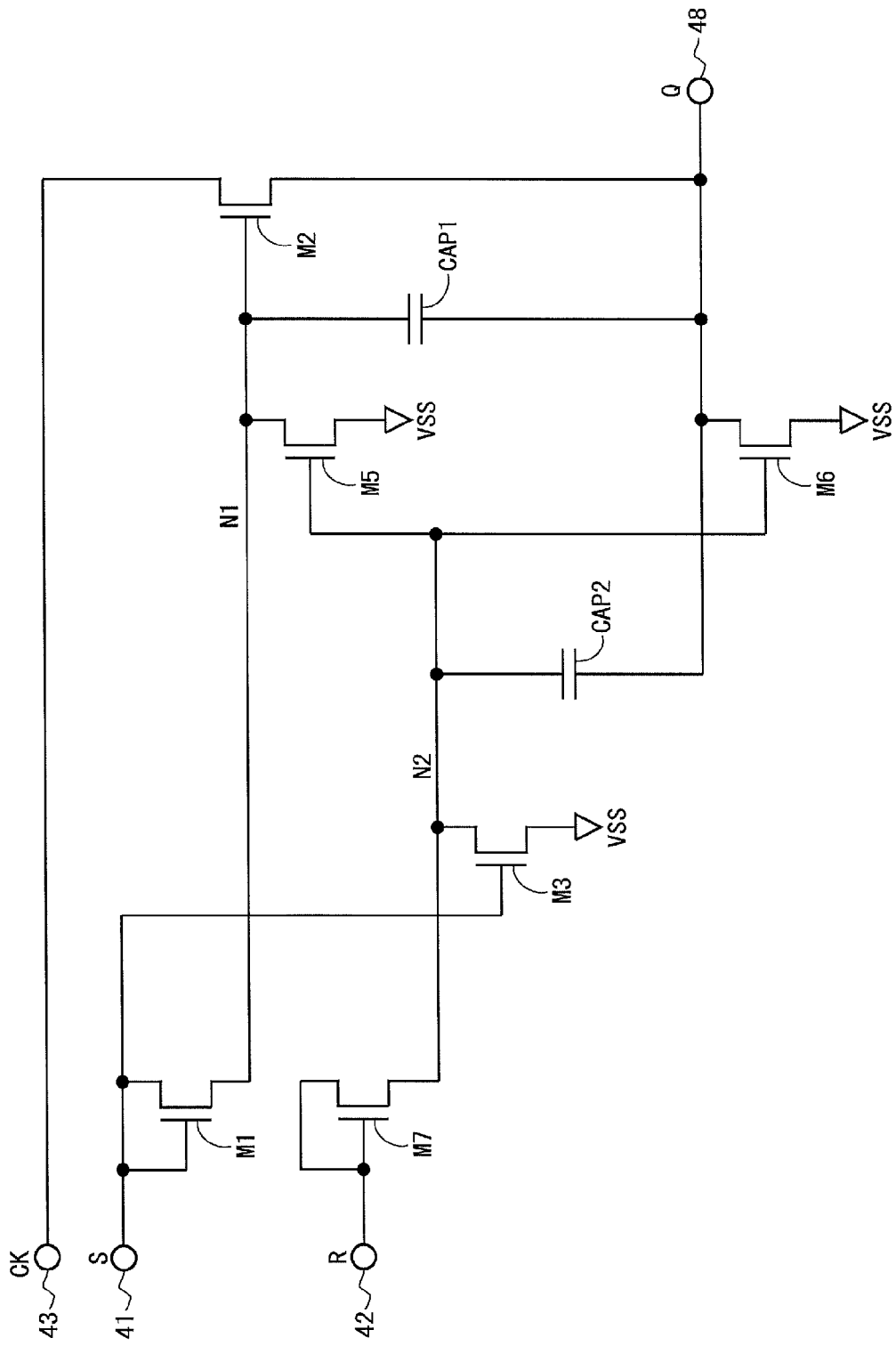
FIG. 46 is a circuit diagram showing a configuration of a bistable circuit according to a first reference example.
Figure 47:
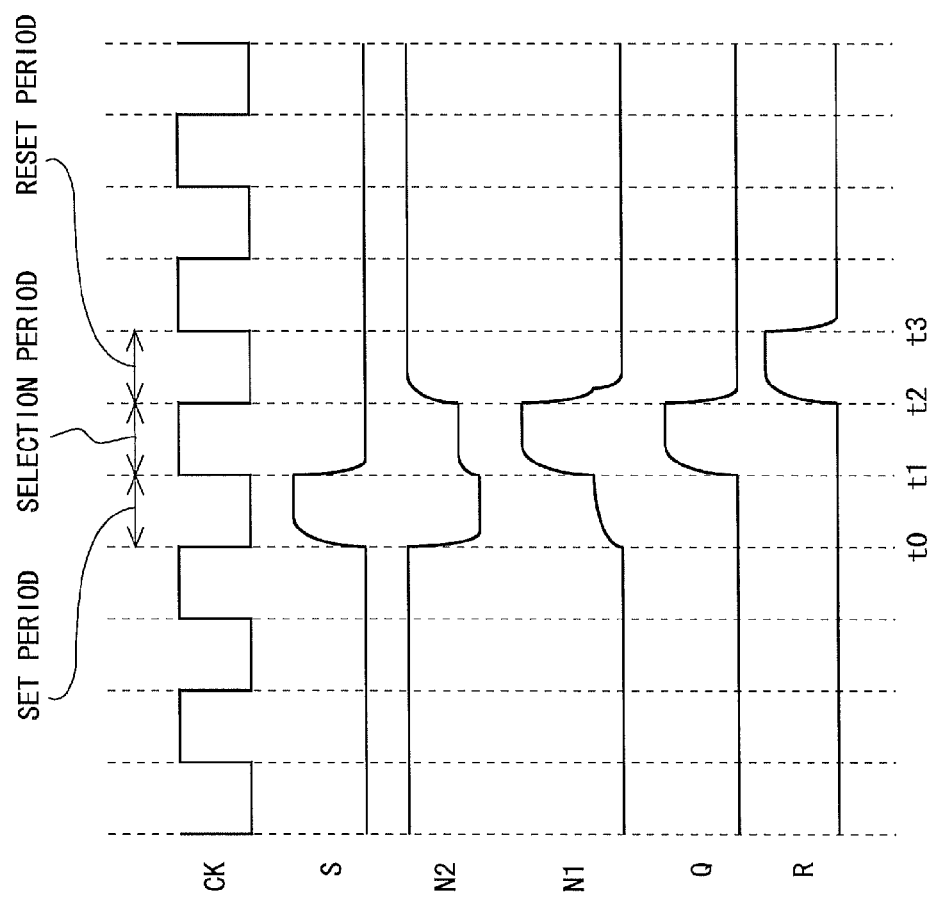
FIG. 47 is a signal waveform diagram for illustration of an operation of the bistable circuit in the first reference example.

FIG. 46 is a circuit diagram showing a configuration of a bistable circuit according to a first reference example. In this reference example, the other end of the capacitor CAP2 is connected to the output terminal 48. Hereinafter, an operation of the bistable circuit according to this reference example will be described with reference to FIG. 46 and FIG. 47.

In the normal operation period (periods before time t0 and after time t3), the potential of the second-node N2 is maintained at a high level. Accordingly, the thin-film transistors M5 and M6 are in the ON state. As there is the parasitic capacitance between the gate and the drain of the thin-film transistor M2, a noise is generated at the first-node N1 due to fluctuation of a waveform of the first clock CK (see FIG. 47). However, as the thin-film transistor M5 is in the ON state, the potential of the first-node N1 is pulled to a low level. Further, a noise is also generated in the state signal Q (the output terminal 48) due to the noise generated at the first-node N1. However, as the thin-film transistor M6 is in the ON state, a potential of the state signal Q is pulled to a low level. In the meantime, according to this reference example, when the potential of the state signal Q increases due to the noise, the potential of the second-node N2 also increases via the capacitor CAP2. As a result, the voltages between the gates and the drains of the thin-film transistors M5 and M6 become higher, and an influence of the noises occurring at the first-node N1 and the state signal Q is reduced. Thus, the potential of the first-node N1 and the potential of the state signal Q are reliably maintained at a low level during this period.

In the set period (when reaching time t0), similarly to the first embodiment, the capacitor CAP1 is charged (precharged, in this case), and the potential of the first-node N1 changes from a low level to a high level. Further, as the thin-film transistor M3 is turned to the ON state, the potential of the second-node N2 becomes a low level. With this, the thin-film transistors M5 and M6 are turned to the OFF state.

In the selection period (when reaching time t1), similarly to the first embodiment, by the increase of the potential of the first-node N1, the thin-film transistor M2 is fully turned to the ON state, and the potential of the state signal Q increases up to a level sufficient for turning a gate bus line connected to the output terminal 48 of this bistable circuit to the selected state. In the meantime, for the thin-film transistors M5 and M6, there are the parasitic capacitances between the gates and the drains. Accordingly, the potential of the second-node N2 slightly increases as the potential of the first-node N1 and the potential of the state signal Q increase. It should be noted that in order to suppress occurrence of an operational defect in conjunction with the increase of the potential of the second-node N2, the configuration should be such that the thin-film transistor M4 (the thin-film transistor having the gate terminal connected to the output terminal 48, the drain terminal connected to the second-node N2, and the source terminal connected to the input terminal for the DC power supply potential VSS) shown in the above-described third embodiment is provided.

In the reset period (when reaching time t2), similarly to the first embodiment, the potential of the state signal Q and the potential of the first-node N1 decrease. Further, the reset signal R changes from a low level to a high level during this period. Accordingly, the thin-film transistor M7 is turned to the ON state, and the potential of the second-node N2 becomes a high level. At this time, the capacitor CAP2 is charged based on a potential difference between the second-node N2 and the output terminal 48. In the meantime, during the normal operation period, there is a possibility that a noise is generated in the state signal Q due to fluctuation of the waveform of the first clock CK. As the noise in the state signal Q appears as the noises occurring in the set signal S and the reset signal R, there is a case in which a current leakage occurs in the thin-film transistors M3 and M7, and the potential of the second-node N2 possibly decreases. However, according to this reference example, as the capacitor CAP2 is charged during the reset period as described above, a decrease of the potential of the second-node N2 during the normal operation period is suppressed.

As described above, according to this reference example, even when the potential of the first-node N1 and the potential of the state signal Q increase due to the noise, an influence of the noise is reduced by the voltages between the gates and the sources of the thin-film transistors M5 and M6 being increased. Further, the decrease of the potential of the second-node N2 due to the current leakage in the thin-film transistors M3 and M7 during the normal operation period is suppressed. With this, an improvement of visual quality is expected.

Figure 48:
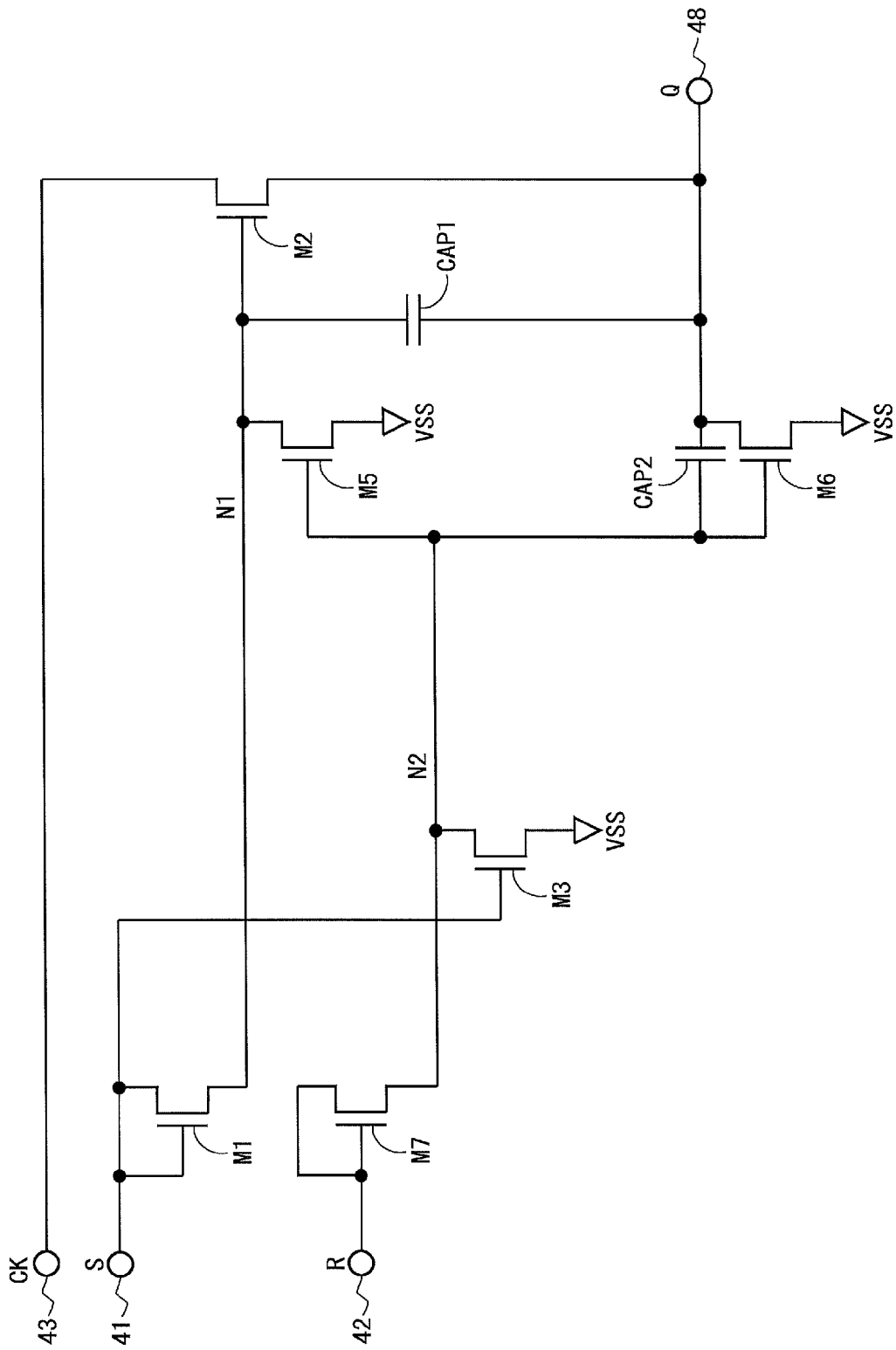
FIG. 48 is a circuit diagram for illustration of a preferred arrangement of a capacitor CAP2 in the first reference example.

According to this reference example, it is preferable to employ a configuration in which, as illustrated in FIG. 48, the capacitor CAP2 and the thin-film transistor M6 are arranged adjacent to each other, the electrode on the side of the one end of the capacitor CAP2 (on the side of the second-node N2) is made of the gate metal 702, and the electrode on the side of the other end of the capacitor CAP2 (on the side of the output terminal 48) is made of the source metal 701. At this time, for the thin-film transistor M6, the drain electrode is made of the source metal 701, and the gate electrode is made of the gate metal 702. By employing such a configuration, an increase of an area for wiring and an area for mounting by providing the capacitor CAP2 is suppressed, and it is possible to reduce a size of a picture frame of the panel and to improve reliability of the circuit operation. It should be noted that the configuration may be such that the capacitor CAP2 and the thin-film transistor M4 are arranged adjacent to each other, the electrode on the side of the one end of the capacitor CAP2 is made of the source metal 701, and the electrode on the side of the other end of the capacitor CAP2 is made of the gate metal 702.

8.2 Second Reference Example

Figure 49:
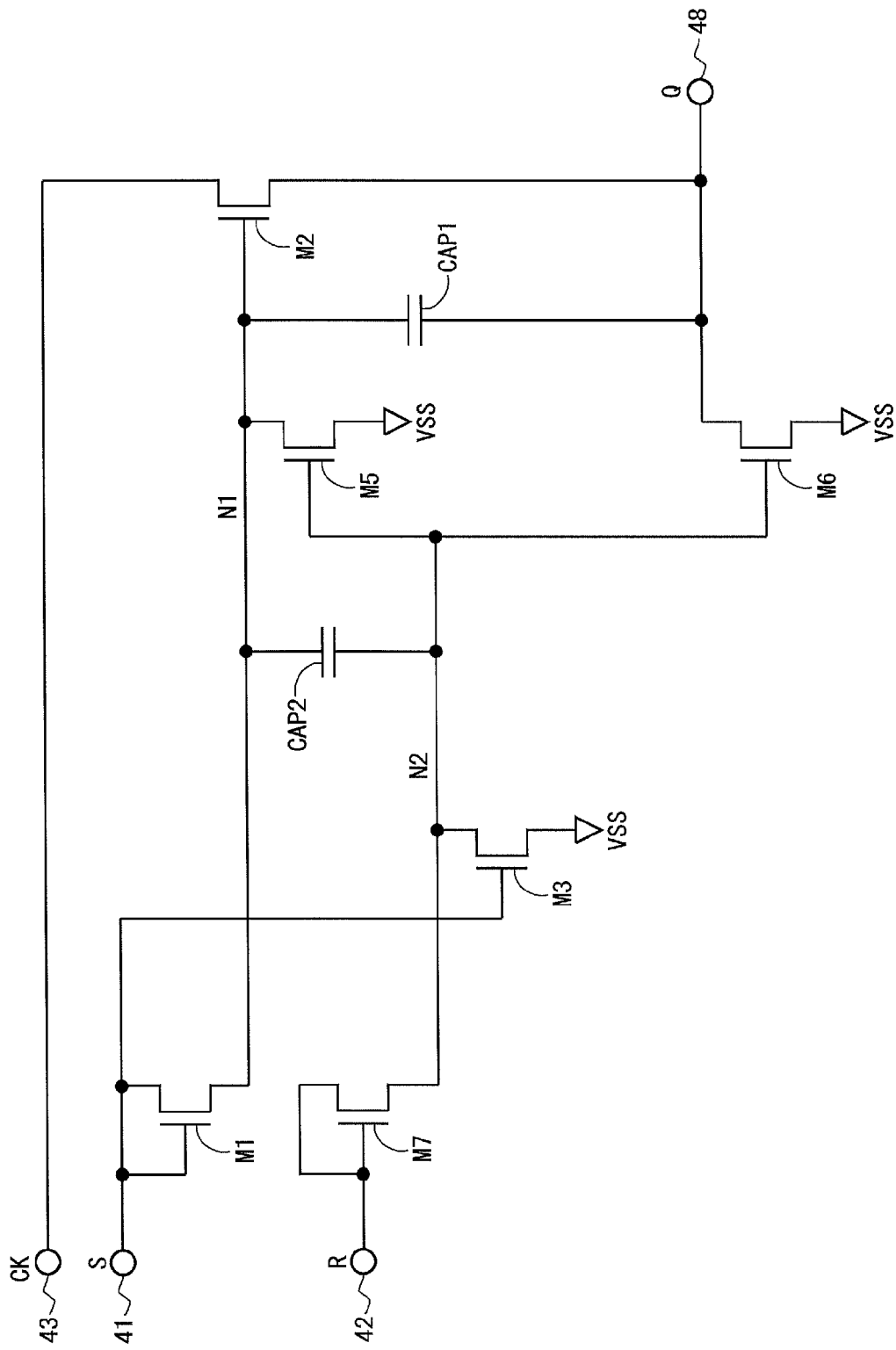
FIG. 49 is a circuit diagram showing a configuration of a bistable circuit according to a second reference example.
Figure 50:
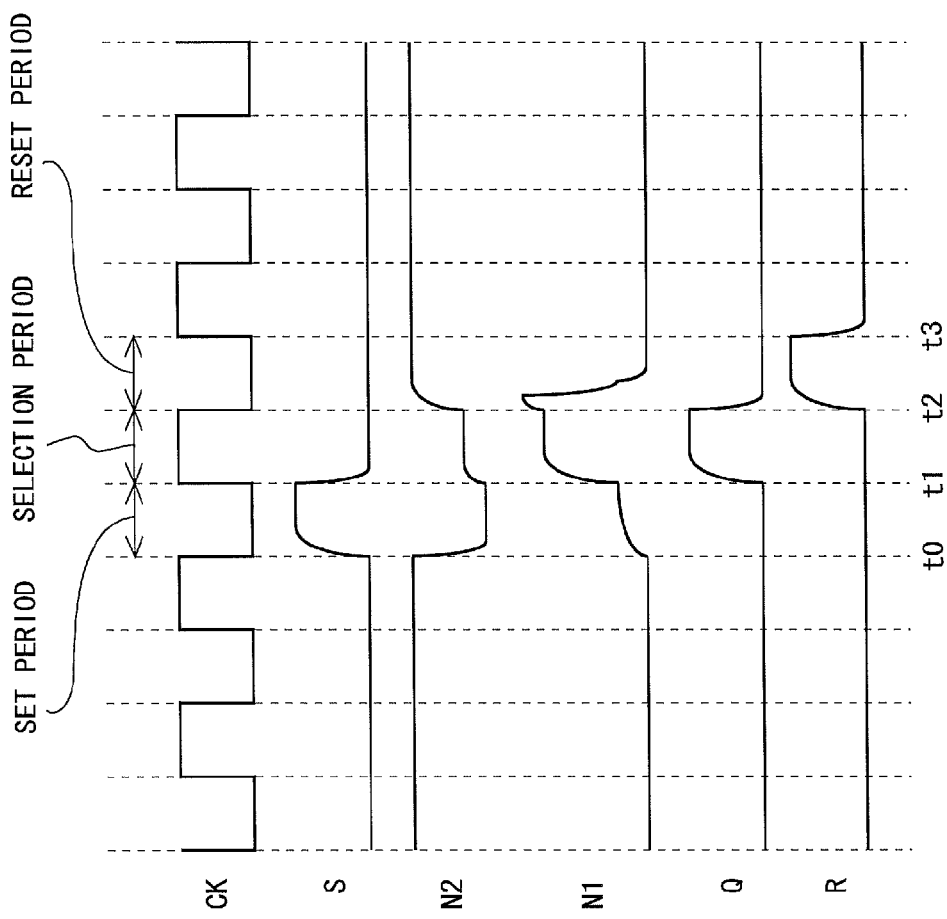
FIG. 50 is a signal waveform diagram for illustration of an operation of the bistable circuit in the second reference example.

FIG. 49 is a circuit diagram showing a configuration of a bistable circuit according to a second reference example. In this reference example, the other end of the capacitor CAP2 is connected to the first-node N1. Hereinafter, an operation of the bistable circuit according to this reference example will be described with reference to FIG. 49 and FIG. 50.

In the normal operation period (periods before time t0 and after time t3), the potential of the second-node N2 is maintained at a high level. Accordingly, the thin-film transistors M5 and M6 are in the ON state. As there is the parasitic capacitance between the gate and the drain of the thin-film transistor M2, a noise is generated at the first-node N1 due to fluctuation of a waveform of the first clock CK (see FIG. 50). However, as the thin-film transistor M5 is in the ON state, the potential of the first-node N1 is pulled to a low level. Further, a noise is also generated in the state signal Q (the output terminal 48) due to the noise generated at the first-node N1. However, as the thin-film transistor M6 is in the ON state, a potential of the state signal Q is pulled to a low level. In the meantime, according to this reference example, when the potential of the first-node N1 increases due to the noise, the potential of the second-node N2 also increases via the capacitor CAP2. As a result, the voltages between the gates and the sources of the thin-film transistors M5 and M6 become higher, and an influence of the noises occurring at the first-node N1 and the state signal Q is reduced. As described above, the potential of the first-node N1 and the potential of the state signal Q are reliably maintained at a low level during this period.

In the set period and the selection period, the same operations as those in the first reference example are performed. In the reset period (when reaching time t2), similarly to the first embodiment, the potential of the state signal Q and the potential of the first-node N1 decrease. Further, the reset signal R changes from a low level to a high level during this period. Accordingly, the thin-film transistor M7 is turned to the ON state, and the potential of the second-node N2 becomes a high level. At this time, the capacitor CAP2 is charged based on a potential difference between the second-node N2 and the first-node N1. In the meantime, during the normal operation period, there is a possibility that a noise is generated in the state signal Q due to fluctuation of the waveform of the first clock CK. As the noise in the state signal Q appears as the noises occurring in the set signal S and the reset signal R, there is a case in which a current leakage occurs in the thin-film transistors M3 and M7, and the potential of the second-node N2 possibly decreases. However, according to this reference example, as the capacitor CAP2 is charged during the reset period as described above, a decrease of the potential of the second-node N2 during the normal operation period is suppressed. Further, in this modified example, as the other end of the capacitor CAP2 is connected to the first-node N1, the potential of the first-node N1 increases via the capacitor CAP2 during a period until the potential of the second-node N2 becomes a high level after the reset period starts. Accordingly, a period until the potential of the first-node N1 becomes a low level after the reset period starts is longer as compared to the above embodiments. With this, a period in which the thin-film transistor M2 is maintained in the ON state becomes longer, and the potential of the state signal Q decreases quickly during the reset period as compared to the above embodiments.

As described above, according to this reference example, even when the potential of the first-node N1 and the potential of the state signal Q increase due to the noise, an influence of the noise is reduced by the voltages between the gates and the sources of the thin-film transistors M5 and M6 being increased. Further, the decrease of the potential of the second-node N2 due to the current leakage in the thin-film transistors M3 and M7 during the normal operation period is suppressed. With this, an improvement of visual quality is expected. Moreover, as the period until the potential of the first-node N1 becomes a low level after the reset period starts becomes longer, the potential of the state signal Q decreases quickly during the reset period. Accordingly, it is possible to drive a large-sized panel or a high-definition panel at high speed. Furthermore, as the capacitance of the first-node N1 becomes large, an increase of a potential due to bootstrap of the first-node N1 during the selection period is suppressed, and breakdown of the gate insulating film of the thin-film transistor connected to the first-node N1 is suppressed.

It should be noted that, according to this reference example, it is preferable to employ a configuration in which the capacitor CAP2 and the thin-film transistor M5 are arranged adjacent to each other, the electrode on the side of the one end of the capacitor CAP2 (on the side of the second-node N2) is made of the gate metal 702, and the electrode on the side of the other end of the capacitor CAP2 (on the side of the first-node N1) is made of the source metal 701. At this time, for the thin-film transistor M5, the drain electrode is made of the source metal 701, and the gate electrode is made of the gate metal 702. By employing such a configuration, an increase of an area for wiring and an area for mounting by providing the capacitor CAP2 is suppressed, and it is possible to reduce a size of a picture frame of the panel and to improve reliability of the circuit operation.

9. Others

While the above embodiments have been described taking the liquid crystal display device as an example, the present invention is not limited thereto. The present invention can be also applied to other display devices such as organic EL (Electro Luminescence).

DESCRIPTION OF REFERENCE CHARACTERS

40(1) to 40(i): BISTABLE CIRCUIT
41 to 46: INPUT TERMINAL (OF BISTABLE CIRCUIT)
48, 49: OUTPUT TERMINAL (OF BISTABLE CIRCUIT)
300: SOURCE DRIVER (VIDEO SIGNAL LINE DRIVE CIRCUIT)
400: GATE DRIVER (SCANNING SIGNAL LINE DRIVE CIRCUIT)
410 to 415: SHIFT REGISTER
600: DISPLAY UNIT
CAP1, CAP2: CAPACITOR (CAPACITATIVE ELEMENT)
M1 to M12: THIN-FILM TRANSISTOR
N1, N2: FIRST-NODE, SECOND-NODE
Gl1 to GLi: GATE BUS LINE
SL1 to SLj: SOURCE BUS LINE
GCK1, GCK2: FIRST GATE CLOCK SIGNAL, SECOND GATE CLOCK SIGNAL
CK, CKB: FIRST CLOCK, SECOND CLOCK

S: SET SIGNAL
R: RESET SIGNAL
Q: STATE SIGNAL
Z: DIFFERENT STAGE CONTROL SIGNAL
GOUT: SCANNING SIGNAL
VDD: HIGH LEVEL DC POWER SUPPLY POTENTIAL
VSS: LOW LEVEL DC POWER SUPPLY POTENTIAL

The invention claimed is:

1. A scanning signal line drive circuit of a display device, that drives a plurality of scanning signal lines which are arrayed in a display unit, the circuit comprising:
   a shift register having a plurality of bistable circuits connected in series with each other, outputted signals from the plurality of bistable circuits being sequentially driven active based on a plurality of clock signals that are externally inputted and cyclically repeat an ON level and an OFF level, wherein
   each bistable circuit includes:
      a first-input-node for receiving an outputted signal from a bistable circuit of a stage before said each bistable circuit as a set signal;
      a second-input-node for receiving an outputted signal from a bistable circuit of a stage after said each bistable circuit as a reset signal;
      a first-output-node for outputting an outputted signal from said each bistable circuit as a scanning signal for driving the scanning signal line, the first-output-node being connected to the scanning signal line;
      a first output control switching element having a second electrode supplied with one of the plurality of clock signals and a third electrode connected to the first-output-node;
      a first-node turnon switching element for changing a level of a first-node connected to a first electrode of the first output control switching element to an ON level based on the set signal;
      a first first-node turnoff switching element for changing the level of the first-node to an OFF level, the first first-node turnoff switching element having a second electrode connected to the first-node;
      a first first-output-node turnoff switching element for changing a level of the first-output-node to an OFF level, the first first-output-node turnoff switching element having a second electrode connected to the first-output-node and a third electrode supplied with an OFF level potential;
      a first second-node turnon switching element for changing a level of a second-node to an ON level based on the reset signal, the second-node being connected to a first electrode of the first first-node turnoff switching element and a first electrode of the first first-output-node turnoff switching element;
      a first second-node turnoff switching element for changing the level of the second-node to an OFF level based on the set signal, the first second-node turnoff switching element having a first electrode connected to the first-input-node, a second electrode connected to the second-node, and a third electrode supplied with an OFF level potential; and
      a capacitative element having one end connected to the second-node and the other end connected to the first-input-node,
   each of the first output control switching element, the first-node turnon switching element, the first first-node turnoff switching element, the first first-output-node turnoff switching element, the first second-node turnon switching element, and the first second-node turnoff switching element is a switching element which has a first electrode, a second electrode, and a third electrode and whose conduction/non-conduction between the second electrode and the third electrode is controlled by a signal applied to the first electrode, and
   the following equation is satisfied, $$C2 \geq C5 + C6 - C3$$

where a capacitance value of the capacitative element is C2, a capacitance value of a parasitic capacitance between a first electrode and a second electrode of the first second-node turnoff switching element is C3, a capacitance value of a parasitic capacitance between a first electrode and a second electrode of the first first-node turnoff switching element is C5, and a capacitance value of a parasitic capacitance between a first electrode and a second electrode of the first first-output-node turnoff switching element is C6.

2. The scanning signal line drive circuit according to claim 1, wherein
   in each bistable circuit, a potential of the second-node is maintained at a DC power supply potential at an ON level during a period in which the first-node is to be maintained at an OFF level.

3. The scanning signal line drive circuit according to claim 1, wherein
   the first second-node turnoff switching element is constituted by a thin-film transistor having a gate electrode as a first electrode, a drain electrode as a second electrode, and a source electrode as a third electrode, and
   the capacitative element is provided between the gate electrode and the drain electrode of the thin-film transistor.

4. The scanning signal line drive circuit according to claim 1, wherein
   each bistable circuit includes the first first-node turnoff switching element, and
   a third electrode of the first first-node turnoff switching element is connected to the first-output-node.

5. The scanning signal line drive circuit according to claim 1, wherein
   each bistable circuit further includes:
      a second second-node turnoff switching element having a first electrode connected to the first-output-node, a second electrode connected to the second-node, and a third electrode supplied with an OFF level potential, the second second-node turnoff switching element being a switching element which has a first electrode, a second electrode, and a third electrode and whose conduction/non-conduction between the second electrode and the third electrode is controlled by a signal applied to the first electrode.

6. The scanning signal line drive circuit according to claim 1, wherein
   each bistable circuit further includes:
      a second first-output-node turnoff switching element having a first electrode connected to the second-input-node, a second electrode connected to the first-output-node, and a third electrode supplied with an OFF level potential, the second first-output-node turnoff switching element being a switching element which has a first electrode, a second electrode, and a third electrode and whose conduction/non-conduction between the second electrode and the third electrode is controlled by a signal applied to the first electrode.

7. The scanning signal line drive circuit according to claim 1, wherein
   each bistable circuit further includes:

a second first-node turnoff switching element having a
first electrode connected to the second-input-node, a
second electrode connected to the first-node, and a
third electrode supplied with an OFF level potential,
the second first-node turnoff switching element being
a switching element which has a first electrode, a
second electrode, and a third electrode and whose
conduction/non-conduction between the second electrode and the third electrode is controlled by a signal
applied to the first electrode.

8. The scanning signal line drive circuit according to claim 1, wherein
the first-node turnon switching element is a thin-film transistor having a multichannel structure.

9. The scanning signal line drive circuit according to claim 1, wherein
each bistable circuit includes the first first-node turnoff switching element, and
the first first-node turnoff switching element is a thin-film transistor having a multichannel structure.

10. The scanning signal line drive circuit according to claim 1, wherein
each bistable circuit includes:
a second-output-node for outputting an outputted signal from said each bistable circuit as a different stage control signal for controlling an operation of a bistable circuit other than said each bistable circuit; and
a second output control switching element having a first electrode connected to the first-node, a second electrode connected to the second electrode of the first output control switching element, and a third electrode connected to the second-output-node, the second output control switching element being a switching element which has a first electrode, a second electrode, and a third electrode and whose conduction/non-conduction between the second electrode and the third electrode is controlled by a signal applied to the first electrode, wherein
the different stage control signal outputted from each bistable circuit is supplied to a bistable circuit of a stage before said each bistable circuit as the reset signal.

11. The scanning signal line drive circuit according to claim 10, wherein
the different stage control signal outputted from each bistable circuit is further supplied to a bistable circuit of a stage after said each bistable circuit as the set signal.

12. The scanning signal line drive circuit according to claim 10, wherein
the plurality of clock signals are clock signals of two phases, and
a second electrode of the first second-node turnon switching element is supplied with a signal, out of the clock signals of two phases, that is different from a signal supplied to the second electrode of the first output control switching element.

13. The scanning signal line drive circuit according to claim 10, wherein
the second electrode of the first output control switching element is supplied with a DC power supply potential in place of one of the plurality of clock signals.

14. The scanning signal line drive circuit according to claim 13, wherein
the following equation is satisfied, $VGH \geq VCK \geq VGH/2$ where an amplitude voltage of the plurality of clock signals is VCK, and a voltage of the scanning signal when the scanning signal lines are driven is VGH with reference to a potential on an OFF level side of the plurality of clock signals.

15. The scanning signal line drive circuit according to claim 1, wherein
each bistable circuit further includes:
a third-input-node for receiving a signal externally supplied as a clear signal; and
a second second-node turnon switching element for changing the level of the second-node to an ON level based on the clear signal.

16. The scanning signal line drive circuit according to claim 15, wherein
each bistable circuit further includes:
a fourth-input-node for receiving a signal externally supplied as a refresh signal; and
a second-node level lowering switching element for changing the level of the second-node to a level lower than the OFF level based on the refresh signal.

17. The scanning signal line drive circuit according to claim 1, wherein
each bistable circuit further includes:
a third-input-node for receiving a signal externally supplied as a clear signal;
a second second-node turnon switching element for changing the level of the second-node to an ON level based on the clear signal; and
a second-node level lowering switching element for changing the level of the second-node to a level lower than the OFF level based on the clear signal.

18. The scanning signal line drive circuit according to claim 1, wherein
all of the switching elements included in each bistable circuit are constituted respectively by thin-film transistors of an identical channel.

19. The scanning signal line drive circuit according to claim 1, wherein
the switching elements included in each bistable circuit are thin-film transistors in which a semiconductor layer includes an In—Ga—Zn based Oxide (IGZO).

20. A display device, comprising:
the display unit; and
the scanning signal line drive circuit according to claim 1.

21. A method of driving a plurality of scanning signal lines which are arrayed in a display unit by a scanning signal line drive circuit including a shift register having a plurality of bistable circuits connected in series with each other and each having a first state and a second state, outputted signals from the plurality of bistable circuits being sequentially driven active based on a plurality of clock signals that are externally inputted and cyclically repeat an ON level and an OFF level, the method comprising:
for each bistable circuit,
a first driving step of turning to a preliminary state for changing from the second state to the first state;
a second driving step of changing from the preliminary state to the first state; and
a third driving step of changing from the first state to the second state, wherein
each bistable circuit includes:
a first-input-node for receiving an outputted signal from a bistable circuit of a stage before said each bistable circuit as a set signal;

a second-input-node for receiving an outputted signal from a bistable circuit of a stage after said each bistable circuit as a reset signal;

a first-output-node for outputting an outputted signal from said each bistable circuit as a scanning signal for driving the scanning signal line, the first-output-node being connected to the scanning signal line;

a first output control switching element having a second electrode supplied with one of the plurality of clock signals and a third electrode connected to the first-output-node;

a first-node turnon switching element for changing a level of a first-node connected to a first electrode of the first output control switching element to an ON level based on the set signal;

a first first-node turnoff switching element for changing the level of the first-node to an OFF level, the first first-node turnoff switching element having a second electrode connected to the first-node;

a first first-output-node turnoff switching element for changing a level of the first-output-node to an OFF level, the first first-output-node turnoff switching element having a second electrode connected to the first-output-node and a third electrode supplied with an OFF level potential;

a first second-node turnon switching element for changing a level of a second-node to an ON level based on the reset signal, the second-node being connected to a first electrode of the first first-node turnoff switching element and a first electrode of the first first-output-node turnoff switching element;

a first second-node turnoff switching element for changing the level of the second-node to an OFF level based on the set signal, the first second-node turnoff switching element having a first electrode connected to the first-input-node, a second electrode connected to the second-node, and a third electrode supplied with an OFF level potential; and a capacitative element having one end connected to the second-node and the other end connected to the first-input-node, and each of the first output control switching element, the first-node turnon switching element, the first first-node turnoff switching element, the first first-output-node turnoff switching element, the first second-node turnon switching element, and the first second-node turnoff switching element is a switching element which has a first electrode, a second electrode, and a third electrode and whose conduction/non-conduction between the second electrode and the third electrode is controlled by a signal applied to the first electrode, wherein for each bistable circuit, in the first driving step, the first-node turnon switching element is turned to an ON state by the set signal changing from the second level to the first level, in the second driving step, the first-node turnon switching element is turned to an OFF state by the set signal changing from the first level to the second level, and the level of the first-node changes by a signal, out of the plurality of clock signals, that is supplied to the second electrode of the first output control switching element changing from the second level to the first level, and in the third driving step, the first second-node turnoff switching element is turned to the ON state by the reset signal changing from the second level to the first level, and the following equation is satisfied, $$C2 \geq C5 + C6 - C3$$

where a capacitance value of the capacitative element is $C2$, a capacitance value of a parasitic capacitance between a first electrode and a second electrode of the first second-node turnoff switching element is $C3$, a capacitance value of a parasitic capacitance between a first electrode and a second electrode of the first first-node turnoff switching element is $C5$, and a capacitance value of a parasitic capacitance between a first electrode and a second electrode of the first first-output-node turnoff switching element is $C6$.

* * * * *